(12) United States Patent
Morita et al.

(10) Patent No.: US 7,655,299 B2
(45) Date of Patent: Feb. 2, 2010

(54) SURFACE-COATED CUTTING TOOL MADE OF HARD METAL AND MANUFACTURING METHOD FOR SAME

(75) Inventors: Keisuke Morita, Saitama (JP); Tomoyuki Masuno, Toride (JP); Akira Osada, Naka-gun (JP); Eiji Nakamura, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 566 days.

(21) Appl. No.: 10/597,505

(22) PCT Filed: Jan. 28, 2005

(86) PCT No.: PCT/JP2005/001208
§ 371 (c)(1),
(2), (4) Date: Jul. 27, 2006

(87) PCT Pub. No.: WO2005/072895
PCT Pub. Date: Aug. 11, 2005

(65) Prior Publication Data
US 2008/0233388 A1 Sep. 25, 2008

(30) Foreign Application Priority Data

| Jan. 30, 2004 | (JP) | 2004-022535 |
| May 17, 2004 | (JP) | 2004-146397 |
| May 17, 2004 | (JP) | 2004-146398 |
| Jul. 21, 2004 | (JP) | 2004-212896 |

(51) Int. Cl.
*B23B 27/14* (2006.01)
*C23C 16/00* (2006.01)

(52) U.S. Cl. .................. 428/325; 51/307; 51/309; 428/216; 428/336; 428/408; 428/697; 428/698; 428/699; 204/192.1

(58) Field of Classification Search .................. 51/307, 51/309; 428/216, 336, 325, 408, 697, 698, 428/699; 204/192.1
See application file for complete search history.

(56) References Cited

U.S. PATENT DOCUMENTS 5,707,748 A 1/1998 Bergmann (Continued)

FOREIGN PATENT DOCUMENTS

JP 7-164211 A 6/1995

(Continued)

OTHER PUBLICATIONS

International Search Report for PCT/JP2005/001208 mailed May 17, 2005.

(Continued)

*Primary Examiner*—Archene Turner
(74) *Attorney, Agent, or Firm*—Darby & Darby P.C.

(57) ABSTRACT

A surface-coated cutting tool comprising: a hard substrate; a lower layer which is formed on a surface of the hard substrate, contains a composite compound consisting of at least one element selected from Ti and Al, and at least one element selected from N and C, and has an average thickness of 0.1 to 3 μm; and an upper layer having an average thickness of 1 to 13 μm, which is formed on the lower layer and having a texture in which fine grains of crystalline Ti (C,N) based compounds or fine grains of crystalline (Ti, Al)(C, N) based compounds are dispersively distributed in a matrix of a carbon based amorphous material containing W.

18 Claims, 7 Drawing Sheets

U.S. PATENT DOCUMENTS

| | | | | |
|---|---|---|---|---|
| 5,728,465 | A | * | 3/1998 | Dorfman et al. ............. 428/408 |
| 6,821,624 | B2 | * | 11/2004 | Utsumi et al. ................ 428/216 |
| 6,827,976 | B2 | * | 12/2004 | Derflinger et al. ........ 427/249.1 |
| 7,094,479 | B2 | * | 8/2006 | Sato et al. ................... 428/698 |
| 2001/0024737 | A1 | | 9/2001 | Utsumi et al. |
| 2003/0035894 | A1 | | 2/2003 | Derflinger et al. |

FOREIGN PATENT DOCUMENTS

| | | | |
|---|---|---|---|
| JP | 2001-225412 | A | 8/2001 |
| JP | 2001-316800 | A | 11/2001 |
| JP | 2002-513087 | A | 5/2002 |
| JP | 2002-206177 | A | 7/2002 |
| JP | 2002-235748 | A | 8/2002 |
| JP | 2004-10923 | A | 1/2004 |
| JP | 2004-202587 | A | 7/2004 |
| JP | 2005-7559 | A | 1/2005 |
| WO | WO-99/55929 | A1 | 11/1999 |

OTHER PUBLICATIONS

Patent Abstracts of Japan for JP07-164211 published Jun. 27, 1995.

* cited by examiner

SURFACE-COATED CUTTING TOOL MADE OF HARD METAL AND MANUFACTURING METHOD FOR SAME

CROSS-REFERENCE TO PRIOR APPLICATION

This is a U.S. National Phase Application under 35 U.S.C. §371 of International Patent Application No. PCT/JP2005/001208 filed Jan. 28, 2005, and claims the benefit of Japanese Patent Applications No. 2004-022535, filed Jan. 30, 2004, 2004-146397 filed, May 17, 2004, 2004-146398, filed May 17, 2004 and 2004-212896, filed Jul. 21, 2004, all of which are incorporated by reference herein. The International Application was published in Japanese on Aug. 11, 2005 as WO 2005/072895 A1 under PCT Article 21(2).

TECHNICAL FIELD

The invention relates to a surface-coated cutting tool made of hard metal (hereafter referred to as a coated hard metal tool), which can show excellent wear resistance by an amorphous carbon based lubricant coating in the case of cutting, especially in the case of high-speed cutting, of iron and steel materials including various types of steel and cast iron, or of non-ferrous materials such as Al-alloy, Cu-alloy or the like.

The invention also relates to a coated hard metal tool having a surface-coating layer which can show excellent high-temperate hardness, excellent heat resistance, excellent high-temperature strength, and excellent lubricity. Because of such properties, the hard metal tool can show excellent wear resistance without causing chipping (micro breaking) of the surface-coating layer, specifically in a case of cutting of non-ferrous materials such as Al, Al alloys, Cu, Cu alloys, Ti and Ti alloy, or the like under high-speed condition being accompanied by generation of high-temperature, and under heavy cutting conditions such as high-angle slitting or high-speed feeding being accompanied by high mechanical impact.

BACKGROUND ART

There are well-known cutting tools such as inserts, drills, miniature dills, and insert type end mills. An insert is attached to a tip of a cutting tool and is used for turning, planing of iron and steel materials such as various types of steel and cast ion, or of nonferrous materials such as Al alloys or Cu alloys. A drill and a miniature drill are used for drilling, and solid type end mill are used for facing, grooving, shoulder-working. An insert type end mill is removably attached with the insert and is used for a cutting operation the same as the solid type end mill.

As the above-described coated hard metal tool, there is a well-known coated hard metal tool comprising a hard metal substrate, an adhesion bonding layer, and an amorphous carbon based lubricant coating deposited on the substrate with the adhesion bonding layer in-between, respectively constituted as follows.

(a) The hard metal substrate is composed of tungsten carbide (hereafter referred to as WC) based cemented carbide or titanium carbonitride (hereafter referred to as TiCN) based cermet.

(b) The adhesion bonding layer is formed by a sputtering apparatus using a Ti target as a cathode (evaporation source) in a reaction atmosphere comprising a mixed gas atmosphere of nitrogen and Ar or mixed gas of resolved hydrocarbon gas, nitrogen and Ar. The adhesion bonding layer consists of one or both selected from a titanium nitride layer (hereafter referred to as TN) and a titanium carbonitride (hereafter referred to as TiCN) layer and has an average thickness of 0.1 to 3 μm.

(c) The amorphous carbon based lubricant coating is deposited by a sputtering apparatus using a WC target as a cathode (evaporation source) in a reaction atmosphere of a mixed gas of resolved hydrocarbon gas and Ar. The lubricant coating contains, based on an analysis using an Auger electron spectrometer, W: 5 to 20 atomic % and a balance consisting of carbon and unavoidable impurities, and has an average thickness of 1 to 13 μm.

Moreover, it is known that the above-described conventional type coated hard metal tool can be formed in accordance with the following steps using a deposition apparatus which is exemplified by a schematic plan view of FIG. 5A and schematic front view of FIG. 5B. The above-described hard metal substrate is placed in a deposition apparatus comprising a sputtering device equipped with a Ti target as a cathode (evaporation source), and a sputtering device equipped with a WC target as a cathode (evaporation source). While heating an interior of the apparatus, for example, at 300° C., a reaction gas is introduced into the apparatus. The reaction gas may be a mixed gas of 1 Pa, being composed of nitrogen and Ar mixed in a proportion of e.g., nitrogen flow rate: 200 sccm, and Ar flow rate: 300 sccm. Alternatively, the reaction gas may be a mixed gas of 1 Pa, being composed of resolved $C_2H_2$ gas, nitrogen, and Ar. For example, $C_2H_2$, nitrogen and Ar may be introduced into the apparatus by a proportion of $C_2H_2$ flow rate: 40 sccm, nitrogen flow rate: 200 sccm, and Ar flow rate: 300 sccm. In the reaction atmosphere, the cathode (evaporation source) of Ti target is applied with an electric power of 12 kW (frequency: 40 kHz) for sputtering, and the above-described hard metal substrate is applied with a bias voltage of e.g., −100 V. As a result an adhesion bonding layer having a predetermined thickness and comprising one or both selected from a TN layer and TiCN layer is formed by a generation of a glow discharge. Next, while maintaining the heating temperature of the interior of the apparatus at e.g., 200° C., hydrocarbons such as $C_2H_2$ and Ar in a proportion of $C_2H_2$ flow rate: 40 to 80 sccm, Ar flow rate: 250 sccm are introduced into the apparatus, thereby replacing the reaction atmosphere composed of the mixed gas of nitrogen and Ar, or the mixed gas of degraded mete, nitrogen and Ar by a reaction atmosphere of e.g., 1 Pa, being composed of a mixed gas of a resolved hydrocarbon gas and Ar. Then, the above-described hard metal substrate is applied with a bias voltage of e.g., −20V, and the WC target as a cathode (evaporation source) is applied with an electric power of output: 4 to 6 kW (frequency: 40 kHz) for sputtering. Under these conditions, an amorphous carbon based lubricant coating of a predetermined thickness is deposited on the above-described adhesion bonding layer (see Japanese Unexamined Patent Application, First Publication H07-164211, and Published Japanese translation No. 2002-513087 of PCT International Publication).

Specifically, as the above-described coated hard metal tool used for cutting of a workpiece of the above-described non-ferrous material, there is a known coated hard metal tool in which a coating comprising a hard lower layer and a lubricant upper layer is deposited on a hard metal substrate. The hard metal substrate is composed of tungsten carbide base (hereafter referred to as WC) cemented carbide or titanium carbonitride-based cermet (hereafter referred to as TiCN), and the coating has the following constitution (a) A hard layer as the lower layer is composed of a composite nitride of Ti and Al [hereafter referred to as (Ti, Al)N] which has an average thickness of 1.5 to 10 μm and satisfies a compositional formula; $(Ti_{1-Z}Al_Z)N$, where Z ranges from 0.40 to 0.60 by atomic ratio.

(b) An amorphous carbon based lubricant layer as the upper layer is deposited by a sputtering apparatus using a WC target as a cathode (evaporation source) in a reaction atmosphere of a mixed gas of resolved hydrocarbon gas and Ar. The amorphous carbon based lubricant layer contains, based on an analysis using an Auger electron spectrometer, W: 5 to 20 by atomic %, and a balance consisting of carbon and unavoidable impurities, and average thickness of 1 to 10 μm.

It is known that the (Ti, Al)N layer as the hard layer of the surface coating of the coated hard metal tool is given a high-temperature hardness, and heat resistance by the Al component, and high-temperature strength by the Ti component. By the multiplier effect of the hard layer and the coexisting lubricant upper layer of amorphous carbon, the coated cuffing tool exhibits excellent cutting performance in an operation of continuous cutting or of interrupted cutting of a workpiece such as the above-described non-ferrous material or the like.

In addition, it is known that the above-described coated hard metal tool may be produced using a deposition apparatus exemplified by a schematic explanatory view of FIG. 6 (see Published Japanese translation No. 2002-513087 of PCT International Publication). The deposition apparatus comprises an arc discharge device equipped with Ti—Al alloy of a predetermined composition as a cathode (evaporation source), and a sputtering device equipped with a WC target as a cathode (evaporation source). After placing the above-described hard metal substrate in the apparatus, the hard lower layer and the lubricant upper layer may be deposited as follows.

(a) Firstly, as the above-described lower layer, a hard layer composed of the above-described (Ti, Al)N layer is deposited on the hard metal substrate under conditions comprising: heating the interior of the apparatus at 500° C. by a heater; in that state, by a condition of e.g., electric current: 90 A, generating arc discharge between an anode and the Ti—Al alloy as the cathode (evaporation source); simultaneously, as a reaction gas, introducing nitrogen gas into the apparatus to obtain a reaction atmosphere of e.g., 2 Pa; and applying a bias voltage of e.g., −100 V to the above-described hard metal substrate.

(b) Next, as an upper layer, an amorphous carbon based lubricant layer is deposited on the hard layer composed of the above-described (Ti, Al)N layer under the conditions comprising: heating the interior of the apparatus at e.g., 200° C.; introducing a mixed gas of hydrocarbon such as $C_2H_2$ or the like and Ar by a proportion of $C_2H_2$ flow rate: 40 to 80 sccm, and Ar flow rate: 250 sccm; thereby obtaining a reaction atmosphere having a pressure of e.g., 1 Pa and being composed of a mixed gas of resolved hydrocarbon gas and Ar; applying a bias voltage of e.g., −20V to the above-described hard metal substrate; and applying an electric power of output, 4 to 6 kW (frequency: 40 Hz) for sputtering to the cathode (evaporation source of the WC target).

DISCLOSURE OF INVENTION

Problems to be Solved by the Invention

Recent enhancement of the performance of a cutting apparatus is remarkable. On the other hand, there is a strong demand for power saving, energy saving, and cost reduction in the cutting operation Along with such trends, there is a tendency of accelerating cutting speed. The above-described coated hard metal tools cause no problem when they are used under normal cutting conditions. However, in the present circumstances, when cutting is specifically performed at high-speed, in relatively short time periods, the tools reach ends of working lives because of remarkably fast wearing of the amorphous carbon based lubricant coating. Specifically, when a cutting of a workpiece of the above-described non-ferrous material or the like is performed at high speed and under heavy cutting conditions such as high-angle slitting or high-speed feeding accompanied by high mechanical impact, the hard layer as the lower layer of the surface coating cannot show sufficient high-temperature strength, heat resistance, and high-temperature strength, and the amorphous carbon based lubricant layer cannot show sufficient high-temperature strength. Therefore, chipping easily occurs, and progress of wearing is further accelerated, and therefore the coated hard metal tools reach the ends of their working lifetimes in a relatively short time period of time.

Device for Solving the Problems

Based on the above-described point of view, the inventors performed a research in order to develop a coated hard metal tool having an amorphous carbon based lubricant coating showing excellent wear resistance specifically in high-speed cutting, and obtained the results summarized in the following (a) to (c).

(a) In a deposition apparatus indicated by a schematic plan view and a schematic front view of FIGS. 2A, and 2B, respective sputtering devices of the deposition apparatus shown in FIGS. 5A and 5B for forming a conventional amorphous carbon based lubricant coating are modified to magnetron sputtering devices by equipment of magnetic coils. Using such an apparatus, an amorphous carbon based lubricant coating may be formed under the following conditions. A magnetic field is formed by the magnetic coils to control a magnetic flux density at the placing position of the hard metal substrate to be 100 to 300 (Gauss). The interior of the apparatus is heated at a temperature of 300 to 500° C. Hydrocarbons such as $C_2H_2$, nitrogen and Ar are introduced into the apparatus preferably in a proportion of $C_2H_2$ flow rate: 25 to 100 sccm, nitrogen flow rate: 200 to 300 sccm, and Ar flow rate: 150 to 250 sccm; thereby obtaining a reaction atmosphere of a mixed gas of 1 Pa, being composed of resolved $C_2H_2$ gas, nitrogen and Ar. In the above-described two magnetron sputtering devices, a WC target as a cathode (evaporation source) is applied with electric power of e.g., output: 1 to 3 kW (frequency: 40 kHz) for sputtering. At the same time, a Ti target is applied with electric power of e.g., output; 3 to 8 kW (frequency: 40 kHz) for sputtering. When an amorphous carbon based lubricant coating is formed under the above-described conditions, the coating has a texture in which fine grains of crystalline titanium carbonitride based compounds [hereafter referred to as "fine grains of crystalline Ti(C,N) based compounds"] are dispersively distributed in a matrix of a carbon based amorphous material. The texture is exemplified by FIG. 1A, which schematically shows a result of observation of the texture using a transmission electron microscope.

(b) In the formation of the amorphous carbon based lubricant coating described above in (a), by controlling flow rates of hydrocarbon, nitrogen, and Ar as a reaction gas introduced into the deposition apparatus, and by controlling electric power for sputtering applied to the WC target and the Ti target of the magnetron sputtering devices, the amorphous carbon based lubricant coating may contain, based on an analysis using an Auger electron spectrometer, W: 5 to 40 atomic %, Ti: 0.5 to 30 atomic %, nitrogen: 0.5 to 20 atomic %, and a balance consisting of carbon and unavoidable impurities. As a result of the above-described formation, the amorphous carbon based lubricant coating has a remarkably enhanced hardness by the effect of the dispersive distribution of the crystalline Ti(C,N) based fine grains, and by the effect of the grain size reduction by the magnetic field applied deposition using the magnetic coils. Therefore, by the multiplier effect of the crystalline Ti(C,N) based fine grains and additional effect of W component on the enhancement of strength, a coated hard metal tool coated with the above-described amorphous carbon based lubricant coating generates no chipping (micro breaking) in the cutting edge and shows further enhanced wear resistance for a long period of time even when the tool is applied to high-speed cutting.

The present invention is based on the above-described results, and has characteristics on a coated hard metal tool having an amorphous carbon based lubricant coating which shows excellent wear resistance especially in the case of high-speed cutting. The hard metal tool comprises a hard metal substrate, an adhesion bonding layer, and an amorphous carbon based lubricant coating deposited on the hard metal lower layer with the adhesion bonding layer in-between, each of which having the following constituents.

(a) The hard metal substrate is composed of WC based cemented carbide or TiCN-based cermet.

(b) The adhesion bonding layer has an average thickness of 0.1 to 3 μm, consists of one or both selected from a TiN layer and TiCN layer, and is deposited by a magnetron sputtering apparatus using a Ti target as a cathode (evaporation source). The deposition of the adhesion bonding layer is carried out in a magnetic field and in a reaction atmosphere composed of a mixed gas of nitrogen and Ar or a mixed gas of resolved hydrocarbon gas, nitrogen and Ar.

(c) The amorphous carbon based lubricant coating is deposited in a magnetic field by the magnetron sputtering apparatus using a WC target and a Ti target as cathodes (evaporation sources) and a reaction atmosphere composed of a mixed gas of resolved hydrocarbon gas, nitrogen and Ar. The amorphous carbon based lubricant coating contains, based on analysis by Auger electron spectrometer, W: 5 to 40 atomic %, Ti: 0.5 to 30 atomic %, nitrogen: 0.5 to 30 atomic %, and a balance consisting of carbon and unavoidable impurities. Under an observation using a transmission electron microscope, the coating shows a texture in which fine grains of crystalline Ti(C, N) based compounds are dispersively distributed in a matrix of carbon based amorphous material.

The above-described limitations on the adhesion bonding layer and the amorphous carbon based lubricant coating as constituents of a coated hard metal tool of the invention are determined based on the following reasons.

(a) Average Thickness of the Adhesion Bonding Layer

The adhesion bonding layer comprising one or both selected from a TiN layer and TiCN layer exists between the hard metal substrate and the amorphous carbon based lubricant coating, both of which are tightly bonded to the adhesion bonding layer. Bonding of the adhesion bonding layer with the hard metal substrate is further improved by the deposition of the layer in the magnetic field. However, when the adhesion bonding layer has an average thickness of less than 0.1 μm, a desirable bonding strength cannot be ensured. On the other hand, with an average thickness exceeding 3 μm, thermal plastic deformation of the adhesion bonding layer is easily caused during high-speed cutting, thereby causing chipping to occur in the amorphous carbon based lubricant coating. Therefore, the average thickness of the adhesion bonding layer was determined to be 0.1 to 3 μm.

(b) W Content in the Amorphous Carbon Based Lubricant Coating

W component is included in the matrix of the amorphous carbon based lubricant coating and enhances the strength of the coating. However, a W content of less than 5 atomic % is insufficient to ensure a desirable high strength, whereas a W content exceeding 40 atomic % causes an abrupt reduction of lubricity. Therefore, the W content was determined to be 5 to 40 atomic %.

(c) Ti and N Content in the Amorphous Carbon Based Lubricant Coating

Ti component, N component and C (carbon) component are bonded with each other during the deposition in a magnetic field and occur as fine grains of crystalline Ti(C,N) based compounds, thereby remarkably enhancing the hardness of the coating. However, when the Ti content is less than 0.5 atomic %, and N content is less than 0.5 atomic %, the proportion of the fine grains of Ti(C,N) based compounds occurring in the coating is too low to ensure a desirable high hardness. On the other hand, a Ti content exceeding 30 atomic %, and N content exceeding 30 atomic % cause abrupt reduction of strength and lubricity. Therefore, the contents of respective components were determined to be Ti: 0.5 to 30 atomic %, and N: 0.5 to 30 atomic %.

(d) Average Thickness of the Amorphous Carbon Based Lubricant Coating

When the average thickness of the coating is less than 1 μm, desirable lubricity and wear resistance effect cannot be ensured. On the other hand, with an average thickness of the coating exceeding 13 μm, the cutting edge tends to be chipped. Therefore, the average thickness of the lubricant coating was determined to be 1 to 13 μm.

In addition, the inventors performed a continuous research in order to develop a coated hard metal tool having an amorphous carbon based lubricant coating showing excellent wear resistance specifically in high-speed cutting, and obtained the results described in the following (a) to (c).

(a) A deposition apparatus indicated by a schematic plan view and a schematic front view of FIGS. 3A, and 3B, is modified from a conventional deposition apparatus for forming an amorphous carbon based lubricant coating shown in FIGS. 5A and 5B. In the modification of the apparatus, respective sputtering devices are modified to magnetron sputtering devices by equipment of magnet coils. In addition, the Ti target as one of the cathodes (evaporation source) is replaced by a Ti—Al alloy target having a predetermined composition. Using such a deposition apparatus, an adhesion bonding layer may be formed under the following conditions. A magnetic field is formed by the magnetic coils to control a magnetic flux density at the placing position of the hard metal substrate to be 100 to 300 (Gauss). The interior of the apparatus is held at a heating temperature of 300 to 500° C. A reaction atmosphere of 1 Pa, being composed of a mixed gas of nitrogen and Ar is obtained by introducing the nitrogen and Ar into the apparatus in a proportion of e.g., nitrogen flow rate: 200 sccm, and Ar flow rate: 300 sccm. A glow discharge is generated by applying the above-described Ti—Al alloy target as a cathode (evaporation source) with an electric power of e.g., output: 12 kW (frequency: 40 kHz) for sputtering, and applying the hard metal substrate with a bias voltage of e.g., −100V. As a result, Ti and Al composite nitride (hereafter referred to as (Ti, Al)N) layer, which satisfies a compositional formula: $(Ti_{1-X}Al_X)N$ (where X ranges from 0.40 to 0.60 by atomic ratio) is formed on the surface of the hard metal substrate. The resultant (Ti, Al)N layer is tightly bonded to the surface of the hard metal substrate. The bonding strength of the layer with the hard metal substrate is further improved by the deposition in the magnetic field. In addition, by the content of Al, high-temperature hardness and high-temperature resistance are enhanced. By the multiplier effect of the above-described effects of the Al component and the effect of Ti on the enhancement of high-temperature strong, the hard metal tool is not chipped, and shows excellent wear resistance even in the case of high-speed cutting accompanied by high heat generation.

(b) Next, an amorphous carbon based lubricant coating is formed under the following conditions. Hydrocarbon such as $C_2H_2$, nitrogen, and Ar are introduced into the apparatus as a reaction gas, preferably in a proportion of $C_2H_2$ flow rate: 25 to 100 seem; nitrogen flow rate: 200 to 300 sccm; and Ar flow rate: 200 sccm. As a result, a reaction atmosphere is controlled to be e.g., a mixed gas of 1 Pa, being composed of a resolved $C_2H_2$ gas, nitrogen and Ar. The above-described WC target as a cathode (evaporation source) of the pair of magnetron sputtering devices is applied with electric power for sputtering of e.g., output: 1 to 3 kW (frequency: 40 kHz), and simultaneously, the above-described Ti—Al alloy target as a cathode (evaporation source) is applied with electric power for sputtering of e.g., output: 3 to 8 kW (frequency: 40 kHz). As a result, the amorphous carbon based lubricant coating is tightly bonded to the above-described (Ti, Al)N layer. In addition, as shown in FIG. 1B schematically showing a result of an observation using a transmission electron microscope, the coating has a texture in which fine grains of crystalline Ti—Al composite carbonitride [hereafter referred to as "fine Ti—Al (C,N) crystal grains"] are dispersively distributed in a matrix of carbon based amorphous material.

(c) In the formation of the amorphous carbon based lubricant coating described above in (b), by controlling flow rates of hydrocarbon, nitrogen, and Ar as a reaction gas introduced into the deposition apparatus, by controlling electric power for sputtering applied to the WC target and the Ti—Al alloy target of the magnetron sputtering devices, and by controlling the composition of the above-described Ti—Al alloy target, the amorphous carbon based lubricant coating may have a composition, based on an analysis using an Auger electron spectrometer, containing:

W: 5 to 20 atomic %,

Ti: 2.5 to 10 atomic %,

Al: 1.6 to 15 atomic %, nitrogen: 0.4 to 22.5 atomic %, and a balance consisting of carbon and unavoidable impurities. As a result of the above-described formation, the amorphous carbon based lubricant coating has a remarkably enhanced hardness by the effect of the dispersive distribution of the fine Ti—Al (C,N) crystal grains, and by the effect of the grain size reduction by the magnetic field applied deposition using the magnetic coils. Therefore, by the multiplier effect of the Ti—Al (C,N) crystal grains and the effect of the W component on enhancement of strength, a coated hard metal tool which is coated with the above-described amorphous carbon based lubricant coating is not chipped (micro-breaked) in the cutting edge and shows further excellent wear resistance for a long period of time even when the tool is applied to high-speed cutting.

The present invention is based on the above-described results, and has characteristics of a coated hard metal tool having an amorphous carbon based lubricant coating which shows excellent wear resistance especially in the case of high-speed cutting. The hard metal tool comprises a hard metal substrate, an adhesion bonding layer, and an amorphous carbon based lubricant coating which is deposited on the hard metal substrate the adhesion bonding layer in-between, each of which having the following constituents.

(a) The hard metal substrate is composed of a WC based cemented carbide or TiCN-based cermet.

(b) The adhesion bonding layer has an average thickness of 0.1 to 3 μm, comprises a (Ti,Al)N layer which satisfies a compositional formula: $(Ti_{1-X}Al_X)N$ (where X ranges from 0.40 to 0.60 by atomic ratio), and is deposited by a magnetron sputtering device using a Ti target as a cathode (evaporation source). The deposition of the adhesion bonding layer is carried out in a magnetic field and in a reaction atmosphere composed of a mixed gas of nitrogen and Ar.

(c) The amorphous carbon based lubricant coating is deposited in a magnetic field by the magnetron sputtering apparatus using a WC target and a Ti—Al alloy target as cathodes (evaporation sources) and a reaction atmosphere composed of a mixed gas of resolved hydrocarbon gas, nitrogen and Ar. The amorphous carbon based lubricant coating has an average thickness of 1 to 13 μm and a composition, based on an analysis using an Auger electron spectrometer, containing W: 5 to 20 atomic %, Ti: 2.5 to 10 atomic %, Al: 1.6 to 16 atomic %, nitrogen: 0.4 to 22.5 atomic %, and a balance consisting of carbon and unavoidable impurities. Under an observation using a transmission electron microscope, the lubricant coating shows a texture in which fine Ti—Al (C, N) crystal grains are dispersively distributed in a matrix of carbon based amorphous material.

The above-described limitations on the adhesion bonding layer and the amorphous carbon based lubricant coating are determined based on the following reasons:

(a) Composition and Average Thickness of the Adhesion Bonding Layer

As described above, the adhesion bonding layer comprising a (Ti, Al)N layer is provided with an excellent high-temperature strength by the Ti component, and excellent high temperature hardness and heat resistance by the Al component. When the X value showing the proportion (atomic ratio) of Al content over the total content of Al and Ti is less than 0.40, it is impossible to obtain an effect for improving wear resistance in the case of high-speed cutting accompanied by high heat generation. On the other hand, an X value exceeding 0.6 results in an abrupt reduction of high temperature strength and causes chipping to occur. Therefore, the X value was determined to be 0.40 to 0.60.

In addition, the above-described (Ti, Al)N layer exists in an interstice between the hard metal substrate and the amorphous carbon based lubricant coating, both of which are tightly bonded to the adhesion bonding layer. Bonding with the hard metal substrate is further improved by the deposition in the magnetic field. However, when the adhesion bonding layer has an average thickness of less than 0.1 µm, a desirable excellent bonding strength cannot be ensured. On the other hand, an average thickness exceeding 3 µm causes chipping to occur especially during high-speed cutting. Therefore, the average thickness of the adhesion bonding layer was determined to be 0.1 to 3 µm.

(b) W Content in the Amorphous Carbon Based Lubricant Coating

W component is included in the matrix of the amorphous carbon based lubricant coating and enhances the strength of the coating. However, a W content of less than 5 atomic % is insufficient to confirm a desirable high strength, whereas a W content exceeding 20 atomic % causes an abrupt reduction of lubricity. Therefore, the W content was determined to be 5 to 20 atomic %.

(c) Ti, Al and Nitrogen Content in the Amorphous Carbon Based Lubricant Coating

Ti component, Al component, nitrogen (N) component and C (carbon) component are bonded with each other during the deposition in a magnetic field and are present as fine Ti—Al (C,N) crystal grains in the coating. The fine Ti—Al (C,N) crystal gains are provided with excellent high temperature strength by the Ti and N component, and excellent high temperature hardness and heat resistance by the Al and C component Therefore, by dive distribution of such grains, wear resistance of the coating is remarkably enhanced. However, if the content of the Ti component is less than 2.5 atomic %, Al component is less than 1.6 atomic %, and N component is less than 0.4 atomic %, the proportion of the fine Ti—Al (C,N) crystal grains present in the coating is too low to confirm a desirable wear resistance. On the other hand, a Ti content exceeding 10 atomic %, Al content exceeding 15 atomic % and N content exceeding 22.5 atomic % cause a reduction of high-temperature strength, or abrupt reduction of high temperature hardness and heat resistance. Therefore, respective contents are determined to be Ti: 2.5 to 10 atomic %, Al: 1.6 to 15 atomic %, and N: 0.4 to 22.5 atomic %.

(d) Average Thickness of the Amorphous Carbon Based Lubricant Coating

When the average thickness of the coating is less than 1 µm desirable lubricity and wear resistance effect cannot be ensured. On the other hand, if an average thickness of the coating exceeds 13 µm, the cutting edge tends to be chipped. Therefore, the average thickness of the coating is determined to be 1 to 13 µm.

Moreover, based on a consideration of the conventional coated hard metal tool, the inventors performed a research in order to develop a coated hard metal tool having a surface coating layer which is not chipped and shows excellent wear resistance specifically in the above-described high-speed heavy cutting of a workpiece such as the above-described non-ferrous material. The results obtained by the research are summarized in the following (a) to (e).

(a) In the above-described conventional hard metal tool, a (Ti, Al)N base (hard) layer as a surface hard layer which has been formed by the arc discharge device of the deposition apparatus of FIG. 6 has a substantially homogeneous composition throughout the whole thickness of the layer, thereby having homogeneous high temperature hardness, heat resistance, and high temperature strength.

In the arc ion plating apparatus exemplified by a schematic plan view of FIG. 3A and a schematic front view of FIG. 3B, a rotation table for placing a hard metal substrate is provided in the center of the apparatus. On both sides of the above-described rotation table, Al—Ti alloy having a relatively high Al content (low Ti content) is placed on one side, and Ti—Al alloy having a relatively high Ti content (low Al content) is placed on the opposite side as cathodes (evaporation sources). In addition, metallic Cr is placed as a cathode (evaporation source) in a position rotated from both of the above-described cathodes by 90°. On the rotation table, on radial positions distant from the central axis of the table, a plurality of hard metal substrates are placed forming a ring-like arrangement. In that state, the rotation table is rotated, and the hard metal substrates themselves are revolved in order to homogenize the thickness of lower layers to be deposited. While maintaining the atmosphere inside of the apparatus as a nitrogen atmosphere, arc discharge is generated between the cathodes (evaporation sources) and anodes placed on both sides, shown as left and right sides in the figure, and a layer composite nitride of Al and Ti (hereafter referred to as (Al/Ti)N) is formed on the surfaces of the hard metal substrates. As a result, in the (Al/Ti)N layer, a portion of maximum Al content is formed in the layer when the hard metal substrate in ring-like arrangement on the rotation table is moved to the a position closest to the cathode (evaporation source) of Al—Ti alloy being placed on one side and having a relatively high Al (low Ti) content. In addition, a portion of maximum Ti content is formed in the layer when the hard metal substrate is moved to a position closest to the cathode of Ti—Al alloy having relatively high Ti (low Al) content on the other side. As a result, by the rotation of the rotation table, along the direction of thickness of the layer, maximum-Al portions and maximum-Ti portions appear alternately and repeatedly with a predetermined interval. In addition, the (Al/Ti)N layer has a variable composition structure in which the contents of Al and Ti respectively change continuously from the portion of maximum Al content to the portion of may Ti content, and from the portion of maximum Ti content to the portion of maximum Al content.

(b) In the formation of the (Al/Ti)N layer having variable composition structure as described in (a), the Al—Ti alloy as one of the opposed arrangements of the cathodes (evaporation sources) may have a relatively high Al content compared with the above-described conventional Ti—Al alloy, and the Ti—Al alloy as the cathode (evaporation source) on the other side may have a relatively high Ti content compared with the above-described conventional Ti—Al alloy. By using such cathodes, and by controlling the rotation speed of the rotation table on which the hard metal substrates are placed, the (Al/Ti)N layer may include:

maximum-Al portions having a maximum Al content which satisfies a compositional formula: $(Al_{1-X}T_X)N$, where X ranges from 0.05 to 0.35 by atomic ratio;

maximum-Ti portions having a maximum Ti content which satisfies a compositional formula: $(Ti_{1-Y}Al_Y)N$, where Y ranges from 0.05 to 0.35 by atomic ratio, and an interval in the direction of thickness between the adjacent maximum-Al portion and maximum-Ti portion may be controlled to be 0.01 to 0.1 μm.

Since the above-described portion of maximum Al content has a relatively higher Al content than that of the conventional (Ti, Al)N layer, the portion shows further excellent high-temperature hardness and heat resistance (high temperature properties). On the other hand, since the above-described maximum-Ti portion has a relatively higher Ti content than that of the conventional (Ti, Al)N layer, the portion is provided with Her enhanced high-temperature strength. In addition, since the interval between the maximum-Al portion and the maximum-Ti portion is controlled to have an extremely small value, it is possible to provide the whole layer with an excellent high temperature hardness and heat resistance while maintaining excellent high temperature strength of the whole layer.

(c) Next, an amorphous carbon based lubricant layer (upper layer) is deposited using a deposition apparatus exemplified by a schematic plan view in FIG. 2A, and a schematic front view in FIG. 2B. The apparatus is provided with a magnetron sputtering device having a cathode (evaporation source) of Ti target and a magnetron sputtering device having a cathode (evaporation source) of WC target in an opposed arrangement A hard metal substrate provided with the above-described lower layer is placed on a rotation table on the apparatus. The rotation table is rotated, and the hard metal substrate itself is revolved in order to homogenize the thickness of the upper layer (amorphous carbon based lubricant layer) to be deposited. A magnetic field is formed by the magnetic coils, and a magnetic flux density at the placing position of the hard metal substrate is controlled to be 100 to 300 G (Gauss). The inside of the apparatus is heated at a temperature of 300 to 500° C. As a reaction gas, a hydrocarbon such as $C_2H_2$, nitrogen and Ar are introduced into the apparatus, preferably in a proportion of $C_2H_2$ flow rate: 25 to 100 sccm; nitrogen flow rate: 200 to 300 sccm; and Ar flow rate; 150 to 250 sccm for controlling a reaction atmosphere to be e.g., a mixed gas of 1 Pa, being composed of a resolved $C_2H_2$ gas, nitrogen and Ar. In the above-described two magnetron sputtering devices, the cathode (evaporation source) of the WC target is applied with electric power for sputtering of e.g., output: 1 to 3 kW (frequency; 40 kHz), and simultaneously, the Ti alloy target is applied with electric power for sputtering of e.g., output: 3 to 8 kW (frequency: 40 kHz). As a result, the amorphous carbon based lubricant layer (upper layer) may be formed. In the lubricant layer, as shown in FIG. 1A schematically showing a result of an observation using a transmission electron microscope, the layer has a texture in which fine grains of crystalline Ti carbonitride compound [hereafter referred to as "fine grains of crystalline Ti (C,N) compound"] are dispersively distributed in a matrix of carbon based amorphous material.

(d) In the formation of the amorphous carbon based lubricant layer described above in (c), by controlling the flow rates of hydrocarbon, nitrogen, and Ar as a reaction gas introduced into the deposition apparatus, and by controlling electric power for sputtering applied to the WC target and the Ti target of the magnetron sputtering devices, the amorphous carbon based lubricant layer may have a composition, based on an analysis by an Auger electron spectrometer, comprising:

W: 5 to 40 atomic %,

Ti: 0.5 to 30 atomic %, nitrogen: 0.5 to 30 atomic %, and a balance consisting of carbon and unavoidable impurities. As a result of the above-described formation, the amorphous carbon based lubricant layer has a remarkably enhanced high temperature strength by the effect of the W content included in the matrix, and by the effect of the dispersive distribution of the fine grains of crystalline Ti (C,N), and by the effect of the grain size reduction at the time of applying magnetic field in deposition using the magnetic coils.

(e) In a coated hard metal tool deposited with a surface coating layer comprising the above-described (Al/Ti)N layer having a variable composition structure as a lower layer and the amorphous carbon based lubricant layer as the upper layer, the base (A)/Ti)N layer has an excellent high-temperature hardness, excellent heat resistance and excellent high temperature strength, and the amorphous carbon based lubricant layer is also provided with excellent high temperature strength. Therefore, even in the case of high speed and heavy cutting of the above-described non-ferrous material or the like, which is accompanied by especially high heat generation and high mechanical impact, the surface coating is not chipped and shows excellent wear resistance for a long period of time.

The present invention is based on the above-described results, and has a characteristic of a coated hard metal tool deposited with a surface coating layer of the following constitution (a) and (b), which shows excellent chipping resistance especially in the case of high speed heavy cutting.

(a) A hard layer composed of an (Al/Ti)N layer as a lower layer has an average thickness of 1.5 to 10 μm, and a variable composition structure. In the direction of thickness, the variable composition structure shows a component concentration distribution in which a maximum-Al portion and a maximum-Ti portion exist repeatedly and alternately with a predetermined interval, and the contents of Al and Ti change continuously from the maximum-Al portion to the maximum-Ti portion, and from the maximum-Ti portion to the maximum-Al portion. In addition, each of the maximum-Al portions satisfies a compositional formula: $(Al_{1-X}Ti_X)N$ where X ranges from 0.05 to 0.35 by atomic ratio; and each of the maximum-Ti portions satisfies a compositional formula: $(Ti_{1-Y}Al_Y)N$ where Y ranges from 0.05 to 0.35 by atomic ratio. An interval along the direction of thickness between the adjacent maximum-Al portion and the maximum-Ti portion is 0.01 to 0.1 μm.

(b) As an upper layer, an amorphous carbon based lubricant layer having an average thickness of 1 to 10 μm is deposited in a magnetic field, using a magnetron sputtering device, and a WC target and a Ti target as cathodes (evaporation sources), in a reaction atmosphere composed of a mixed gas of resolved hydrocarbon gas and Ar. Based on measurement by Auger spectroscopy, the layer contains W: 5 to 40 atomic %, Ti: 0.5 to 30 atomic %, nitrogen: 0.5 to 30 atomic %, and a balance consisting of carbon and unavoidable impurities. Under an observation using a transmission electron microscope, the layer shows a texture in which fine grains of crystalline Ti(C, N) based compounds are dispersively distributed in a matrix of a carbon based amorphous material.

The following are reasons for setting the above-described numerical limitations on the constituent layers of the surface coating layer of a coated hard metal tool of the invention.

(A) Lower layer [(Al,Ti)N Layer]

(a) Composition of Portion of Maximum al Content

In the (Al, Ti)N layer as the lower layer, the Al component has an effect of enhancing high temperature hardness and heat resistance, and the Ti component has an effect of enhancing high temperature strength. Therefore, the maximum-Al portion having a maximum Al content containing a relatively high proportion of Al is provided with an excellent high temperature hardness and heat resistance, thereby showing excellent wear resistance under high-speed cutting conditions accompanied by high heat generation. If the Ti content shown by the X value as a proportion (atomic ratio) of Ti in the total content of Al and Ti is less than 0.05, because of a relatively too high proportion of Al, even in the presence of adjacent maximum-Ti portions showing excellent high temperature strength, it is impossible to avoid a reduction of strength of the whole layer, and chipping or the like easily occurs under high-speed heavy cutting conditions. On the other hand, if the X value showing the proportion of Ti component exceeds 0.35, because of a relatively too small proportion of Al, it is impossible to ensure the excellent high temperature hardness and heat resistance. Therefore, the X value is determined to be 0.05 to 0.35.

(b) Composition of the Portion of Maximum Ti Content

As described above, the maximum-Al portion has an excellent high temperature hardness and excellent heat resistance, but is inferior in high temperature strength. In order to compensate for the insufficient high temperature strength of the maximum-Al portion, along the direction of thickness, the portions are alternately inserted with the maximum-Ti portion having relatively high Ti content thereby being provided with excellent high temperature strength. If the Al content shown by the Y value as a proportion (atomic ratio) of Al in the total content of Al and Ti exceeds 0.35, because of a relatively too high proportion of Al, desirable high temperature strength cannot be ensured. On the other hand, if the Y value is less than 0.05, because of a relatively too high proportion of Ti, the maximum-Ti portion cannot be provided with desirable high temperature hardness and heat resistance, thereby causing acceleration of progressive wear. Therefore, the Y value is determined to be 0.05 to 0.35.

(c) Interval Between the Portion of Maximum Al Content and the Portion of Maximum Ti Content.

If the interval is less than 0.01 µm it is impossible to clearly form the respective portions having the above-described composition, and therefore, it is impossible to ensure the desirably excellent high temperature strength, excellent high temperature hardness and heat resistance in the layer. If the interval exceeds 0.1 µm, defective properties, i.e., insufficient high temperature strength of the maximum-Al portion, and insufficient high temperature hardness and heat resistance of the maximum-Ti portion exist locally in the layer, thereby causing tendency for chipping to occur in the cutting edge and accelerating progress of wear. Therefore, the interval was determined to be 0.01 to 0.1 µm.

(d) Average Thickness

When the average thickness of the lower layer is less than 1.5 µm, it is impossible to ensure the desirable wear resistance for a long period of time. On the other hand, when the average thickness exceeds 10 µm, chipping easily occurs. therefore, the average thickness was determined to be 1.5 to 10 µM.

(B) Upper Layer (Amorphous Carbon Based Lubricant Layer)

(a) W Content

W component is included in the matrix of the above-described amorphous carbon based lubricant layer to improve the high temperature strength of the layer. However, a W content of less than 5 atomic % is insufficient to ensure a desirable high strength, whereas a W content exceeding 40 atomic % causes an abrupt reduction of lubricity. Therefore, the W content was determined to be 5 to 40 atomic %.

(b) Ti and N Content

Ti component, N component and C (carbon) component are bonded with each other during the deposition in a magnetic field and occur as fine grains of crystalline Ti (C,N) based compounds in the coating, remarkably enhancing the high temperature strength of the layer without reducing the excellent lubricity of the layer. However, if the Ti content is less than 0.5 atomic %, and N component is less than 0.5 atomic %, a proportion of the fine Ti (C,N) based grains occurring in the coating is too low to ensure a desirable high temperature strength. On the other hand, a Ti content exceeding 30 atomic %, and N content exceeding 30 atomic % cause an abrupt reduction of high-temperature hardness and lubricity. Therefore, the respective contents are determined to be Ti: 0.5 to 30 atomic %, and N: 0.5 to 30 atomic %.

(c) Average Thickness

If the average thickness of the lubricant layer is less than 1 µm, desirable lubricity cannot be ensured for a long period of time. On the other hand, if an average thickness of the layer exceeds 10 µm, the cutting edge tends to be chipped. Therefore, the average thickness of the layer is determined to be 1 to 10 µm.

As described above, the coated hard metal tool of the invention has a lower layer (hard layer) and an upper layer (amorphous carbon based lubricant layer) formed on a surface of substrate of the WC based cemented carbide, or titanium carbonitride-base cermet.

1. TiN, TiCN, and TiAlN in the lower layer provide excellent bonding strength with the substrate and high temperature strength, heat resistance, and high temperature hardness.

2. Amorphous carbon based lubricant layer;

2-1 As components in the carbon based amorphous phase, W is contained in order to improve the strength of the coating, and C is contained in order to Improve lubricity;

2-2 By dispersive distribution of fine grains of crystalline Ti(C,N) based compounds (Ti, TiCN or the like), and fine grains of crystalline (Ti,Al) (C,N) based compounds (TiAlN, TiAlCN or the like) in the carbon based amorphous phase described in the above 2-1, the upper lubricant layer as a whole may have enhanced wear resistance, heat resistance, high-temperature hardness, and high-temperature strength 3. Preferably, crystalline Ti(C,N) based compounds and crystalline (Ti,Al) (C,N) based compounds dispersively distributed in the upper layer may have a grain diameter of not larger than 40 nm. If the grain diameter exceeds 40 nm, wear resistance of the upper layer as a whole is deteriorated.

4. By combining the constitution of 1 to 3, the lower layer shows excellent high temperature hardness, heat resistance, and high temperature strength. In addition, by containing the fine crystal grains having a composition of the lower layer, the upper layer (amorphous carbon based lubricant layer) shows excellent lubricity, wear resistance and high temperature stability.

Effect of the Invention

In a coated hard metal tool of the invention, hardness of a constituent amorphous carbon based lubricant coating is remarkably improved because of the dispersive distribution of fine grains of crystalline Ti(C, N) based compounds which have an extremely fine grain size by the effect of deposition in the magnetic field. In addition, the matrix of the carbon based amorphous material is provided with high strength by the effect of the W component. Therefore, in the case of high-speed cutting of various iron and steel materials such as steels and cast irons, Al alloys, or Cu alloys, the coated hard metal tool shows excellent wear resistance for a long period of time without occurring chipping.

In a coated hard metal tool of the invention, hardness of a constituent amorphous carbon based lubricant coating is remarkably improved because of the dispersive distribution of fine grains of crystalline (Ti, Al)(C, N) based compounds which have an extremely fine grain size by the effect of deposition in the magnetic field. In addition, the matrix of the carbon based amorphous material is provided with high strength by the effect of the W component. Therefore, in the case of high-speed cutting of various iron and steel materials such as steel and cast iron, Al alloys, or Cu alloys, the coated hard metal tool shows excellent wear resistance for a long period of time without occurring chipping.

In addition, in a coated hard metal tool of the invention, the lower layer of (Al/Ti)N layer as a constituent of a surface coating layer shows excellent high-temperature hardness, heat resistance, and excellent high temperature strength. In addition, the amorphous carbon based lubricant layer as a constituent of the surface coating layer is provided with further excellent high temperature strength, by the effect of the W component contained in the matrix of the carbonous amorphous material, as well as by the effect of fine grains of crystalline Ti (C, N) based compounds, and fine grains of crystalline (Ti, Al)(C, N) based compounds which have an extremely fine g size by the effect of deposition in the magnetic field and are dispersively distributed in the matrix.

BEST MODE FOR CARRYING OUT THE INVENTION

Figure 1A:
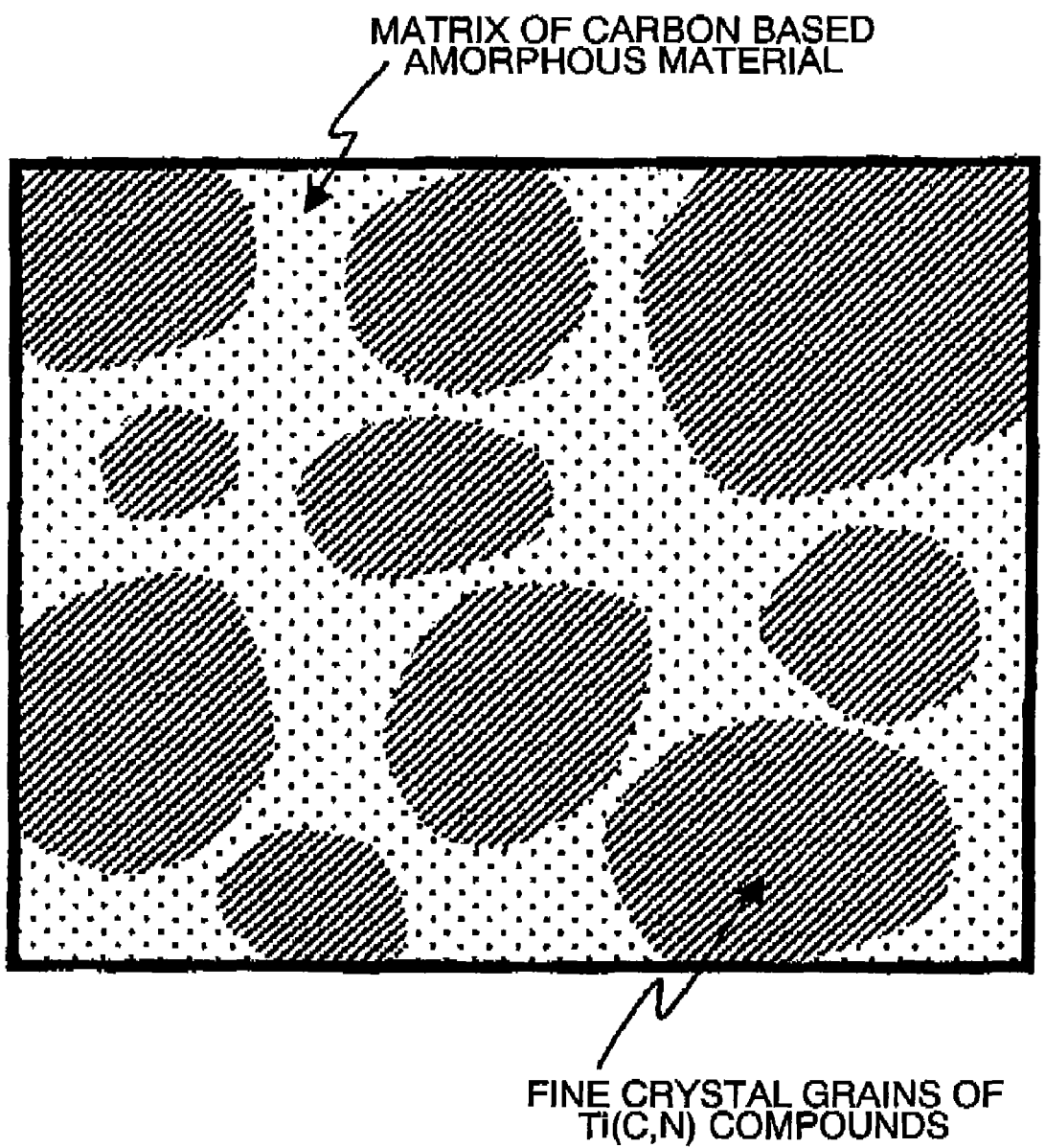
FIG. 1A is a schematic drawing showing a texture of the amorphous carbon based lubricant coating (containing fine pains of crystalline Ti(C, N) based compounds) of the invention as a result of observation using a transmission electron microscope.
Figure 1B:
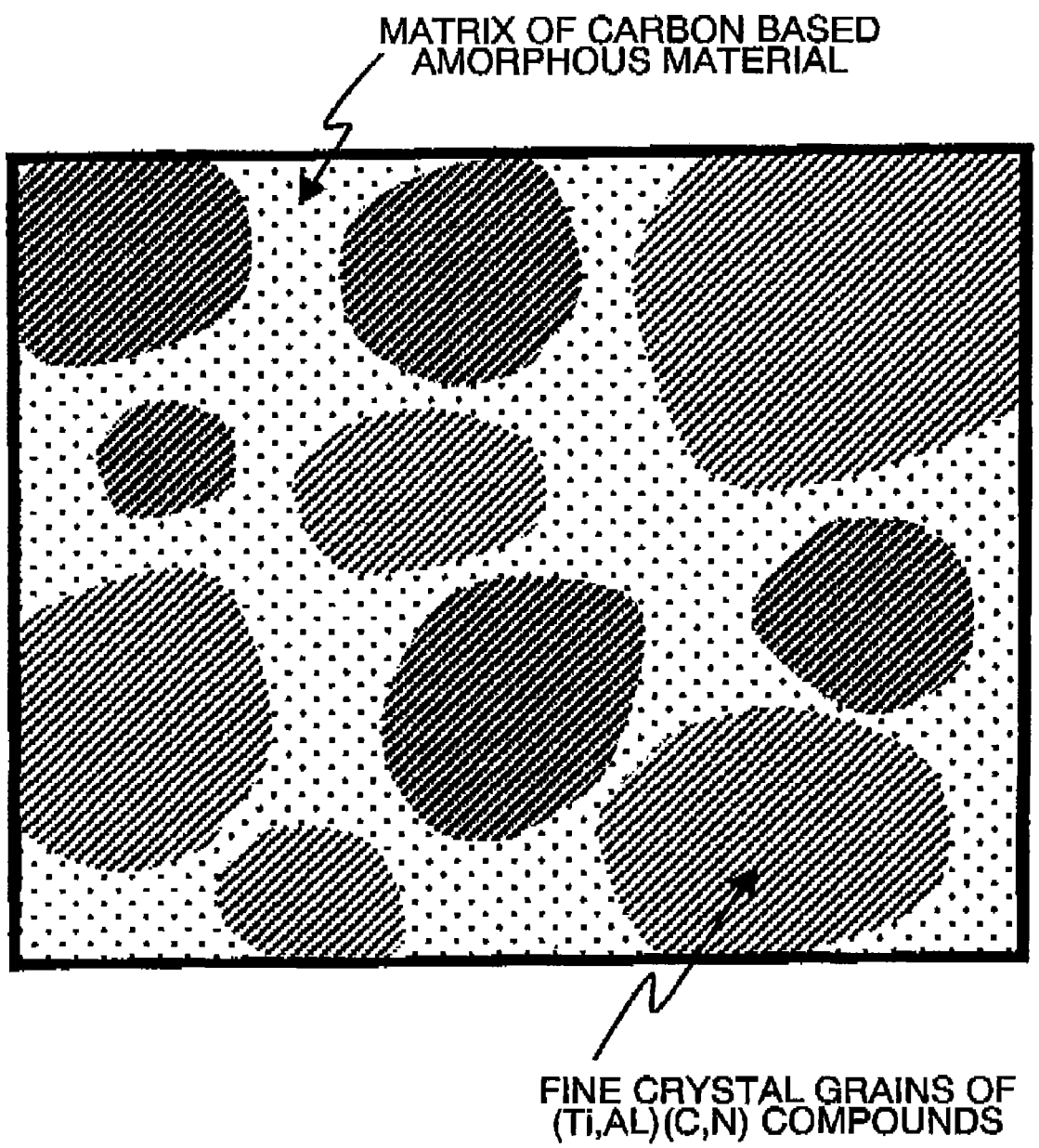
FIG. 1B is a schematic drawing showing the texture of an amorphous carbon based lubricant coating (containing fine grains of crystalline (Ti, Al) (C, N) based compounds) of the invention as a result of observation using a transmission electron microscope.

Next a coated hard metal tool of the invention is explained with reference to examples Example 1

As constituent powders, WC powder, TiC powder, VC powder, TaC powder, NbC powder, $Cr_3C_2$ powder, and Co powder, all of which had an average grain diameter in a range from 0.8 to 3 μm, were prepared and mixed in accordance with the compounding ratios presented in Table 1. The constituent powders were blended under wet conditions using a ball mill for 84 hours. After being dried, the mixed powders were press-molded under a pressure of 100 MPa so as to form compacts. The compacts were held under vacuum conditions of 6 Pa at a temperature of 1400° C. for 1 hour so as to be sintered. Thus, materials respectively composed of WC based cemented carbide were produced as a raw material for a hard metal substrate for carbon steel cutting, a raw material for a hard metal substrate for Al alloy cutting, and for Cu alloy cutting. By shaping the cutting edges by honing of R:0.03, the above-described raw material for hard metal substrate for carbon steel cutting was shaped to hard metal substrates A-1 to A-10 having a geometrical configuration of an insert meeting ISO standard TNMG 160408. By grinding the above-described raw materials for hard metal substrates for Al alloy cutting, and for Cu alloy cutting were shaped to hard metal substrates A-1' to A-10' having a geometrical configuration of an insert meeting ISO standard TEGX 160304R.

In addition, as constituent powders, TiCN powder (TiC/TiN=50/50 by weight ratio), $Mo_2C$ powder, ZrC powder, NbC powder, TaC powder, WC powder, Co powder and Ni powder, all of which had an average grain diameter ranging from 0.5 to 2 μm were prepared. These constituent powders were mixed in accordance with the compounding ratios presented in Table 2, blended under wet conditions using a ball mill for 84 hours. After being dried, the mixed powders were press-molded under a pressure of 100 MPa so as to form compacts. The compacts were hold in a nitrogen atmosphere of 2 kPa at a temperature of 1500° C. for one 1 hour so as to be sintered. Thus, raw materials respectively composed of TiCN-based cermet were produced as a raw material for a hard meal substrate for carbon steel cutting, and a raw material for a hard metal substrate for cutting Al alloy and Cu alloy. By shaping the cutting edges by honing of R:0.03, the above-described raw material for a hard metal substrate for carbon steel cutting was shaped to bad metal substrates B-1 to B-6 each having a geometrical configuration of an insert meeting ISO standard TEGX 160408. By grinding, the above-described raw materials for hard metal substrates for Al alloy cutting, and for Cu alloy cutting were shaped to hard metal substrates B-1' to B-6' having a geometrical configuration of an insert meeting ISO standard TEGX 160304R.

Next, the above-described hard metal substrates of A-1, 1' to A-10, 10', and B-1, 1' to B-6, 6' were subjected to ultrasonic cleaning in an acetone bat. At a dried state, the hard metal substrates were placed on a rotation table of a deposition apparatus shown in FIGS. 2A and 2B such that a plurality of the substrates formed a ring-like a arrangement radially distant from the center axis of the table by a predetermined distance. A Ti target of purity: 99.9% by weight was placed as a cathode (evaporation source) of a magnetron sputtering device on one side, and a WC target of purity: 99.6% by weight was placed as a cathode (evaporation source) of a magnetron sputtering device on the opposite side. In addition, at a position orthogonal to the two above-described cathodes, a Ti—Al alloy target of a predetermined composition was placed as a cathode (evaporation source) of a magnetron sputtering device to form an adhesion bonding layer comprising a (Ti, Al) N layer.

(a) Firstly, while maintaining the inside of the apparatus under a vacuum condition of 0.01 Pa the interior of the apparatus was heated to 200° C. After that Ar gas was introduced into the apparatus to obtain an Ar atmosphere of 0.5 Pa. In that state, by applying a bias voltage of −800V, the hard metal substrates revolving and rotating on the rotation table were subjected to Ar gas bombardment cleaning for 20 minutes.

(b) Next, magnetic coils of the pair of magnetron sputtering devices oppositely arranged in the deposition apparatus were respectively applied with a voltage: 50V and a current: 10 A, and a magnetic field was generated so as to have a flux density of 140 G (Gauss) at the placing positions of the hard metal substrates. The heating temperature of the interior of the deposition apparatus was maintained at 400° C. In that state, nitrogen and Ar were introduced into the apparatus as a reaction gas in a proportion of nitrogen flow rate: 300 sccm and Ar flow rate: 200 sccm to obtain a reaction atmosphere of 1 Pa, being composed of a mixed gas of nitrogen and Ar. Alternatively as a reaction gas, $C_2H_2$, nitrogen and Ar were introduced into the apparatus in a proportion of $C_2H_2$ flow rate: 50 sccm, nitrogen flow rate: 300 sccm and Ar flow rate: 230 sccm to obtain a reaction atmosphere of 1 Pa, being composed of a mixed gas of resolved $C_2H_2$ gas, nitrogen and Ar. In the reaction atmosphere, a cathode (evaporation source) of Ti target was applied with electric power for sputtering of 12 kW(frequency: 40 kHz), and the above-described hard metal substrate was applied with a bias voltage of −100V. Under that conditions, by the generation of a, glow discharge, on the surface of each of the above-described hard metal substrates, an adhesion bonding layer having a set thickness listed in Table 3, and comprising one or both of a TiN layer or TiCN layer was deposited.

(c) The above-described magnetic coils were subjected to predetermined conditions within a range of electric voltage: 50 to 100V, and a current: 10 to 20 A, and the magnetic flux density at the placing positions of the hard metal substrates was controlled to a predetermined value within a range or magnetic flux density: 100 to 300 G (Gauss). While maintaining the interior of the apparatus at a heating temperature of 400° C. and applying the hard metal substrate with a bias voltage of −100V, as a reaction gas, $C_2H_2$, nitrogen and Ar were introduced into the apparatus at predetermined flow rate within ranges of $C_2H_2$ flow rate: 25 to 100 sccm, nitrogen flow rate, 200 to 300 sccm, and Ar flow rate: 150 to 250 sccm to obtain a reaction atmosphere of 1 Pa, being composed of a mixed gas of resolved $C_2H_2$ gas, nitrogen and Ar. In the above-described pair of magnetron sputtering devices, the cathode (evaporation source) of WC target was applied with a predetermined electric power for sputtering within a range of e.g., output: 1 to 3 kW(frequency: 40 kHz). At the same time, the Ti target was applied with a predetermined electric power for sputtering within a range of output: 3 to 8 kW (frequency: 40 kHz). Under the above-described conditions, the substrates were deposited with an amorphous carbon based lubricant coating respectively having a set composition and a set layer thickness listed in Table 3. By the above-described process, inserts 1, 1' to 26, 26' made of surface-coated hard metal of the invention (hereafter referred to as coated inserts of the invention) were produced as coated hard metal tools of the invention.

In addition, the above-described hard metal substrates of A-1, 1' to A-10, 10', and B-1, 1' to B-6, 6' were subjected to ultrasonic cleaning in an acetone bath. After being dried, the hard metal substrates were placed on a rotation table of a deposition apparatus shown in FIGS. 3A and 3B such that a plurality of the substrates formed a ring-like arrangement radially distant from the center axis of the table by a predetermined distance. A Ti—Al alloy target of a predetermined composition was placed as a cathode (evaporation source) of a magnetron sputtering device on one side, and a WC target of purity: 99.6% by weight was placed as a cathode (evaporation source) of a magnetron sputtering device on the opposite side. In addition, at a position orthogonal to the two above-described cathodes, a Ti target of a purity: 99.9% by weight was placed as a cathode (evaporation source) of a magnetron sputtering device for formation of a one or both of a Ti layer and a TiCN layer.

(a) Firstly, while maintaining the interior of the apparatus under a vacuum condition of 0.01 Pa, the interior of the apparatus was heated to 200° C. After that, Ar gas was introduced into the apparatus to obtain an Ar atmosphere of 0.5 Pa. In that state, by applying a bias voltage of −800V, the hard metal substrates revolving and rotating on the rotation table were subjected to Ar gas bombardment cleaning for 20 minutes.

(b) Next, magnetic coils of the pair of magnetron sputtering devices oppositely arranged in the deposition apparatus were respectively applied with a voltage: 50V and a current: 10 A, and a magnetic field was generated so as to have a flux density of 140 G (Gauss) at the placing positions of the hard metal substrates. The heating temperature of the interior of the deposition apparatus was maintained at 400° C. In that state, as a reaction gas, nitrogen and Ar were introduced into the apparatus in a proportion of nitrogen flow rate: 300 sccm and Ar flow rate; 200 sccm to obtain a reaction atmosphere of 1 Pa, being composed of a mixed gas of nitrogen and Ar. Alternatively, as a reaction gas, $C_2H_2$, nitrogen and Ar were introduced into the apparatus in a proportion of $C_2H_2$ flow rate: 50 seem, nitrogen flow rate: 300 sccm and Ar flow rate: 230 sccm to obtain a reaction atmosphere of 1 Pa, being composed of a mixed gas of resolved $C_2H_2$ gas, nitrogen and Ar. In the reaction atmosphere, the cathode (evaporation source) of the Ti target was applied with electric power for sputtering of 12 kW (frequency: 40 kHz), and the above-described hard metal substrates were applied with a bias voltage of −100 V. Under these conditions, by the generation of a glow discharge, on the surface of each of the above-described hard metal substrates, an adhesion bonding layer having a set thickness listed in Table 4, and comprising one or both selected from a TiN layer or a TiCN layer was deposited.

(c) The above-described magnetic coils were subjected to predetermined conditions within a range of electric voltage: 50 to 100V and a current: 10 to 20 A, and the magnetic flux at the placing positions of the hard metal substrates was controlled to a predetermined value within a range of magnetic flux: 100 to 3000 (Gauss). While maintaining the interior of the apparatus at a heating temperature of 400° C. and a bias voltage of −70V applying to the hard metal substrate, as a reaction gas, $C_2H_2$, nitrogen and Ar were introduced into the apparatus at predetermined flow rates within ranges of $C_2H_2$ flow rate: 25 to 100 scan, nitrogen flow rate: 200 to 300 sccm and Ar flow rate: 150 to 250 sccm to obtain a reaction atmosphere of 1 Pa, being composed of a mixed gas of resolved gas of $C_2H_2$, nitrogen and Ar. In the above-described pair of magnetron sputtering devices, the cathode (evaporation source) of the WC target was applied with predetermined electric power for sputtering within a range of e.g., output: 1 to 3 kW (frequency: 40 kHz). At the same time, the Ti—Al alloy target was applied with electric power for sputtering within a predetermined range of output: 3 to 8 kW (frequency: 40 kHz). Under the above-described conditions, the substrates were deposited with amorphous carbon based lubricant coating respectively having a set composition and a set layer thickness listed in Table 4. By the above-described process, inserts 27, 27' to 42, 42' made of surface-coated hard metal of the invention (hereafter referred to as coated hard metal inserts) were produced as coated hard metal tools of the invention.

Figure 5A:
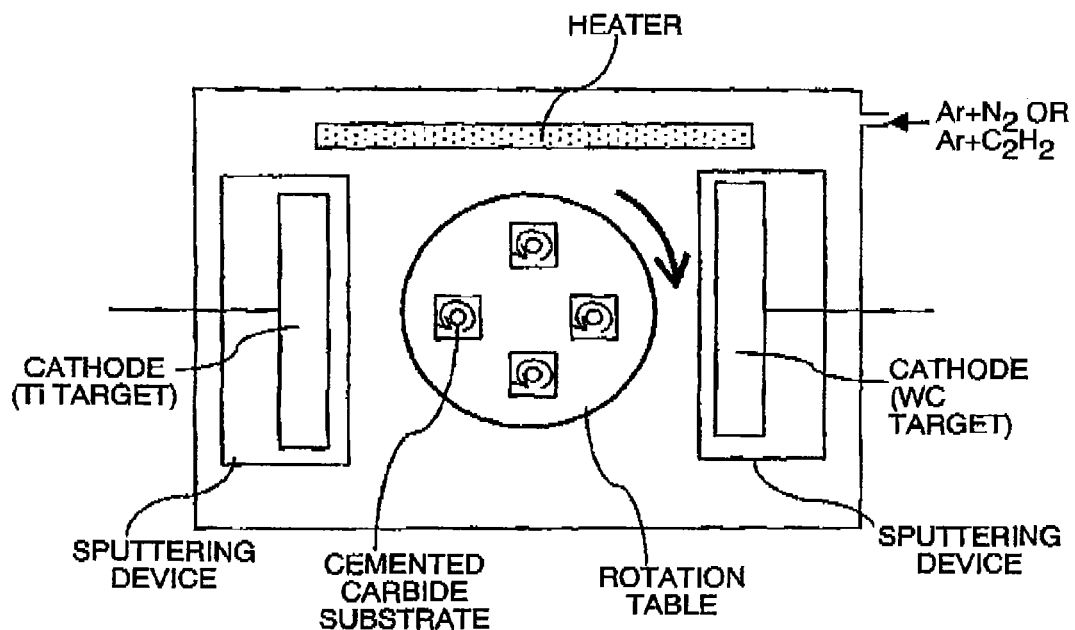
FIG. 5A is a schematic plan view of a deposition apparatus used for formation of an adhesion bonding layer and an amorphous carbon based lubricant coating as constituents of a conventional coated hard metal tool (comparative coated hard metal tool).
Figure 5B:
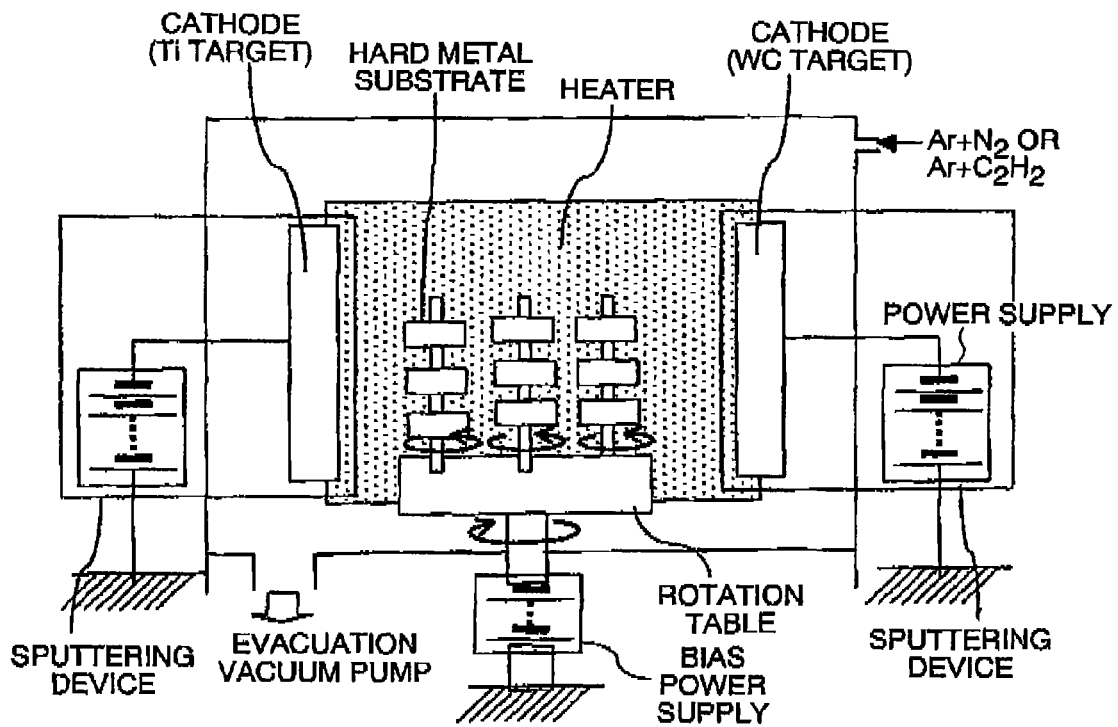
FIG. 5B is a schematic front view of a deposition apparatus shown in FIG. 5A.

In addition, the surfaces of the above-described hard metal substrates of A-1, 1' to A-10, 10', and B-1, 1' to B-6, 6' were subjected to ultrasonic cleaning in an acetone bath. With a purpose of obtaining a comparative data, a sputtering device shown in FIGS. 5A and 5B was used. The apparatus comprised a counter arrangement of a sputtering device equipped with a Ti target as a cathode (evaporation source) and a sputtering device equipped with a WC target as a cathode (evaporation source). The hard metal substrates were placed on a rotation table in the deposition apparatus such that a plurality of the substrates formed a ring-like arrangement radially distant from the center axis of the table by a predetermined distance.

(a) Firstly, while maintaining the interior of the apparatus under a vacuum condition of 0.01 Pa, the interior of the apparatus was heated to 2° C. After that, Ar gas was introduced into the apparatus to obtain an Ar atmosphere of 0.5 Pa. In that state, by applying a bias voltage of −800V, the hard metal substrates revolving and rotating on the rotation table were subjected to Ar gas bombardment cleaning for 20 minutes.

(b) Next, the heating temperature of the interior of the deposition apparatus was maintained at 300° C. In that state, as a reaction gas, nitrogen and Ar were introduced into the apparatus in a proportion of nitrogen flow rate: 200 sccm and Ar flow rate: 300 sccm to obtain a reaction atmosphere of 1 Pa, being composed of a mixed gas of nitrogen and Ar. Alternatively, as a reaction gas, $C_2H_2$, nitrogen and Ar were introduced into the apparatus in a proportion of $C_2H_2$ flow rate: 40 sccm, nitrogen flow rate: 200 sccm and Ar flow rate: 300 sccm to obtain a reaction atmosphere of 1 Pa, being composed of a mixed gas of resolved gas of $C_2H_2$, nitrogen and Ar. In the reaction atmosphere, the cathode (evaporation source) of the Ti target was applied with an electric power for sputtering of 12 kW (frequency: 40 kHz), and the above-described hard metal substrate is applied with a bias voltage of −100V. Under that conditions, by the generation of a glow discharge, on the surface of each of the above-described hard metal substrates, an adhesion bonding layer having a set thickness listed in Table 5, and 6, and comprising one or both of TiN layer or TiCN layer was deposited.

(c) Next, while maintaining the interior of the apparatus at a heating temperature of 200° C., as a reaction gas, $C_2H_2$ and Ar were introduced into the apparatus at predetermined flow rates within ranges of $C_2H_2$ flow rate: 40 to 80 sccm, and Ar flow rate: 250 scorn to obtain a reaction atmosphere of 1 Pa, being composed of a mixed gas of resolved gas of $C_2H_2$ and Ar. At the same time, the above-described hard metal substrates were applied with a bias voltage of −20V, and the cathode (evaporation source) of WC target was applied with a predetermined electric power for sputtering within a range of output: 4 to 6 kW (frequency: 40 kHz). Under the above-described conditions, on the above-described adhesion bonding layers, the substrates were deposited with an amorphous carbon based lubricant coating respectively having a set composition and a set layer thickness listed in Tables 5 and 6. By the above-described process, comparative inserts 1, 1' to 16, 16' made of surface-coated hard metal hereafter referred to as comparative coated hard metal inserts) were produced as conventional coated hard meal tools.

Next, the above-described coated hard metal inserts 1, 1' to 42, 42' of the invention, and comparative coated hard metal inserts 1, 1' to 16, 16' were respectively screw-mounted with a fixture-jig on an end of a bit made of a tool steel, and were applied to the following tests of high-speed dry cuffing.

Cutting tests on a carbon steel were carried out under high-speed (compared with normal cutting speed of 120 m/min), dry cutting conditions comprising:

workpiece: a round bar of JIS-S10C;

cutting speed: 350 m/min;

depth of cut: 1.2 mm;

feed: 0.18 m/rev; and cutting time: 5 minutes.

Cutting tests on an Al-alloy were carried out under high-speed (compared with normal cutting speed of 400 m/min), dry cutting conditions comprising:

workpiece: a round bar of JIS A5052;

cutting speed: 1000 m/min;

depth of cut: 1.4 mm;

feed: 0.3 am/rev; and cutting time: 20 minutes.

In addition, cutting tests on an Cu-alloy were carried out under high-speed (compared with normal cutting speed of 200 m/min), dry cutting conditions comprising:

workpiece: a round bar of JIS-C7310;

cutting speed 430 m/min;

depth of cut: 1.2 mm;

feed: 0.25 mm/rev; and cutting time: 20 minutes.

In each of the cutting tests, widths of flank wear were of the cutting edges measured. The results of the measurements are listed in Tables 3 to 6.

TABLE 1

| | Type | Composition (% by weight) | | | | | |
| --- | --- | --- | --- | --- | --- | --- | --- |
| | | Co | TiC | TaC | NbC | VC | Cr$_3$C$_2$ | WC |
| HARD METAL SUBSTRATE | A-1, 1' | 5 | — | 0.5 | — | — | — | balance |
| | A-2, 2' | 5.5 | — | 0.2 | 1.8 | — | — | balance |
| | A-3, 3' | 6 | — | — | — | — | 0.1 | balance |
| | A-4, 4' | 6.5 | — | — | — | 0.1 | — | balance |

TABLE 1-continued

| | Type | Composition (% by weight) | | | | | | |
| --- | --- | --- | --- | --- | --- | --- | --- | --- |
| | | Co | TiC | TaC | NbC | VC | Cr$_3$C$_2$ | WC |
| (INSERT) | A-5, 5' | 7 | — | — | — | 0.3 | 0.3 | balance |
| | A-6, 6' | 7.5 | — | 2 | — | — | — | balance |
| | A-7, 7' | 8 | — | — | — | — | 0.5 | balance |
| | A-8, 8' | 8.5 | 5 | — | 3 | — | — | balance |
| | A-9, 9' | 9 | 0.5 | 2.5 | — | — | — | balance |
| | A-10, 10' | 9.5 | 1.5 | — | 0.5 | — | — | balance |

TABLE 2

| | Type | Composition (% by weight) | | | | | | | |
| --- | --- | --- | --- | --- | --- | --- | --- | --- | --- |
| | | Co | Ni | ZrC | TaC | NbC | Mo$_2$C | WC | TiCN |
| HARD METAL SUBSTRATE (INSERT) | B-1, 1' | 14 | 4.5 | — | 10 | — | 10 | 16 | balance |
| | B-2, 2' | 7 | 6 | — | 5 | — | 7.5 | — | balance |
| | B-3, 3' | 8 | — | — | — | — | 6 | 10 | balance |
| | B-4, 4' | 11 | 4.5 | — | 11 | 2 | — | — | balance |
| | B-5, 5' | 9 | 4 | 1 | 8 | — | 10 | 10 | balance |
| | B-6, 6' | 12 | 5.5 | — | 10 | — | 9.5 | 14.5 | balance |

TABLE 3

| Type | | Hard metal substrate number | Adhesion bonding layer set thickness (μm) | | Amorphous carbon based lubricant coating | | | | set thickness (μm) | Grain diameter of Ti (C, N) crystal (nm) | Width of flank wear (mm) | | |
| --- | --- | --- | --- | --- | --- | --- | --- | --- | --- | --- | --- | --- | --- |
| | | | TiN layer | TiCN layer | set composition (atomic %) | | | | | | high speed cutting of carbon steel | high speed cutting of Al alloy | high speed cutting of Cu alloy |
| | | | | | W | Ti | N | C+ impurities | | | | | |
| COATED HARD METAL INSERT OF THE INVENTION | 1, 1' | A-1, 1' | 0.1 | — | 5.0 | 20.0 | 10.0 | balance | 1.0 | 39.5 | 0.25 | 0.17 | 0.16 |
| | 2, 2' | A-2, 2' | — | 1.0 | 10.0 | 15.0 | 7.5 | balance | 3.0 | 23.5 | 0.22 | 0.14 | 0.13 |
| | 3, 3' | A-3, 3' | 1.0 | 0.5 | 16.0 | 10.0 | 5.0 | balance | 5.0 | 22.5 | 0.2 | 0.12 | 0.11 |
| | 4, 4' | A-4, 4' | — | 2.0 | 20.0 | 5.0 | 2.5 | balance | 7.0 | 9.0 | 0.17 | 0.1 | 0.08 |
| | 5, 5' | A-5, 5' | 2.5 | — | 5.0 | 20.0 | 18.0 | balance | 9.0 | 8.5 | 0.15 | 0.07 | 0.06 |
| | 6, 6' | A-6, 6' | 1.0 | 2.0 | 10.0 | 15.0 | 10.5 | balance | 13.0 | 7.0 | 0.12 | 0.05 | 0.04 |
| | 7, 7' | A-7, 7' | 0.5 | — | 15.0 | 10.0 | 9.0 | balance | 3.0 | 35.5 | 0.23 | 0.15 | 0.14 |
| | 8, 8' | A-8, 8' | — | 3.0 | 20.0 | 5.0 | 0.5 | balance | 5.0 | 20.5 | 0.21 | 0.13 | 0.13 |
| | 9, 9' | A-9, 9' | 0.5 | 2.5 | 10.0 | 10.0 | 3.0 | balance | 7.0 | 18.5 | 0.19 | 0.12 | 0.09 |
| | 10, 10' | A-10, 10' | 2.0 | — | 15.0 | 15.0 | 1.5 | balance | 9.0 | 9.5 | 0.17 | 0.09 | 0.07 |
| | 11, 11' | A-1, 1' | 2.0 | — | 5.0 | 20.0 | 18.0 | balance | 9.0 | 30.4 | 0.23 | 0.12 | 0.11 |
| | 12, 12' | A-3, 3' | — | 1.5 | 10.0 | 30.0 | 25.0 | balance | 6.0 | 15.5 | 0.19 | 0.14 | 0.10 |
| | 13, 13' | A-5, 5' | 0.5 | 0.5 | 20.0 | 20.0 | 16.5 | balance | 4.0 | 13.0 | 0.18 | 0.16 | 0.09 |
| | 14, 14' | A-7, 7' | 0.5 | 1.0 | 10.0 | 0.5 | 10.0 | balance | 5.0 | 8.0 | 0.35 | 0.03 | 0.05 |
| | 15, 15' | A-9, 9' | — | 1.5 | 40.0 | 4.0 | 30.0 | balance | 10.0 | 5.0 | 0.08 | 0.21 | 0.25 |
| | 16, 16' | B-1, 1' | — | 2.5 | 5.0 | 5.0 | 2.5 | balance | 9.0 | 9.5 | 0.15 | 0.08 | 0.07 |
| | 17, 17' | B-2, 2' | 1.0 | 1.0 | 10.0 | 10.0 | 5.0 | balance | 7.0 | 13.5 | 0.16 | 0.11 | 0.10 |
| | 18, 18' | B-3, 3' | — | 1.0 | 15.0 | 15.0 | 7.5 | balance | 3.0 | 28.5 | 0.21 | 0.14 | 0.12 |
| | 19, 19' | B-4, 4' | 1.5 | — | 20.0 | 20.0 | 10.0 | balance | 13.0 | 8.0 | 0.13 | 0.06 | 0.06 |
| | 20, 20' | B-5, 5' | — | 0.1 | 10.0 | 15.0 | 13.5 | balance | 1.0 | 36.0 | 0.24 | 0.19 | 0.18 |
| | 21, 21' | B-6, 6' | 1.5 | 1.5 | 15.0 | 10.0 | 1.0 | balance | 5.0 | 21.0 | 0.19 | 0.13 | 0.11 |
| | 22, 22' | B-1, 1' | — | 0.5 | 20.0 | 5.0 | 4.5 | balance | 8.0 | 17.0 | 0.18 | 0.12 | 0.12 |
| | 23, 23' | B-3, 3' | 2.0 | — | 15.0 | 20.0 | 15.0 | balance | 10.0 | 8.5 | 0.14 | 0.08 | 0.06 |
| | 24, 24' | B-4, 4' | 2.0 | 1.0 | 10.0 | 30.0 | 26.0 | balance | 2.0 | 23.0 | 0.20 | 0.15 | 0.10 |
| | 25, 25' | B-5, 5' | 1.5 | 0.5 | 20.0 | 3.0 | 10.0 | balance | 6.0 | 39.0 | 0.29 | 0.05 | 0.04 |
| | 26, 26' | B-6, 6' | — | 1.0 | 35.0 | 1.5 | 30.0 | balance | 12.0 | 6.0 | 0.10 | 0.23 | 0.20 |

TABLE 4

| Type | | Hard metal substrate number | Adhesion bonding layer Set thickness (μm) | | Amorphous carbon based lubricant coating | | | | | Set thickness (μm) | Grain diameter of (Ti, Al) (C, N) crystal (nm) | Width of flank wear (mm) | | |
|---|---|---|---|---|---|---|---|---|---|---|---|---|---|---|
| | | | | | Set composition (atomic %) | | | | | | | high speed cutting of | high speed cutting of | high speed cutting of |
| | | | TiN layer | TiCN layer | W | Ti | Al | N | C+ impurities | | | carbon steel | Al alloy | Cu alloy |
| COATED HARD METAL INSERT OF THE INVENTION | 27, 27' | A-1, 1' | 0.1 | — | 5.0 | 10.0 | 15.0 | 22.5 | balance | 3.0 | 32.6 | 0.21 | 0.16 | 0.14 |
| | 28, 28' | A-2, 2' | — | 1.0 | 10.0 | 8.0 | 12.0 | 12.0 | balance | 5.0 | 24.9 | 0.19 | 0.13 | 0.12 |
| | 29, 29' | A-3, 3' | 1.0 | 0.5 | 15.0 | 4.0 | 6.0 | 3.0 | balance | 7.0 | 22.1 | 0.19 | 0.11 | 0.12 |
| | 30, 30' | A-4, 4' | — | 2.0 | 20.0 | 10.0 | 15.0 | 2.5 | balance | 9.0 | 11.7 | 0.14 | 0.1 | 0.07 |
| | 31, 31' | A-5, 5' | 2.5 | — | 5.0 | 10.0 | 10.0 | 18.0 | balance | 1.0 | 8.6 | 0.13 | 0.07 | 0.05 |
| | 32, 32' | A-6, 6' | 1.0 | 2.0 | 10.0 | 7.5 | 7.5 | 13.5 | balance | 3.0 | 5.3 | 0.1 | 0.04 | 0.04 |
| | 33, 33' | A-7, 7' | 0.5 | — | 15.0 | 5.0 | 5.0 | 3.0 | balance | 5.0 | 28.6 | 0.2 | 0.14 | 0.13 |
| | 34, 34' | A-8, 8' | — | 3.0 | 20.0 | 2.5 | 2.5 | 0.5 | balance | 7.0 | 25.7 | 0.2 | 0.12 | 0.12 |
| | 35, 35' | A-9, 9' | 0.5 | 2.5 | 5.0 | 2.5 | 1.6 | 0.4 | balance | 9.0 | 16.3 | 0.16 | 0.13 | 0.08 |
| | 36, 36' | A-10, 10' | 2.0 | — | 10.0 | 6.0 | 4.0 | 6.0 | balance | 13.0 | 14.3 | 0.16 | 0.1 | 0.07 |
| | 37, 37' | B-1, 1' | — | 2.5 | 15.0 | 10.0 | 6.7 | 5.0 | balance | 13.0 | 9.4 | 0.13 | 0.07 | 0.06 |
| | 38, 38' | B-2, 2' | 1.0 | 1.0 | 20.0 | 2.5 | 1.6 | 3.7 | balance | 9.0 | 12.2 | 0.15 | 0.1 | 0.09 |
| | 39, 39' | B-3, 3' | — | 1.0 | 5.0 | 10.0 | 10.0 | 10.0 | balance | 7.0 | 21.2 | 0.19 | 0.13 | 0.11 |
| | 40, 40' | B-4, 4' | 1.5 | — | 10.0 | 7.5 | 7.5 | 7.5 | balance | 5.0 | 6.5 | 0.11 | 0.05 | 0.05 |
| | 41, 41' | B-5, 5' | — | 0.1 | 15.0 | 5.0 | 5.0 | 5.0 | balance | 3.0 | 39.8 | 0.23 | 0.18 | 0.16 |
| | 42, 42' | B-6, 6' | 1.5 | 1.5 | 20.0 | 7.5 | 7.5 | 7.5 | balance | 1.0 | 18.8 | 0.17 | 0.12 | 0.1 |

TABLE 5

| Type | | Hard metal substrate number | Adhesion bonding layer Set thickness (μm) | | Amorphous carbon based lubricant coating | | | | Set thickness (μm) | Width of flank wear (mm) | | |
|---|---|---|---|---|---|---|---|---|---|---|---|---|
| | | | | | Set composition (atomic %) | | | | | high speed cutting of | high speed cutting of | high speed cutting of |
| | | | TiN layer | TiCN layer | W | Ti | N | C+ impurities | | carbon steel | Al alloy | Cu alloy |
| COMPARATIVE HARD METAL INSERT | 1, 1' | A-1, 1' | 0.1 | — | 5 | — | — | balance | 1 | 0.75 | 0.67 | 0.65 |
| | 2, 2' | A-2, 2' | — | 1 | 10 | — | — | balance | 3 | 0.72 | 0.64 | 0.62 |
| | 3, 3' | A-3, 3' | 1 | 0.5 | 15 | — | — | balance | 5 | 0.69 | 0.62 | 0.60 |
| | 4, 4' | A-4, 4' | — | 2 | 20 | — | — | balance | 7 | 0.64 | 0.60 | 0.58 |
| | 5, 5' | A-5, 5' | 2.5 | — | 5 | — | — | balance | 9 | 0.62 | 0.58 | 0.57 |
| | 6, 6' | A-6, 6' | 1 | 2 | 10 | — | — | balance | 13 | 0.59 | 0.65 | 0.53 |
| | 7, 7' | A-7, 7' | 0.5 | — | 15 | — | — | balance | 3 | 0.74 | 0.67 | 0.64 |
| | 8, 8' | A-8, 8' | — | 3 | 20 | — | — | balance | 5 | 0.72 | 0.64 | 0.61 |
| | 9, 9' | A-9, 9' | 0.5 | 2.5 | 10 | — | — | balance | 7 | 0.68 | 0.62 | 0.60 |
| | 10, 10' | A-10, 10' | 2 | — | 15 | — | — | balance | 9 | 0.65 | 0.60 | 0.67 |

TABLE 6

| Type | | Hard metal substrate number | Adhesion bonding layer Set thickness (μm) | | Amorphous carbon based lubricant coating | | | | Set thickness (μm) | Width of flank wear (mm) | | |
|---|---|---|---|---|---|---|---|---|---|---|---|---|
| | | | | | Set composition (atomic %) | | | | | high speed cutting of | high speed cutting of | high speed cutting of |
| | | | TiN layer | TiCN layer | W | Ti | N | C+ impurities | | carbon steel | Al alloy | Cu alloy |
| COMPARATIVE COATED HARD METAL INSERT | 11, 11' | B-1, 1' | — | 2.5 | 5 | — | — | balance | 9 | 0.61 | 0.57 | 0.67 |
| | 12, 12' | B-2, 2' | 1 | 1 | 10 | — | — | balance | 7 | 0.63 | 0.60 | 0.59 |
| | 13, 13' | B-3, 3' | — | 1 | 15 | — | — | balance | 3 | 0.70 | 0.65 | 0.63 |
| | 14, 14' | B-4, 4' | 1.5 | — | 20 | — | — | balance | 13 | 0.60 | 0.57 | 0.55 |
| | 15, 15' | B-5, 5' | — | 0.1 | 10 | — | — | balance | 1 | 0.73 | 0.68 | 0.66 |
| | 16, 16' | B-6, 6' | 1.5 | 1.5 | 15 | — | — | balance | 5 | 0.66 | 0.63 | 0.62 |

Example 2

As constituent powders, medium to coarse grained WC powder having an average grain diameter of 4.5; fine Red WC powder of average grain diameter: 0.8 µm, TaC powder of average grain diameter: 1.3 µm, NbC powder of average grain diameter: 1.2 µm, ZrC powder of average grain diameter: 1.2 M, $Cr_3C_2$ powder of average grain diameter: 1.8 µm, VC powder of average grain diameter: 1.5 µm, (Ti,W)C (TiC/WC=50/50 in weight ratio) powder of average grain diameter: 1.0 µm, and Co powder of average grain diameter: 1.8 µM were prepared. These constituent powders were mixed in accordance with the compounding ratios presented in Table 7, added to wax and blended in acetone using a ball mill for 72 hours. After being dried under vacuum conditions, the mixed powders were press-molded under a pressure of 100 MPa so as to form various compacts each of which having a predetermined form. The compacts were sintered by conditions including: a vacuum condition of 6 Pa, heating the compacts at a heating rate of 7° C./minutes to a predetermined temperature within a range of 1370 to 1470° C., maintaining the compacts at the predetermined temperature for 1 hour, and furnace cooling the compacts. Thus, three types of sintered round bars for forming a hard metal substrate, respectively having a diameter of 8 mm, 13 mm, or 26 mm, were formed. By grinding the three types of sintered round bars, hard metal substrates (end mill) C-1 to C-8 were produced so as to have a form of four edges square with an angle of torsion of 30°, and diameter×length of the cutting edge of 6 mm×13 mm, 10 mm×22 mm, or 20 mm×45 mm.

Next, these hard metal substrates (end mills) C-1 to C-8 were subjected to ultrasonic cleaning in an acetone bath. After dying, the hard metal substrates were placed in a deposition apparatus shown in FIGS. 2A and 2B or in FIGS. 3A and 3B. Under the same conditions as Example 1, one or both of the TiN layer and TiCN layer, having a set layer thickness shown in Tables 8 and 9, and an amorphous carbon based lubricant coating having a set composition and thickness shown in Tables 8 and 9 were deposited. By the above-described process, end mills 1 to 19 made of surface-coated hard metal of the invention (hereafter referred to as coated hard metal end mill of the invention) were produced as coated hard metal tools of the inventions.

In addition, as a comparative example, the above-described hard metal substrates (end mills) C-1 to C-8 were subjected to ultrasonic cleaning in an acetone bath. After being dried, the hard metal substrates were placed in a deposition apparatus shown in FIGS. 5A and 5B, under the same conditions as Example 1, and one or both of a TiN layer and TiCN layer, having a set layer thickness shown in Table 10, and an amorphous carbon based lubricant coating having a set composition and thickness shown in Table 10 were deposited. By the above-described process, comparative end mills 1 to 8, made of surface-coated hard metal (hereafter referred to as comparative coated hard metal end mill) were produced as conventional coated hard metal tools.

Next, the above-described coated hard metal end mills 1 to 19 of the invention, and comparative coated hard metal end mills 1 to 19 were applied to tests of high-speed, dry side cutting.

The coated hard metal end mills 1 to 3, 9, 12 to 14 of the invention, and comparative coated hard metal end mills 1 to 3 were applied to high-speed (compared with normal speed of 180 m/min), dry side-cutting of an Al alloy under conditions comprising:

workpiece: a plate of JIS A5052 having a plate dimension of 100 mm×250 mm and a thickness of 50 mm;
cutting speed: 300 m/min;
depth of cut in the axial direction: 4 mm;
depth of cut in the radial direction: 0.7 mm; and
table feed: 2200 mm minute.

The coated hard metal end mills 4 to 6, 10, 15 to 17 of the invention, and comparative coated hard metal end mills 4 to 6 were applied to high-speed (compared with normal speed of 180 m/min), dry side-cutting of a Cu alloy under conditions comprising:

workpiece: a plate of JIS-C3710 having a plate dimension of 100 mm×250 mm; and a thickness of 50 mm;
cutting speed: 300 m/min;
depth of cut in the axial direction: 6 mm;
depth of cut in the radial direction: 1.1 mm; and
table feed: 2050 mm/minute.

The coated hard metal end mills 7 and 8 of the invention, and comparative coated hard metal end mills 7, 8, 11, 18 and 19 were applied to high-speed (compared with normal speed of 200 m/min), dry side-cutting of a carbon steel under conditions comprising:

workpiece: a plate of JIS-S10C having a plate dimension of 100 mm×250 mm and a thickness of 50 mm;
cutting speed: 350 w/min;
depth of cut in the axial direction: 9 mm;
depth of cut in the radial direction: 2 mm;
table feed: 2050 mm minute.

In each side-cutting test, the length of cut by the end mill until the end of the working lifetime of the end mill was measured. In each case, the end mill was regarded to reach its lifetime when a width of flank wear of a peripheral edge of a cutting edge of the end mill reached 0.1 mm. The results are listed in Tables 8 to 10.

TABLE 7

| Type | | Co | (Ti,W)C | TaC | NbC | ZrC | $Cr_3C_2$ | VC | WC | Diameter × length of cutting edge |
|---|---|---|---|---|---|---|---|---|---|---|
| COATED HARD METAL SUBSTRATE (END MILL) | C-1 | 5 | — | — | — | — | — | — | fine grain: balance | 6 × 13 |
| | C-2 | 6 | — | — | 1 | — | — | — | fine grain: balance | 6 × 13 |
| | C-3 | 6 | — | — | — | 1 | 0.5 | 0.5 | fine grain: balance | 6 × 13 |
| | C-4 | 6.5 | — | — | — | — | 0.3 | 0.3 | fine grain: balance | 10 × 22 |
| | C-5 | 7 | 18 | 4.5 | 0.5 | — | — | — | medium-coarse grain: balance | 10 × 22 |
| | C-6 | 7.5 | — | — | — | — | 0.5 | — | fine grain: balance | 10 × 22 |
| | C-7 | 8 | 20 | 1 | 4 | — | — | — | medium-coarse grain: balance | 20 × 45 |
| | C-8 | 9 | 9 | 1 | 5 | 2 | 3 | — | medium-coarse grain: balance | 20 × 45 |

TABLE 8

| | | Hard metal substrate number | Adhesion bonding layer Set thickness (μm) | | Amorphous carbon based lubricant coating | | | | | | |
|---|---|---|---|---|---|---|---|---|---|---|---|
| Type | | | TiN layer | TiCN layer | Set composition (atomic %) | | | | Set thickness (μm) | Grain diameter of Ti (C, N) crystal (nm) | Cutting length (m) |
| | | | | | W | Ti | N | C+ impurities | | | |
| COATED HARD METAL END MILL OF THE INVENTION | 1 | C-1 | 0.1 | — | 5.0 | 20.0 | 10.0 | balance | 3 | 21.3 | 195 |
| | 2 | C-2 | — | 1.0 | 10.0 | 15.0 | 7.5 | balance | 5 | 7.9 | 210 |
| | 3 | C-3 | 0.5 | 0.5 | 15.0 | 10.0 | 5.0 | balance | 3 | 28.3 | 186 |
| | 4 | C-4 | — | 1.5 | 20.0 | 5.0 | 2.5 | balance | 7 | 11.6 | 223 |
| | 5 | C-5 | 0.5 | 2.0 | 5.0 | 20.0 | 18.0 | balance | 9 | 25.3 | 245 |
| | 6 | C-6 | 0.5 | — | 10.0 | 15.0 | 10.5 | balance | 3 | 17.2 | 192 |
| | 7 | C-7 | 3.0 | — | 15.0 | 10.0 | 9.0 | balance | 9 | 15.8 | 70 |
| | 8 | C-8 | — | 3.0 | 20.0 | 5.0 | 0.5 | balance | 13 | 5.6 | 84 |
| | 9 | C-1 | 0.5 | 1.0 | 10.0 | 0.5 | 10.0 | balance | 5 | 6.3 | 213 |
| | 10 | C-4 | — | 1.5 | 40.0 | 4.0 | 30.0 | balance | 10 | 13.2 | 205 |
| | 11 | C-7 | — | 1.5 | 10.0 | 30.0 | 25.0 | balance | 6 | 37.4 | 64 |

TABLE 9

| | | Hard metal substrate number | Adhesion bonding layer Set thickness (μm) | | Amorphous carbon based lubricant coating | | | | | | | |
|---|---|---|---|---|---|---|---|---|---|---|---|---|
| Type | | | TiN layer | TiCN layer | Set composition (atomic %) | | | | | Set thickness (μm) | Grain diameter of (Ti, Al) (C, N) based crystal (nm) | Cutting length (m) |
| | | | | | W | Ti | Al | N | C+ impurities | | | |
| COATED HARD METAL END MILL OF THE INVENTION | 12 | C-1 | 0.1 | — | 10.0 | 10.0 | 6.7 | 1.5 | balance | 3 | 14.5 | 205 |
| | 13 | C-2 | — | 1.0 | 20.0 | 10.0 | 10.0 | 18.0 | balance | 5 | 9.7 | 221 |
| | 14 | C-3 | 0.5 | 0.5 | 5.0 | 10.0 | 15.0 | 22.5 | balance | 3 | 32.5 | 195 |
| | 15 | C-4 | — | 1.5 | 10.0 | 5.0 | 8.0 | 6.5 | balance | 7 | 13.1 | 234 |
| | 16 | C-5 | 0.5 | 2.0 | 20.0 | 7.5 | 7.5 | 4.5 | balance | 9 | 7.3 | 257 |
| | 17 | C-6 | 0.5 | — | 5.0 | 2.5 | 1.6 | 0.4 | balance | 3 | 18.5 | 202 |
| | 18 | C-7 | 3.0 | — | 10.0 | 4.5 | 5.5 | 0.7 | balance | 9 | 11.6 | 74 |
| | 19 | C-8 | — | 3.0 | 15.0 | 5.5 | 4.5 | 0.6 | balance | 13 | 12.6 | 88 |

TABLE 10

| | | Hard metal substrate number | Adhesion bonding layer Set thickness (μm) | | Amorphous carbon based lubricant coating | | | | | |
|---|---|---|---|---|---|---|---|---|---|---|
| Type | | | TiN layer | TiCN layer | Set composition (atomic %) | | | | Set thickness (μm) | Cutting length (m) |
| | | | | | W | Ti | N | C+ impurities | | |
| COMPARATIVE HARD METAL END MILL | 1 | C-1 | 0.1 | — | 20 | — | — | balance | 3 | 68 |
| | 2 | C-2 | — | 1 | 10 | — | — | balance | 5 | 72 |
| | 3 | C-3 | 0.5 | 0.5 | 5 | — | — | balance | 3 | 66 |
| | 4 | C-4 | — | 1.5 | 5 | — | — | balance | 7 | 80 |
| | 5 | C-5 | 0.5 | 2 | 10 | — | — | balance | 9 | 91 |
| | 6 | C-6 | 0.5 | — | 20 | — | — | balance | 3 | 64 |
| | 7 | C-7 | 3 | — | 15 | — | — | balance | 9 | 29 |
| | 8 | C-8 | — | 3 | 10 | — | — | balance | 13 | 34 |

Example 3

Using the three types of round bar sintered body produced in the above-described Example 2 and having a diameter of 8 mm (for forming hard metal substrates C-1 to C-3), 13 mm (for forming hard metal substrates C-4 to C-6), or 26 mm (for forming hard metal substrates C-7 and C-8), hard metal substrates (drills) D-1 to D-S were produced by grinding the round bars. Each of the hard metal substrates had a two-edge form with an angle of torsion of 30°, and a diameter×length of a flute forming portion of 4 mm×13 mm (hard metal substrates D-1 to D-3), 8 minx 22 mm (hard metal substrates D-4 to D-6), and 16 mm×45 mm(hard metal substrates D-7 and D-8).

Next, cutting edges of the hard metal substrates (drills) D-1 to D-8 were subjected to honing. The hard metal substrates were subjected to ultrasonic cleaning in an acetone bath. After being died, the hard metal substrates were placed in the deposition apparatus shown in FIGS. 2A and 2B or FIGS. 3A and 3B. Under the same conditions as the above-described Example 1, one or both selected from TiN layer and TiCN layer, having a set layer thickness shown in Tables 11 and 12, and an amorphous carbon based lubricant coating having a set composition and thickness shown in Tables 11 and 12 were deposited. By the above-described process, drills 1-19 made of surface-coated hard metal of the invention (hereafter referred to as coated hard metal drills of the invention) were produced as coated hard meta tools of the invention.

In addition, as a comparative example, cutting edges of the hard metal substrates (drills) D-1 to D-8 were subjected to honing. The above-described hard metal substrates were subjected to ultrasonic cleaning in an acetone bath. After drying, the hard metal substrates were placed in a deposition apparatus shown in FIGS. 5A and 5B, under the same conditions as Example 1, one or both of the TiN layer and TiCN layer, having a set layer thickness shown in Table 13, and an amorphous carbon based lubricant coating having a set composition and thickness shown in Table 13 were deposited. By the above-described process, comparative drills 1 to 9, made of surface-coated hard metal (hereafter referred to as comparative coated bar metal drills) were produced as conventional coated hard metal tools.

Next, the above-described coated hard metal drills 1 to 19 of the invention, and comparative coated hard metal drills 1 to 8 were applied to tests of high-speed, wet drilling.

The coated hard metal drills 1 to 3, 9, 12 to 14 of the invention, and comparative coated hard meta drills 1 to 3 were applied to tests of high-speed (compared with normal speed of 120 m/min), wet drilling of an Al alloy under conditions comprising:

workpiece: a plate of JIS A5052 having a plate dimension of 1100 mm×250 mm and a thickness of 50 mm;

drilling speed: 280 m/min;

feed: 0.4 mm/rev; and depth of a hole: 6 mm.

The coated hard metal drills 4 to 6, 10, 15 to 17 of the invention, and comparative coated hard metal drills 4 to 6 were applied to tests of high-speed (compared with normal speed of 110 m/min), wet drilling of a carbon steel under conditions comprising:

workpiece: a plate of JIS-S10C having a plate dimension of 100 mm×250 mm and a thickness of 50 mm;

drilling speed: 250 m/min;

feed: 0.5 mm/rev; and depth of a hole, 12 mm.

The coated hard metal drills 7, 8, 11, 18 and 19 of the invention, and comparative coated hard metal drills 7 and 8 were applied to tests of high-speed (compared with normal speed of 110 m/min), wet drilling of a Cu alloy under conditions comprising:

workpiece: a plate of JIS-C3710 having a plate dimension of 100 mm×250 mm and a thickness of 50 mm;

drilling speed: 250 m/min;

feed: 0.6 mm/rev, and depth of a hole: 20 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 11 to 13.

TABLE 11

| | | | Adhesion bonding layer Set thickness (μm) | | Amorphous carbon based lubricant coating | | | | | | |
|---|---|---|---|---|---|---|---|---|---|---|---|
| | | | | | Set composition (atomic %) | | | | | Grain diameter of | |
| Type | | Hard metal substrate number | TiN layer | TiCN layer | W | Ti | N | C+ impurities | Set thickness (μm) | Ti (C, N) crystal (nm) | Number of drilling (holes) |
| COATED HARD METAL DRILL OF THE INVENTION | 1 | D-1 | 0.5 | — | 5.0 | 5.0 | 0.5 | balance | 3 | 13.7 | 6928 |
| | 2 | D-2 | — | 3.0 | 15.0 | 15.0 | 7.5 | balance | 5 | 7.3 | 9105 |
| | 3 | D-3 | 1.0 | 1.5 | 20.0 | 20.0 | 18.0 | balance | 7 | 29.9 | 9633 |
| | 4 | D-4 | — | 2.0 | 5.0 | 20.0 | 14.0 | balance | 7 | 21.6 | 2405 |
| | 5 | D-5 | 0.1 | 2.9 | 10.0 | 15.0 | 4.5 | balance | 9 | 12.7 | 2620 |
| | 6 | D-6 | 3.0 | — | 15.0 | 10.0 | 0.1 | balance | 3 | 17.6 | 1840 |
| | 7 | D-7 | 2.0 | — | 10.0 | 15.0 | 10.5 | balance | 6 | 15.3 | 3133 |
| | 8 | D-8 | — | 1.0 | 20.0 | 5.0 | 1.5 | balance | 13 | 5.7 | 3892 |
| | 9 | D-2 | 1.3 | 1.0 | 10.0 | 0.5 | 10.0 | balance | 5 | 5.9 | 9708 |
| | 10 | D-5 | — | 1.3 | 40.0 | 4.0 | 30.0 | balance | 10 | 14.7 | 2537 |
| | 11 | D-8 | 1.5 | — | 10.0 | 30.0 | 25.0 | balance | 6 | 35.9 | 3794 |

TABLE 12

| | | | Adhesion bonding layer Set thickness (μm) | | Amorphous carbon based lubricant coating | | | | | | | |
|---|---|---|---|---|---|---|---|---|---|---|---|---|
| | | | | | Set composition (atomic %) | | | | | | Grain diameter of | |
| Type | | Hard metal substrate number | TiN layer | TiCN layer | W | Ti | Al | N | C+ impurities | Set thickness (μm) | (Ti, Al) (C, N) crystal (nm) | Number of drilling (holes) |
| COATED HARD METAL DRILL OF THE INVENTION | 12 | D-1 | 0.5 | — | 5.0 | 10.0 | 15.0 | 22.5 | balance | 3 | 14.1 | 9374 |
| | 13 | D-2 | — | 3.0 | 10.0 | 10.0 | 10.0 | 14.0 | balance | 5 | 16.4 | 9560 |
| | 14 | D-3 | 1.0 | 1.5 | 15.0 | 10.0 | 6.7 | 8.3 | balance | 7 | 8.5 | 10112 |

TABLE 12-continued

| | | Adhesion bonding layer Set thickness (μm) | | Amorphous carbon based lubricant coating | | | | | | |
|---|---|---|---|---|---|---|---|---|---|---|
| | | | | Set composition (atomic %) | | | | | Grain diameter of | Number of |
| Type | Hard metal substrate number | TiN layer | TiCN layer | W | Ti | Al | N | C+ impurities | Set thickness (μm) | (Ti, Al) (C, N) crystal (nm) | drilling (holes) |
| | 15 | D-4 | — | 2.0 | 10.0 | 5.0 | 8.0 | 3.9 | balance | 7 | 26.2 | 2521 |
| | 16 | D-5 | 0.1 | 2.9 | 15.0 | 7.6 | 7.5 | 9.0 | balance | 9 | 21.4 | 2748 |
| | 17 | D-6 | 3.0 | — | 20.0 | 2.5 | 1.6 | 0.4 | balance | 3 | 15.7 | 1928 |
| | 18 | D-7 | 2.0 | — | 16.0 | 4.5 | 5.5 | 4.0 | balance | 6 | 10.8 | 3265 |
| | 19 | D-8 | — | 1.0 | 10.0 | 5.5 | 4.5 | 7.0 | balance | 13 | 27.6 | 3993 |

TABLE 13

| | | Adhesion bonding layer Set thickness (μm) | | Amorphous carbon based lubricant coating | | | | | |
|---|---|---|---|---|---|---|---|---|---|
| | | | | Set composition (atomic %) | | | | | |
| Type | Hard metal substrate number | TiN layer | TiCN layer | W | Ti | N | C+ impurities | Set thickness (μm) | Number of drilling (holes) |
| COMPARATIVE COATED HARD METAL DRILL | 1 | D-1 | 0.5 | — | 5 | — | — | balance | 3 | 3839 |
| | 2 | D-2 | — | 3 | 15 | — | — | balance | 5 | 4003 |
| | 3 | D-3 | 1 | 1.5 | 20 | — | — | balance | 7 | 4142 |
| | 4 | D-4 | — | 2 | 5 | — | — | balance | 7 | 962 |
| | 5 | D-5 | 0.1 | 2.9 | 10 | — | — | balance | 9 | 1074 |
| | 6 | D-6 | 3 | — | 15 | — | — | balance | 3 | 968 |
| | 7 | D-7 | 2 | — | 10 | — | — | balance | 6 | 1691 |
| | 8 | D-8 | — | 1 | 20 | — | — | balance | 13 | 1984 |

As described above, coated hard metal inserts 1, 1' to 42, 42' of the invention, coated hard metal end mills 1 to 19 of the invention, and coated hard metal end mills 1 to 19 of the invention as hard metal tools of the invention, and comparative hard metal inserts 1, 1' to 16, 16', comparative coated hard metal end mills 1 to 8, and comparative hard metal drills 1 to 8, as conventional coated hard metal tools were obtained. In each of the above-described coated cutting tools, a composition of an amorphous carbon based lubricant coating was analyzed by an Auger electron spectrometer, and a thickness of the coating was measured using a scanning electron microscope. As a result, the composition and average thickness (average value measured from 5 points in a section) of the coating were substantially similar to the set composition and set thickness. In addition, an observation of the texture of the coating using a transmission electron microscope showed that the coated hard metal tools of the invention had a texture in which fine grained crystals of Ti(C,N) based compounds were dispersively distributed in the matrix of a carbon based amorphous material, while the conventional coated hard metal tools showed a texture composed of a single phase of a carbon based amorphous material.

As shown in the results listed in Tables 3 to 13, in the coated hard metal tools of the invention having a texture in which fine grains of crystalline Ti(C,N) based compounds were dispersively distributed in the matrix of a carbon based amorphous material, each tool showed excellent wear resistance even in the case of high-speed cutting of Al alloy, a Cu alloy or a steel. On the other hand, in the conventional coated hard metal tools (comparative coated hard metal tool) having an amorphous carbon based lubricant coating composed of a single phase texture of carbon based amorphous material, the amorphous carbon based lubricant coating obviously showed extremely rapid progress of wear and reached an end of working lifetime within a relatively short time period under high-speed cutting conditions.

Example 4

As constituent powders, WC powder, TiC powder, VC powder, TaC powder, NbC powder, $Cr_3C_2$ powder, and Co powder, all of which had an average grain diameter in a range of 0.7 to 3 μm were prepared. These constituent powders were mixed in accordance with the compounding ratios presented in table 14, and blended under wet conditions using a ball mill for 84 hours. After being dried, the mixed powders were press-molded into compacts under a pressure of 100 MPa. The compacts were held under vacuum conditions of 6 Pa at a temperature of 1400° C. for 1 hour so as to be sintered. Thus, materials respectively composed of WC based cemented carbide were produced as a raw material for a hard metal substrate for cutting carbon steel, and a raw material for a hard metal substrate for cutting Al alloy and Cu alloy. By shaping the cutting edges by honing of R:0.03, the above-described raw material for hard metal substrate for carbon steel cutting was shaped to hard metal substrates A-1 to A-10 having a geometrical configuration of an insert meeting ISO standard: TNMG 160408. By grinding the above-described raw materials for hard metal substrates for Al alloy cutting, and for Cu alloy cutting were shaped to hard metal substrates A-1' to A-10' having a geometrical configuration of an insert meeting ISO standard: TEGX 160304R.

In addition, as constituent powders, TiCN powder (TiC/TiN=50/50 by weight ration), $Mo_2C$ powder, ZrC powder, NbC powder, TaC powder, WC powder, Co powder and Ni powder, all of which had an average g diameter in a range from 0.5 to 2 μm were prepared. These constituent powders were mixed in accordance with the compounding ratios presented in Table 15, and wet blended for 80 hours by a ball mill. After being dried, under a pressure of 100 MPa, the mixed powder was press-molded into compacts. The compacts were sintered by being maintained at a temperature: 1510° C. for one 1 hour in a nitrogen atmosphere of 2 kPa. Thus, raw materials respectively composed of TiCN-based cermet were produced as a material for a hard metal substrate for carbon steel cutting and a material for a hard metal substrate for cutting Al alloy and Cu alloy. By shaping the cutting edges by honing of R:0.03, the above-described raw material for a hard metal substrate for carbon steel cutting was shaped to hard metal substrates B-1 to B-6 each having a geometrical configuration of an insert meeting ISO standard TNMG 160408. By grinding, the above-described raw materials for hard metal substrates for Al alloy cutting, and for Cu alloy cutting were shaped to hard metal substrates B-1' to B-6' each having a geometrical configuration of an insert meeting ISO standard: TEGX 160304R.

Next, the above-described hard metal substrates of A-1' to A-10, 10', and B-1, 1' to B-6, 6' were subjected to ultrasonic cleaning in an acetone bath. After being dried, the hard metal substrates were placed on a rotation table of a deposition apparatus shown in FIGS. 2A and 2B such that a plurality of the substrates formed a ring-like arrangement radially distant from the center axis of the table by a predetermined distance. A Ti target of purity: 99.6% by weight was placed as a cathode (evaporation source) of a magnetron sputtering device on one side, and a WC target of purity: 99.6% by weight was placed as a cathode (evaporation source) of a magnetron sputtering device on the opposite side. In addition, at a position orthogonal to the two above-described cathodes, a Ti—Al alloy target of a predetermined composition was placed as a cathode (evaporation source) of a magnetron sputtering device for formation of an adhesion bonding layer comprising a (Ti, Al)N layer.

(a) Firstly, while maintaining the interior of the apparatus under a vacuum condition of 0.01 Pa, the interior of the apparatus was heated to 200° C. After that, an Ar gas was introduced into the apparatus to obtain an Ar atmosphere of 0.5 Pa. In that state, by applying a bias voltage of −810V, the hard metal substrate revolving and rotating on the rotation table were subjected to Ar gas bombardment cleaning for 20 minutes.

(b) Next, magnetic coils of all of the magnetron sputtering devices in the apparatus were respectively applied with a voltage: 50V and a current: 10 A, and a magnetic field was generated to have a flux density of 140 G (Gauss) at the placing positions of the hard metal substrates. Heating temperature of the interior of the deposition apparatus was maintained at 400° C. In that state, nitrogen and Ar were introduced into the apparatus as a reaction gas in a proportion of nitrogen flow rate: 300 sccm and Ar flow rate: 200 sccm to obtain a reaction atmosphere of 1 Pa, being composed of a mixed gas of nitrogen and Ar. In the reaction atmosphere, the cathode (evaporation source) of Ti—Al target was applied with an electric power for sputtering of 12 kW (frequency: 40 kHz), and the above-described hard metal substrates were applied with a bias voltage of −70V. Under that conditions, by the generation of a glow discharge, on the surface of each of the above-described hard metal substrates, an adhesion bonding layer composed of a (Ti, Al)N layer having a set thickness listed in Tables 16 and 17 was deposited.

(c) The above-described magnetic coils were subjected to predetermined conditions within a range of electric voltage: 50 to 100 V and a current; 10 to 20 A, the magnetic flux density at the placing positions of the hard metal substrates was controlled to a predetermined value within a range of magnetic flux density: 100 to 3000 (Gauss). While maintaining the interior of the apparatus at a heating temperature of 400° C. and the hard metal substrate being applied with a bias voltage of −100V, as a reaction gas, $C_2H_2$ (hydrocarbon), nitrogen and Ar were introduced into the apparatus at predetermined flow rates within ranges of $C_2H_2$ flow rate: 25 to 100 sccm, nitrogen flow rate: 200 to 300 sccm, and Ar flow rate: 150 to 250 sccm to obtain a reaction atmosphere of 1 Pa, being composed of a mixed gas of resolved gas of $C7H_2$, nitrogen and Ar. In the above-described pair of magnetron sputtering devices, the cathode (evaporation source) of WC target was applied with a predetermined electric power for sputtering within a range of e.g., output: 1 to 3 kW (frequency: 40 kHz). At the same time, the Ti target was applied with a predetermined electric power for sputtering within a range of output: 3 to 8 kW (frequency: 40 kHz). Under the above-described conditions, the substrates were deposited with an amorphous carbon based lubricant coating respectively having a set composition and a set layer thickness listed in Table 16. By the above-described process, inserts 1, 1' to 26, 26' made of surface-coated hard metal of the invention (hereafter referred to as coated hard metal inserts of the invention) were produced as coated hard metal tools of the invention.

In addition, the above-described hard metal substrates of A-1, 1' to A-10, 10', and B-1, 1' to B-6, 6' were subjected to ultrasonic cleaning in an acetone bath. After drying, the hard metal substrates were placed on a rotation table of a deposition apparatus shown in FIGS. 3A and 3B such that a plurality of the substrates formed a ring-like arrangement radially distant from the center axis of the table by a predetermined distance. A Ti—Al alloy target of a predetermined composition was placed as a cathode (evaporation source) of a magnetron sputtering device on one side, and a WC target of purity: 99.6% by weight was placed as a cathode (evaporation source) of a magnetron sputtering device on the opposite side. In addition, at a position orthogonal to the two above-described cathodes, a Ti target of a purity: 99.9% by weight was placed as a cathode (evaporation source) of a magnetron sputtering device for formation of an adhesion bonding layer comprising one or both of a Ti layer and a TiCN layer.

(a) Firstly, while maintaining the interior of the apparatus under a vacuum condition of 0.01 Pa, the interior of the apparatus was heated to 200° C. After that an Ar gas was introduced into the apparatus to obtain an Ar atmosphere of 0.5 Pa. In that state, by applying a bias voltage of −810V, the hard metal substrate revolving and rotating on the rotation table were subjected to Ar gas bombardment cleaning for 20 minutes.

(b) Next, magnetic coils of all of the magnetron sputtering devices of the deposition apparatus were respectively applied with a voltage: 50V and a current: 10 A, and a magnetic field was generated to have a flux density of 140 G (Gauss) at the placing positions of the hard metal substrates. Heating temperature of the interior of the deposition apparatus was maintained at 400° C. In that state, as a reaction gas, nitrogen and Ar were introduced into the apparatus in a proportion of nitrogen flow rate: 300 sccm and Ar flow rate: 200 scorn to obtain a reaction atmosphere of 1 Pa, being composed of a mixed gas of nitrogen and Ar. In the reaction atmosphere, the cathode (evaporation source) of Ti—Al alloy target was applied with an electric power for sputtering of 12 kW (frequency: 40 kHz), and the above-described hard metal substrates were applied with a bias voltage of −70V. Under that conditions, by the generation of a glow discharge, on the surface of each of the above-described hard metal substrates, an adhesion bonding layer composed of a (Ti, Al)N layer having a set thickness listed in Tables 16 and 17 was deposited.

(c) The above-described magnetic coils were subjected to predetermined conditions within a range of electric voltage: 50 to 100V, and a current: 10 to 20 A. The magnetic flux at the placing positions of the hard metal substrates was controlled to a predetermined value within a range of magnetic flux: 100 to 3000 (Gauss). While maintaining the interior of the apparatus at a heating temperature of 400° C. and the hard metal substrate being applied with a bias voltage of −70V, as a reaction gas, $C_2H_2$, nitrogen and Ar were introduced into the apparatus at predetermined flow rates within ranges of $C_2H_2$ flow rate: 25 to 100 sccm, nitrogen flow rate: 200 to 300 sccm, and Ar flow rate; 150 to 250 scorn to obtain a reaction atmosphere of 1 Pa, being composed of a mixed gas of resolved gas of $C_2H_2$, nitrogen and Ar. In the above-described pair of magnetron sputtering devices, the cathode (evaporation source) of WC target was applied with a predetermined electric power for sputtering within a range of e.g., output: 1 to 3 kW(frequency: 40 kHz). At the same time, the Ti—Al alloy target was applied with an electric power for sputtering within a predetermined range of output: 3 to 8 kW (frequency: 40 kHz). Under the above-described conditions, the substrates were deposited with lubricant coatings of amorphous carbon respectively having a set composition and a set layer thickness listed in Table 17. By the above-described process, inserts 27, 27' to 42, 42' made of surface-coated hard metal of the invention (hereafter referred to as coated hard metal inserts of the invention) were produced as coated hard metal tools of the invention.

In addition, surfaces of the above-described hard metal substrates of A-1, 1' to A-10, 10', and B-1, 1' to B-6, 6' were subjected to ultrasonic cleaning in an acetone bath. With a purpose to obtain a comparative data, a deposition apparatus shown in FIGS. 5A and 5B was used. The apparatus comprised a counter arrangement of a sputtering device equipped with a Ti target as a cathode (evaporation source) and a sputtering device equipped with a WC target as a cathode (evaporation source). The hard metal substrates were placed on a rotation table in the deposition apparatus such that a plurality of the substrates formed a ring-like arrangement with a predetermined radial distance from the center axis of the table.

(a) Firstly, while maintaining the interior of the apparatus under a vacuum condition of 0.01 Pa by evacuation, the interior of the apparatus was heated to 200° C. After that, an Ar gas was introduced into the apparatus to obtain an Ar atmosphere of 0.5 Pa. In that state, by applying a bias voltage of −800V, the hard metal substrate revolving and rotating on the rotation table were subjected to Ar gas bombardment cleaning for 20 minutes.

(b) Next, heating temperature of the interior of the deposition apparatus was maintained at 300° C. In that state, as a reaction gas, nitrogen and Ar were introduced into the apparatus in a proportion of nitrogen flow rate: 200 sccm and Ar flow rate: 300 sccm to obtain a reaction atmosphere of 1 Pa, being composed of a mixed gas of nitrogen and Ar. In the reaction atmosphere, the cathode (evaporation source) of the Ti target was applied with an electric power for sputtering of 12 kW(frequency: 40 kHz), and the above-described hard metal substrates were applied with a bias voltage of −100 V. Under that conditions, by the generation of a glow discharge, on the surface of each of the above-described hard metal substrates, an adhesion bonding layer composed of a TiN layer having a set thickness listed in Table 18 was deposited.

(c) Next while maintaining the interior of the apparatus at a heating temperate of 200° C., as a reaction gas, $C_2H_2$ and Ar were introduced into the apparatus at predetermined flow rates within ranges of $C_2H_2$ flow rate: 40 to 80 sccm, and Ar flow rate: 250 sccm to obtain a reaction atmosphere of 1 Pa, being composed of a mixed gas of resolved gas of $C_2H_2$ and Ar. At the same time, the above-described hard metal substrates were applied with a bias voltage of −20V, and the cathode (evaporation source) of WC target was applied with a predetermined electric power for sputtering within a range of output: 4 to 6 kW (frequency: 40 kHz). Under the above-described conditions, on the above-described adhesion bonding layers, the substrates were deposited with an amorphous carbon based lubricant coating respectively having a set composition and a set layer thickness listed in Table 18. By the above-described process, comparative inserts 1, 1' to 16, 16' made of surface-coated hard metal of the invention were produced as conventional coated hard metal tools.

Next, the above-described coated hard metal inserts 1, 1' to 42, 42' of the invention, and comparative coated hard metal inserts 1, 1' to 16, 16' were respectively screw-mounted with a fixture-jig on an end of a bit made of a tool steel, and were applied to the following tests of high-speed dry cutting.

Cutting tests of a carbon steel were carried out under high-speed (compared with normal cutting speed of 120 m/min), dry cutting conditions (cutting condition A) comprising:

workpiece: a round bar of JIS-S10C;

cutting speed: 360 m/min;

depth of cut: 1.2 mm;

feed: 0.2 mm/rev; and cutting time: 5 minutes.

Cutting tests of an Al alloy were carried out under high-speed (compared with normal cutting speed of 400 m/min), dry cutting conditions (cutting condition B) comprising:

workpiece: a round bar of JIS-A5052;

cutting speed: 1050 m/min;

depth of cut: 1.2 mm;

feed: 0.3 mm/rev; and cutting time: 20 minutes.

In addition, cutting tests of an Cu alloy were carried out under high-speed (compared with normal cutting speed of 200 m/min), dry cutting conditions (cutting condition C) comprising:

workpiece; a round bar of JIS-C7310;

cutting speed: 450 m/min;

depth of cut: 1.4 mm;

feed: 0.27 mm/rev; and cutting time: 20 minutes.

In each of the cutting tests, widths of flank wear of the cutting edge were measured. The results of the measurements are listed in Tables 16 to 18.

TABLE 14

| Type | | Composition (% by weight) | | | | | | |
|---|---|---|---|---|---|---|---|---|
| | | Co | TiC | TaC | NbC | VC | $Cr_3C_2$ | WC |
| HARD METAL SUBSTRATE (INSERT) | A-1, 1' | 5 | — | 0.9 | 0.1 | — | — | balance |
| | A-2, 2' | 5.5 | — | 1.6 | 0.2 | — | — | balance |
| | A-3, 3' | 6 | — | — | — | — | 0.2 | balance |
| | A-4, 4' | 6.5 | — | — | — | 0.2 | — | balance |
| | A-5, 5' | 7 | — | — | — | 0.2 | 0.2 | balance |
| | A-6, 6' | 7.5 | — | — | 2 | — | — | balance |
| | A-7, 7' | 8 | — | 1 | — | — | 0.5 | balance |
| | A-8, 8' | 8.5 | 6 | — | 3 | — | — | balance |
| | A-9, 9' | 9 | 1 | 1 | 1 | — | — | balance |
| | A-10, 10' | 9.5 | 1 | — | 1 | — | 0.5 | balance |

TABLE 15

| Type | | Composition (% by weight) | | | | | | | |
|---|---|---|---|---|---|---|---|---|---|
| | | Co | Ni | ZrC | TaC | NbC | $Mo_2C$ | WC | TiCN |
| HARD METAL SUBSTRATE (INSERT) | B-1, 1' | 13 | 4.5 | — | 10 | — | 10 | 15 | balance |
| | B-2, 2' | 8 | 6 | — | 5 | — | 8 | — | balance |
| | B-3, 3' | 7 | — | — | — | — | 6 | 12 | balance |
| | B-4, 4' | 10 | 4.5 | — | 7 | 6 | — | — | balance |
| | B-5, 5' | 8 | 4 | 1 | 8 | — | 10 | 11 | balance |
| | B-6, 6' | 10 | 5.5 | — | 10 | — | 9.5 | 15 | balance |

TABLE 16

| Type | | Hard metal substrate number | Adhesion bonding layer | | | | Amorphous carbon based lubricant coating | | | | | | Grain diameter of Ti (C, N) based crystal (nm) | Width of flank wear (μm) | | |
|---|---|---|---|---|---|---|---|---|---|---|---|---|---|---|---|---|
| | | | Set composition (atomic %) | | | Set thick (μm) | Set composition (atomic %) | | | | | Set thick (μm) | | Cutting condition A | Cutting condition B | Cutting condition C |
| | | | Ti | Al | N | | W | Ti | N | C+ impurities | | | | | | |
| COATED HARD METAL INSERT OF THE INVENTION | 1, 1' | A-1, 1' | 0.60 | 0.40 | 1.00 | 0.5 | 5.0 | 20.0 | 10.0 | balance | 1.0 | 37.8 | 0.22 | 0.15 | 0.15 |
| | 2, 2' | A-2, 2' | 0.55 | 0.45 | 1.00 | 2.0 | 10.0 | 15.0 | 7.5 | balance | 3.0 | 22.5 | 0.2 | 0.13 | 0.12 |
| | 3, 3' | A-3, 3' | 0.50 | 0.50 | 1.00 | 3.0 | 15.0 | 10.0 | 5.0 | balance | 5.0 | 21.5 | 0.18 | 0.11 | 0.11 |
| | 4, 4' | A-4, 4' | 0.45 | 0.55 | 1.00 | 1.5 | 20.0 | 5.0 | 2.5 | balance | 7.0 | 8.3 | 0.15 | 0.06 | 0.08 |
| | 5, 5' | A-5, 5' | 0.40 | 0.60 | 1.00 | 0.1 | 5.0 | 20.0 | 18.0 | balance | 9.0 | 8.1 | 0.25 | 0.17 | 0.17 |
| | 6, 6' | A-6, 6' | 0.60 | 0.40 | 1.00 | 1.0 | 10.0 | 15.0 | 10.5 | balance | 13.0 | 6.4 | 0.23 | 0.15 | 0.15 |
| | 7, 7' | A-7, 7' | 0.55 | 0.45 | 1.00 | 2.5 | 15.0 | 10.0 | 9.0 | balance | 3.0 | 34.0 | 0.2 | 0.12 | 0.1 |
| | 8, 8' | A-8, 8' | 0.50 | 0.50 | 1.00 | 1.5 | 20.0 | 5.0 | 0.5 | balance | 5.0 | 19.8 | 0.16 | 0.09 | 0.09 |
| | 9, 9' | A-9, 9' | 0.45 | 0.55 | 1.00 | 2.0 | 10.0 | 10.0 | 3.0 | balance | 7.0 | 17.2 | 0.14 | 0.06 | 0.08 |
| | 10, 10' | A-10, 10' | 0.40 | 0.60 | 1.00 | 3.0 | 15.0 | 15.0 | 1.5 | balance | 9.0 | 8.7 | 0.1 | 0.04 | 0.04 |
| | 11, 11' | A-1, 1' | 0.60 | 0.40 | 1.00 | 2.0 | 5.0 | 20.0 | 18.0 | balance | 9.0 | 29.5 | 0.21 | 0.11 | 0.09 |
| | 12, 12' | A-3, 3' | 0.55 | 0.45 | 1.00 | 3.0 | 10.0 | 30.0 | 25.0 | balance | 6.0 | 14.9 | 0.18 | 0.13 | 0.09 |
| | 13, 13' | A-5, 5' | 0.50 | 0.50 | 1.00 | 1.5 | 20.0 | 20.0 | 16.5 | balance | 4.0 | 12.5 | 0.18 | 0.15 | 0.07 |
| | 14, 14' | A-7, 7' | 0.45 | 0.55 | 1.00 | 1.0 | 10.0 | 0.5 | 10.0 | balance | 5.0 | 7.4 | 0.32 | 0.03 | 0.04 |
| | 15, 15' | A-9, 9' | 0.40 | 0.60 | 1.00 | 2.5 | 40.0 | 4.0 | 30.0 | balance | 10.0 | 4.8 | 0.07 | 0.19 | 0.23 |
| | 16, 16' | B-1, 1' | 0.60 | 0.40 | 1.00 | 3.0 | 5.0 | 5.0 | 2.5 | balance | 9.0 | 9.4 | 0.12 | 0.06 | 0.05 |
| | 17, 17' | B-2, 2' | 0.55 | 0.45 | 1.00 | 2.0 | 10.0 | 10.0 | 5.0 | balance | 7.0 | 12.7 | 0.14 | 0.08 | 0.07 |
| | 18, 18' | B-3, 3' | 0.50 | 0.50 | 1.00 | 1.5 | 15.0 | 15.0 | 7.5 | balance | 3.0 | 27.1 | 0.17 | 0.1 | 0.11 |
| | 19, 19' | B-4, 4' | 0.45 | 0.55 | 1.00 | 1.0 | 20.0 | 20.0 | 10.0 | balance | 13.0 | 7.9 | 0.2 | 0.13 | 0.13 |
| | 20, 20' | B-5, 5' | 0.40 | 0.60 | 1.00 | 0.5 | 10.0 | 15.0 | 13.5 | balance | 1.0 | 34.5 | 0.24 | 0.16 | 0.16 |
| | 21, 21' | B-6, 6' | 0.50 | 0.50 | 1.00 | 0.1 | 15.0 | 10.0 | 10.0 | balance | 5.0 | 20.3 | 0.25 | 0.17 | 0.18 |
| | 22, 22' | B-1, 1' | 0.40 | 0.60 | 1.00 | 2.5 | 5.0 | 20.0 | 18.0 | balance | 9.0 | 16.4 | 0.18 | 0.1 | 0.11 |
| | 23, 23' | B-3, 3' | 0.60 | 0.40 | 1.00 | 3.0 | 10.0 | 30.0 | 25.0 | balance | 6.0 | 6.2 | 0.13 | 0.07 | 0.09 |
| | 24, 24' | B-4, 4' | 0.55 | 0.45 | 1.00 | 2.0 | 20.0 | 20.0 | 16.5 | balance | 4.0 | 22.1 | 0.19 | 0.14 | 0.09 |
| | 25, 25' | B-5, 5' | 0.50 | 0.50 | 1.00 | 1.5 | 10.0 | 0.5 | 10.0 | balance | 5.0 | 37.4 | 0.25 | 0.04 | 0.04 |
| | 26, 26' | B-6, 6' | 0.45 | 0.55 | 1.00 | 1.0 | 40.0 | 4.0 | 30.0 | balance | 10.0 | 5.8 | 0.08 | 0.21 | 0.2 |

Set thick: Set thickness

TABLE 17

| Type | Hard metal substrate number | Adhesion bonding layer Set composition (atomic %) | | | Set thick (μm) | Amorphous carbon based lubricant coating Set composition (atomic %) | | | | | Set thick (μm) | Grain diameter of (Ti, Al) (C, N) based crystal (nm) | Width of flank wear (mm) | | |
|---|---|---|---|---|---|---|---|---|---|---|---|---|---|---|---|
| | | Ti | Al | N | | W | Ti | N | Al | C+ impurities | | | Cut cond. A | Cut cond. B | Cut cond. C |
| COATED HARD METAL INSERT OF THE INVENTION | 27, 27' A-1, 1' | 0.60 | 0.40 | 1.00 | 0.5 | 5.0 | 10.0 | 15.0 | 22.5 | balance | 3.0 | 33.6 | 0.22 | 0.15 | 0.15 |
| | 28, 28' A-2, 2' | 0.55 | 0.45 | 1.00 | 2.0 | 10.0 | 8.0 | 12.0 | 12.0 | balance | 5.0 | 25.8 | 0.2 | 0.13 | 0.12 |
| | 29, 29' A-3, 3' | 0.50 | 0.50 | 1.00 | 3.0 | 15.0 | 4.0 | 6.0 | 3.0 | balance | 7.0 | 23.0 | 0.19 | 0.11 | 0.11 |
| | 30, 30' A-4, 4' | 0.45 | 0.55 | 1.00 | 1.5 | 20.0 | 10.0 | 15.0 | 2.5 | balance | 9.0 | 12.2 | 0.15 | 0.08 | 0.08 |
| | 31, 31' A-5, 5' | 0.40 | 0.60 | 1.00 | 0.1 | 5.0 | 10.0 | 10.0 | 18.0 | balance | 1.0 | 8.7 | 0.25 | 0.17 | 0.17 |
| | 32, 32' A-6, 6' | 0.60 | 0.40 | 1.00 | 1.0 | 10.0 | 7.5 | 7.5 | 13.5 | balance | 3.0 | 5.3 | 0.23 | 0.15 | 0.15 |
| | 33, 33' A-7, 7' | 0.55 | 0.45 | 1.00 | 2.5 | 15.0 | 5.0 | 5.0 | 3.0 | balance | 5.0 | 29.8 | 0.2 | 0.12 | 0.1 |
| | 34, 34' A-8, 8' | 0.50 | 0.50 | 1.00 | 1.6 | 20.0 | 2.5 | 2.5 | 0.5 | balance | 7.0 | 26.4 | 0.16 | 0.09 | 0.09 |
| | 35, 35' A-9, 9' | 0.45 | 0.55 | 1.00 | 2.0 | 5.0 | 2.5 | 1.6 | 0.4 | balance | 9.0 | 17.3 | 0.14 | 0.05 | 0.08 |
| | 36, 36' A-10, 10' | 0.40 | 0.60 | 1.00 | 3.0 | 10.0 | 6.0 | 4.0 | 6.0 | balance | 13.0 | 14.8 | 0.1 | 0.04 | 0.04 |
| | 37, 37' B-1, 1' | 0.60 | 0.40 | 1.00 | 3.0 | 15.0 | 10.0 | 6.7 | 5.0 | balance | 13.0 | 9.7 | 0.12 | 0.06 | 0.05 |
| | 38, 38' B-2, 2' | 0.55 | 0.45 | 1.00 | 2.0 | 20.0 | 2.5 | 1.6 | 3.7 | balance | 9.0 | 12.5 | 0.14 | 0.08 | 0.07 |
| | 39, 39' B-3, 3' | 0.50 | 0.50 | 1.00 | 1.5 | 5.0 | 10.0 | 10.0 | 10.0 | balance | 7.0 | 22.1 | 0.17 | 0.1 | 0.11 |
| | 40, 40' B-4, 4' | 0.45 | 0.55 | 1.00 | 1.0 | 10.0 | 7.5 | 7.5 | 7.6 | balance | 5.0 | 6.5 | 0.2 | 0.13 | 0.13 |
| | 41, 41' B-5, 5' | 0.40 | 0.60 | 1.00 | 0.5 | 15.0 | 5.0 | 5.0 | 5.0 | balance | 3.0 | 39.4 | 0.24 | 0.16 | 0.16 |
| | 42, 42' B-6, 6' | 0.50 | 0.50 | 1.00 | 0.1 | 20.0 | 7.5 | 7.5 | 7.5 | balance | 1.0 | 19.6 | 0.25 | 0.17 | 0.18 |

Set thick: Set thickness,
Cut cond.: Cutting condition

TABLE 18

| Type | Hard metal substrate number | Set thickness of TiN layer (μm) | Amorphous carbon based lubricant coating Set composition (atomic %) | | | | Set thickness (μm) | Width of flank wear (mm) | | |
|---|---|---|---|---|---|---|---|---|---|---|
| | | | W | Ti | Al | N | C+ impurities | | Cutting condition A | Cutting condition B | Cutting condition C |
| COMPARATIVE HARD METAL INSERT | 1, 1' A-1, 1' | 0.5 | 5.0 | — | — | — | balance | 3.0 | 0.80 | 0.76 | 0.75 |
| | 2, 2' A-2, 2' | 2.0 | 10.0 | — | — | — | balance | 5.0 | 0.77 | 0.72 | 0.71 |
| | 3, 3' A-3, 3' | 3.0 | 15.0 | — | — | — | balance | 7.0 | 0.73 | 0.69 | 0.68 |
| | 4, 4' A-4, 4' | 1.5 | 20.0 | — | — | — | balance | 9.0 | 0.71 | 0.88 | 0.55 |
| | 5, 5' A-5, 5' | 0.1 | 5.0 | — | — | — | balance | 1.0 | 0.83 | 0.78 | 0.77 |
| | 6, 6' A-6, 6' | 1.0 | 10.0 | — | — | — | balance | 3.0 | 0.79 | 0.75 | 0.74 |
| | 7, 7' A-7, 7' | 2.5 | 15.0 | — | — | — | balance | 5.0 | 0.76 | 0.72 | 0.72 |
| | 8, 8' A-8, 8' | 1.5 | 20.0 | — | — | — | balance | 7.0 | 0.72 | 0.70 | 0.69 |
| | 9, 9' A-9, 9' | 2.0 | 5.0 | — | — | — | balance | 9.0 | 0.69 | 0.67 | 0.68 |
| | 10, 10' A-10, 10' | 3.0 | 10.0 | — | — | — | balance | 13.0 | 0.64 | 0.61 | 0.59 |
| | 11, 11' B-1, 1' | 3.0 | 15.0 | — | — | — | balance | 13.0 | 0.65 | 0.62 | 0.60 |
| | 12, 12' B-2, 2' | 2.0 | 20.0 | — | — | — | balance | 9.0 | 0.70 | 0.67 | 0.67 |
| | 13, 13' B-3, 3' | 1.5 | 5.0 | — | — | — | balance | 7.0 | 0.74 | 0.71 | 0.70 |
| | 14, 14' B-4, 4' | 1.0 | 10.0 | — | — | — | balance | 5.0 | 0.76 | 0.73 | 0.73 |
| | 15, 15' B-5, 5' | 0.5 | 15.0 | — | — | — | balance | 3.0 | 0.80 | 0.74 | 0.74 |
| | 16, 16' B-6, 6' | 0.1 | 20.0 | — | — | — | balance | 1.0 | 0.83 | 0.78 | 0.77 |

Example 5

As constituent powders, medium to coarse grained WC powder having an average grain diameter of 4.2 μm, fine grained WC powder of average grain diameter: 0.7 μm, TaC powder of average grain diameter: 1.2 μm, NbC powder of average grain diameter: 1.1 μm, ZrC powder of average grain diameter: 1.1 μm, $Cr_3C_2$ powder of average grain diameter: 1.6 μm, VC powder of average grain diameter: 1.4 μm, (Ti, W)C (TiC/WC=50/50 in weight ratio) powder of average grain diameter: 1.1 μm, and Co powder of average grain diameter: 1.8 μm were prepared. These constituent powders were mixed in accordance with the compounding ratios presented in Table 19, added to wax and blended for 70 hours in acetone by a ball mill. After vacuum drying the mixed powder, the mixed powder was press-molded under a pressure of 100 MPa into various compacts each of which having a predetermined form. The compacts were sintered under conditions including: a vacuum condition of 6 Pa, heating the compacts at a heating rate of 7° C./minute to a predetermined temperate within a range of 1375 to 1475° C., maintaining the compacts at that predetermined temperature for 1 hour, and furnace cooling the compacts. Thus, three types of round bar sintered bodies for forming a hard metal substrate, respectively having a diameter of 8 mm, 13 mm, or 26 mm were formed. By grinding the three yes of sintered round bars, hard metal substrates (end mill) C-1 to C-8 were produced so as to have a four edge square form with an angle of torsion of 30°, and diameter×length of the cutting edge of 6 mm, 13 mm, 10 mm×22 mm, or 20 mm×45 mm.

Next, these hard metal substrates (end mills) C-1 to C-8 were subjected to ultrasonic cleaning in an acetone bath. After drying, the hard metal substrates were placed in a deposition apparatus shown in FIGS. 2A and 2B or in FIGS. 3A and 3B. Under the same conditions as Example 4, a (Ti, Al)N layer having a set layer thickness shown in Tables 20 and 21, and an amorphous carbon based lubricant coating having a set composition and thickness shown in Tables 20 and 21 were deposited. By the above-described process, end mills 1 to 19 made of surface-coated hard metal of the invention (hereafter referred to as coated hard metal end mill of the invention) were produced as coated hard metal tools of the invention.

In addition, as a comparative example, the above-described hard metal substrates (end mills) C-1 to C-5 were subjected to ultrasonic cleaning in an acetone bath. After dying, the hard metal substrates were placed in a deposition apparatus shown in FIGS. 5A and 5B, under the same conditions as Example 4, one or both of the TiN layer and TiCN layer, having a set layer thickness shown in Table 22, and an amorphous carbon based lubricant coating having a set composition and thickness shown in Table 22 were deposited. By the above-described process, comparative end mills 1 to 8, made of surface-coated hard metal (hereafter referred to as comparative coated hard metal end mill) were produced as conventional coated hard metal tools.

Next, the above-described coated hard metal end mills 1 to 19 of the invention, and comparative coated hard metal end mills 1 to 8 were applied to tests of high-speed dry side cutting.

The coated hard metal end mills 1 to 3, 9, 12 to 14 of the invention, and comparative coated hard metal end mills 1 to 3 were applied to high-speed (compared with normal speed of 180 m/min), dry side-cutting of an Al alloy under conditions comprising:
  workpiece: a plate of JIS-A5052 having a plate dimension of 100 mm×250 mm and a thickness of 50 mm;
  cutting speed: 320 m/min;
  depth of cut in the axial direction: 4.5 mm;
  depth of cut in the radial direction: 0.7 min;
  table feed: 2350 mm/minute.

The coated hard metal end mills 4 to 6, 10, 15 to 17 of the invention, and comparative coated hard metal end mills 4 to 6 were applied to high-speed (compared with normal speed of 180 m/min), dry side-cutting of a Cu alloy under conditions comprising:
  workpiece: a plate of JIS-C3710 having a plate dimension of 100 min×250 mm and a thickness of 50 mm;
  cutting speed: 320 m/min;
  depth of cut in the axial direction: 6.5 mm;
  depth of cut in the radial direction: 1.2 mm;
  table feed: 2185 mm/minute.

The coated hard metal end mills 7, 8, 11, 18 and 19 of the invention, and comparative coated hard metal end mills 7 and 8 were applied to high-speed (compared with normal speed of 200 m/min), wet side-cutting of a carbon steel under conditions comprising.
  workpiece: a plate of JIS-S10C having a plate dimension of 100 mm×250 mm and a thickness of 50 mm;
  cutting speed 1365 m/min;
  depth of cut in the axial direction: 8.0 mm;
  depth of cut in the radial direction: 2.0 mm;
  table feed: 2140 mm/minute.

In each test of side-cutting, length of cut by the end mill until a working lifetime of the end mill was measured. In each case, the end mill was regarded to reach its lifetime when a width of flank wear of a peripheral edge of a cutting edge of the end mill reached 0.1 mm. The results of the measurements are listed in Tables 20 to 22.

TABLE 19

| Type | | Co | (Ti, W) C | TaC | NbC | ZrC | $Cr_3C_2$ | VC | WC | Diameter × length of cutting edge (mm) |
|---|---|---|---|---|---|---|---|---|---|---|
| COATED HARD METAL SUBSTRATE (END MILL) | C-1 | 5 | — | — | 1 | — | — | — | fine grain: balance | 6 × 13 |
| | C-2 | 6 | — | — | 1.5 | — | — | — | fine grain: balance | 6 × 13 |
| | C-3 | 5 | — | 0.5 | — | — | 0.3 | 0.3 | fine grain: balance | 6 × 13 |
| | C-4 | 6.5 | — | — | — | — | 0.4 | — | fine grain: balance | 10 × 22 |
| | C-5 | 7 | 18 | — | 5 | — | — | — | medium-coarse grain: balance | 10 × 22 |
| | C-6 | 7.5 | — | — | — | — | — | 0.4 | fine grain: balance | 10 × 22 |
| | C-7 | 8 | 20 | — | 5 | — | — | — | medium-coarse grain: balance | 20 × 45 |
| | C-8 | 9 | 9 | 1.8 | 0.2 | 1 | — | — | medium-coarse grain: balance | 20 × 45 |

TABLE 20

| Type | | Hard metal substrate number | Adhesion bonding layer Set composition (atomic %) | | | Set thickness (μm) | Amorphous carbon based lubricant coating Set composition (atomic %) | | | | Set thickness (μm) | Grain diameter of Ti (C, N) based crystal (nm) | Cutting length (m) |
|---|---|---|---|---|---|---|---|---|---|---|---|---|---|
| | | | Ti | Al | N | | W | Ti | N | C+ impurities | | | |
| COATED HARD METAL END MILL OF THE INVENTION | 1 | C-1 | 0.40 | 0.60 | 1.00 | 0.5 | 20.0 | 20.0 | 10.0 | balance | 5 | 19.6 | 231 |
| | 2 | C-2 | 0.45 | 0.55 | 1.00 | 0.1 | 10.0 | 15.0 | 13.5 | balance | 3 | 15.3 | 195 |
| | 3 | C-3 | 0.50 | 0.50 | 1.00 | 1.0 | 5.0 | 5.0 | 1.0 | balance | 5 | 11.2 | 242 |
| | 4 | C-4 | 0.55 | 0.45 | 1.00 | 1.0 | 5.0 | 5.0 | 0.5 | balance | 7 | 25.4 | 247 |
| | 5 | C-5 | 0.60 | 0.40 | 1.00 | 1.5 | 10.0 | 10.0 | 5.0 | balance | 9 | 15.9 | 273 |
| | 6 | C-6 | 0.45 | 0.55 | 1.00 | 2.0 | 20.0 | 20.0 | 18.0 | balance | 7 | 32.7 | 229 |
| | 7 | C-7 | 0.50 | 0.50 | 1.00 | 3.0 | 15.0 | 15.0 | 10.0 | balance | 11 | 16.3 | 89 |
| | 8 | C-8 | 0.55 | 0.45 | 1.00 | 2.5 | 10.0 | 10.0 | 2.5 | balance | 13 | 7.2 | 95 |
| | 9 | C-1 | 0.45 | 0.55 | 1.00 | 1.0 | 10.0 | 0.5 | 10.0 | balance | 5 | 5.3 | 249 |
| | 10 | C-4 | 0.40 | 0.60 | 1.00 | 2.5 | 40.0 | 4.0 | 30.0 | balance | 10 | 27.7 | 238 |
| | 11 | C-7 | 0.55 | 0.45 | 1.00 | 3.0 | 10.0 | 30.0 | 25.0 | balance | 6 | 37.3 | 84 |

TABLE 21

| Type | | Hard metal substrate number | Adhesion bonding layer Set composition (atomic %) | | | Set thickness (μm) | Amorphous carbon based lubricant coating Set composition (atomic %) | | | | | Set thickness (μm) | Grain diameter of (Ti, Al) (C, N) based crystal (nm) | Cutting length (m) |
|---|---|---|---|---|---|---|---|---|---|---|---|---|---|---|
| | | | Ti | Al | N | | W | Ti | Al | N | C+ impurities | | | |
| COATED HARD METAL END MILL OF THE INVENTION | 12 | C-1 | 0.40 | 0.60 | 1.00 | 0.5 | 10.0 | 10.0 | 6.7 | 15.0 | balance | 5 | 14.9 | 246 |
| | 13 | C-2 | 0.45 | 0.55 | 1.00 | 0.1 | 20.0 | 10.0 | 10.0 | 18.0 | balance | 3 | 10.4 | 202 |
| | 14 | C-3 | 0.50 | 0.50 | 1.00 | 1.0 | 5.0 | 10.0 | 15.0 | 22.5 | balance | 5 | 33.2 | 252 |
| | 15 | C-4 | 0.55 | 0.45 | 1.00 | 1.0 | 10.0 | 5.0 | 8.0 | 6.5 | balance | 7 | 13.8 | 286 |
| | 16 | C-5 | 0.60 | 0.40 | 1.00 | 1.5 | 20.0 | 7.5 | 7.5 | 4.5 | balance | 9 | 7.4 | 293 |
| | 17 | C-6 | 0.45 | 0.55 | 1.00 | 2.0 | 5.0 | 2.6 | 1.6 | 0.4 | balance | 7 | 19.5 | 245 |
| | 18 | C-7 | 0.50 | 0.50 | 1.00 | 3.0 | 10.0 | 4.5 | 5.0 | 0.7 | balance | 11 | 12.7 | 92 |
| | 19 | C-8 | 0.55 | 0.45 | 1.00 | 2.5 | 15.0 | 5.5 | 4.5 | 0.6 | balance | 13 | 12.2 | 102 |

TABLE 22

| Type | | Hard metal substrate number | Set thickness of TiN layer (μm) | Amorphous carbon based lubricant coating Set composition (atomic %) | | | | | Set thickness (μm) | Cutting length (m) |
|---|---|---|---|---|---|---|---|---|---|---|
| | | | | W | Ti | Al | N | C+ impurities | | |
| COMPARATIVE HARD METAL END MILL | 1 | C-1 | 0.5 | 10 | — | — | — | balance | 5 | 83 |
| | 2 | C-2 | 0.1 | 20 | — | — | — | balance | 3 | 74 |
| | 3 | C-3 | 1 | 5 | — | — | — | balance | 5 | 88 |
| | 4 | C-4 | 1 | 10 | — | — | — | balance | 7 | 93 |
| | 5 | C-5 | 1.5 | 20 | — | — | — | balance | 9 | 102 |
| | 6 | C-6 | 2 | 5 | — | — | — | balance | 7 | 86 |
| | 7 | C-7 | 3 | 10 | — | — | — | balance | 11 | 37 |
| | 8 | C-8 | 2.5 | 15 | — | — | — | balance | 13 | 41 |

Example 6

Using the three types of round bar sintered body being produced in the above-described Example 5 and having a diameter of 8 mm (for forming hard metal substrates C-1 to C-3), 13 mm (for forming hard metal substrates C-4 to C-6), or 26 mm (for forming hard metal substrates C-7 and C-8), hard metal substrates (drills) D-1 to D-8 were produced by grinding the round bars. Each of the hard metal substrates had a two edge form with an angle of torsion of 30°, and a diameter×length of a flute forming portion of 4 mm×13 mm (hard metal substrates D-1 to D3), 9 mm×22 mm (hard metal substrates D4 to D-6), and 16 mm×45 mm (hard metal substrates D-7 and D-8).

Next, cutting edges of the hard metal substrates (drills) D-1 to D-5 were subjected to honing. The hard metal substrates were subjected to ultrasonic cleaning in an acetone bath. After drying, the hard metal substrates were placed in the deposition apparatus shown in FIGS. 2A and 2B or FIGS. 3A and 3B. Under the same conditions as the above-described Example 4, a (Ti, Al)N layer having a set layer thickness shown in Tables 23 and 24, and an amorphous carbon based lubricant coating having a set composition and thickness shown in Tables 23 and 24 were deposited. By the above-described process, drills 1 to 19 made of surface-coated hard metal of the invention (hereafter referred to as coated hard metal drills of the invention) were produced as coated hard metal tools of the invention.

In addition, as a comparative example, cutting edges of the hard metal substrates (drills) D1 to D-8 were subjected to honing. The above-described hard metal substrates were subjected to ultrasonic cleaning in an acetone bath. After drying, the hard metal substrates were placed in a deposition apparatus shown in FIGS. 5A and 5B, under the same conditions as Example 4, a TiN layer having a set layer thickness shown in Table 25, and an amorphous carbon based lubricant coating having a set composition and thickness shown in Table 25 were deposited. By the above-described process, comparative drills 1 to 8, made of surface-coated hard metal hereafter referred to as comparative coated hard metal drills) were produced as conventional coated hard metal tools.

Next, the above-described coated hard metal drills 1 to 19 of the invention, and comparative coated hard metal drills 1 to 8 were applied to tests of high-speed wet drilling.

The coated hard metal drills 1 to 3, 9, 12 to 14 of the invention, and comparative coated hard metal drills 1 to 3 were applied to tests of high-speed (compared with normal speed of 120 m/min) wet drilling of an Al alloy under conditions comprising:

workpiece: a plate of JIS-A5052 having a plate dimension of 100 mm×250 mm and a thickness of 50 mm;
drilling speed: 290 m/min;
feed: 0.4 mm/rev; and
depth of a hole: 6 mm.

The coated hard metal drills 4 to 6, 10, 15 to 17 of the invention, and comparative coated hard metal drills 4 to 6 were applied to tests of high-speed (compared with normal speed of 110 m/min) wet drilling of a carbon steel under conditions comprising:

workpiece; a plate of JIS-S10C having a plate dimension of 100 mm×250 mm and a thickness of 50 mm;
drilling speed: 265 m/min;
feed: 0.5 mm/rev; and
depth of a hole: 12 mm.

The coated hard metal drills 7, 8, 11, 18 and 19 of the invention, and comparative coated hard metal drills 7 and 8 were applied to tests of high-speed (compared with normal speed of 110 m/min), wet drilling of a Cu alloy under conditions comprising:

workpiece: a plate of JIS-C3710 having a plate dimension of 100 mm×250 mm and a thickness of 50 mm;
drilling speed: 265 m/min;
feed: 0.6 mm/rev; and
depth of a hole: 20 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 23 to 25.

TABLE 23

| Type | | Hard metal substrate number | Adhesion bonding layer Set composition (atomic %) | | | Set thickness (μm) | Amorphous carbon based lubricant coating Set composition (atomic %) | | | | Set thickness (μm) | Grain diameter of Ti (C, N) based crystal (nm) | Number of drilling (holes) |
|---|---|---|---|---|---|---|---|---|---|---|---|---|---|
| | | | Ti | Al | N | | W | Ti | N | C+ impurities | | | |
| COATED HARD METAL DRILL OF THE INVENTION | 1 | D-1 | 0.45 | 0.55 | 1.00 | 0.1 | 5.0 | 5.0 | 0.5 | balance | 3.0 | 16.5 | 9305 |
| | 2 | D-2 | 0.55 | 0.45 | 1.00 | 3.0 | 15.0 | 15.0 | 7.5 | balance | 5.0 | 10.4 | 9734 |
| | 3 | D-3 | 0.50 | 0.50 | 1.00 | 1.0 | 20.0 | 20.0 | 18.0 | balance | 7.0 | 31.5 | 10182 |
| | 4 | D-4 | 0.60 | 0.40 | 1.00 | 1.5 | 5.0 | 20.0 | 14.0 | balance | 9.0 | 24.7 | 2641 |
| | 5 | D-5 | 0.40 | 0.60 | 1.00 | 2.0 | 10.0 | 15.0 | 4.5 | balance | 6.0 | 15.2 | 2001 |
| | 6 | D-6 | 0.50 | 0.50 | 1.00 | 2.5 | 15.0 | 10.0 | 0.1 | balance | 9.0 | 18.9 | 2795 |
| | 7 | D-7 | 0.55 | 0.45 | 1.00 | 0.5 | 10.0 | 15.0 | 10.5 | balance | 13.0 | 18.5 | 4218 |
| | 8 | D-8 | 0.45 | 0.55 | 1.00 | 1.5 | 20.0 | 5.0 | 1.5 | balance | 11.0 | 9.2 | 3875 |
| | 9 | D-2 | 0.55 | 0.45 | 1.00 | 3.0 | 10.0 | 0.5 | 10.0 | balance | 5 | 9.3 | 10095 |
| | 10 | D-5 | 0.60 | 0.40 | 1.00 | 1.5 | 40.0 | 4.0 | 30.0 | balance | 10 | 16.5 | 2836 |
| | 11 | D-8 | 0.50 | 0.50 | 1.00 | 2.5 | 10.0 | 30.0 | 25.0 | balance | 6 | 34.1 | 3804 |

TABLE 24

| | | | Adhesion bonding layer | | | Amorphous carbon based lubricant coating | | | | | | | |
| | | Hard metal | Set composition | | Set | Set composition | | | | | Set | Grain diameter of (Ti, Al) (C, N) based crystal | Number of |
| Type | | substrate number | (atomic %) | | | (atomic %) | | | | | thickness | | drilling |
| | | | Ti | Al | N | thickness (μm) | W | Ti | Al | N | C+ impurities | (μm) | (nm) | (holes) |
|---|---|---|---|---|---|---|---|---|---|---|---|---|---|---|
| COATED HARD METAL DRILL OF THE INVENTION | 12 | D-1 | 0.45 | 0.55 | 1.00 | 0.1 | 5.0 | 10.0 | 15.0 | 22.5 | balance | 3.0 | 13.8 | 10002 |
| | 13 | D-2 | 0.55 | 0.45 | 1.00 | 3.0 | 10.0 | 10.0 | 10.0 | 14.0 | balance | 5.0 | 10.4 | 10470 |
| | 14 | D-3 | 0.50 | 0.50 | 1.00 | 1.0 | 15.0 | 10.0 | 6.7 | 8.3 | balance | 7.0 | 7.6 | 10955 |
| | 15 | D-4 | 0.60 | 0.40 | 1.00 | 1.5 | 10.0 | 5.0 | 8.0 | 3.9 | balance | 9.0 | 26.4 | 2838 |
| | 16 | D-5 | 0.40 | 0.60 | 1.00 | 2.0 | 15.0 | 7.5 | 7.5 | 9.0 | balance | 6.0 | 20.9 | 2154 |
| | 17 | D-6 | 0.50 | 0.50 | 1.00 | 2.5 | 20.0 | 2.6 | 1.6 | 0.4 | balance | 9.0 | 15.3 | 3094 |
| | 18 | D-7 | 0.65 | 0.45 | 1.00 | 0.5 | 15.0 | 4.5 | 5.5 | 4.0 | balance | 13.0 | 9.5 | 4545 |
| | 19 | D-8 | 0.45 | 0.55 | 1.00 | 1.5 | 10.0 | 5.5 | 4.5 | 7.0 | balance | 11.0 | 30.2 | 4198 |

TABLE 25

| Type | | Hard metal substrate number | Set thickness of TiN layer (μm) | Amorphous carbon based lubricant coating | | | | | Set thickness (μm) | Number of drilling (holes) |
| | | | | Set composition (atomic %) | | | | | | |
| | | | | W | Ti | Al | N | C+ impurities | | |
|---|---|---|---|---|---|---|---|---|---|---|
| COMPARATIVE COATED HARD METAL DRILL | 1 | D-1 | 0.1 | 5 | — | — | — | balance | 3 | 4015 |
| | 2 | D-2 | 3 | 10 | — | — | — | balance | 5 | 4293 |
| | 3 | D-3 | 1 | 16 | — | — | — | balance | 7 | 4649 |
| | 4 | D-4 | 1.5 | 10 | — | — | — | balance | 9 | 1163 |
| | 5 | D-5 | 2 | 15 | — | — | — | balance | 6 | 855 |
| | 6 | D-6 | 2.5 | 20 | — | — | — | balance | 9 | 1284 |
| | 7 | D-7 | 0.5 | 15 | — | — | — | balance | 13 | 2185 |
| | 8 | D-8 | 1.5 | 10 | — | — | — | balance | 1 | 1769 |

As described above, coated hard metal inserts 1, 1' to 42, 42' of the invention, coated hard metal end mills 1 to 19 of the invention, and coated hard metal drills 1 to 19 of the invention as hard metal tools of the invention, and comparative hard metal inserts 1, 1' to 16, 16', comparative coated hard metal end mills 1 to 8, and comparative hard metal drills 1 to 8, as conventional coated hard metal tools were obtained. The adhesion bonding layer and the amorphous carbon based lubricant coating of each of the above-described coated carbide tools were subjected to analysis of composition by an Auger electron spectrometer and measurement of thickness using a scanning electron microscope. As a result, the composition and average thickness (average value measured from 5 points in a section) of the adhesion bonding layer and the coating were substantially similar to the set composition and set thickness. In addition, under an observation of a texture of the coating using a transmission electron microscope, the coated hard metal tools of the invention showed a texture of the coating in which fine crystalline grains of Ti—Al (C,N) were dispersively distributed in the matrix of a carbon based amorphous material, while the conventional coated hard metal tool showed a texture of the coating composed of a single phase of a carbon based amorphous material.

As shown in the results listed in Tables 16 to 25, in the coated hard metal tools of the invention having a texture in which fine crystalline grains of Ti—Al (CN) were dispersively distributed in the matrix of a carbon based amorphous material, each tool showed excellent wear resistance even in the case of high-speed cutting of Al alloy, a Cu alloy or a steel. On the other hand, in the conventional coated hard metal tool (comparative coated hard metal tool) having an amorphous carbon based lubricant coating composed of a single phase texture of carbon based amorphous material, the amorphous carbon based lubricant coating obviously showed extremely rapid progress of wear and reached the end of its working lifetime within a relatively short time period under high-speed cutting conditions.

Example 7

As constituent powders, WC powder, TiC powder, ZrC powder, VC powder, TaC powder, NbC powder, $Cr_3C_2$ powder, TiN powder, TaN powder and Co powder, all of which had an average grain diameter of 1 to 3 μm were prepared. These constituent powders were mixed in accordance with the compounding ratios presented in table 26, and wet blended for 60 hours by a ball mill. After drying the mixed powder, under a pressure of 100 MPa, the mixed powder was press-molded into a compact. The compacts were sintered by being maintained at a temperature: 1400° C. for one 1 hour in a vacuum condition of 6 Pa. After the sintering, by grinding the compacts, hard metal substrates A-1 to A-10 made of WC based cemented carbide, all of which having a geometric configuration of a insert meeting ISO standard: 160304R were produced.

In addition, as constituent powders, TiCN powder (TiC/TiN=50/50 by weight ration), Mo$_2$C powder, ZrC powder, NbC powder, TaC powder, WC powder, Co powder and Ni powder, all of which had an average grain diameter in a range from 0.5 to 2 µM were prepared. These constituent powders were mixed in accordance with the compounding ratios presented in table 27, wet blended for 48 hours by a ball mill. After drying the mixed powder, under a pressure of 100 MPa, the mixed powder was press-molded into compacts. The compacts were sintered by being maintained at a temperature: 1500° C. for one 1 hour in a nitrogen atmosphere of 2 kPa. After the sintering, by grinding the compacts, hard metal substrates B-1 to B-6 made of a TiCN-based hard metal, all of which having a geometric configuration of an insert meeting ISO standard: TEGX 160304R were produced.

Figure 4A:
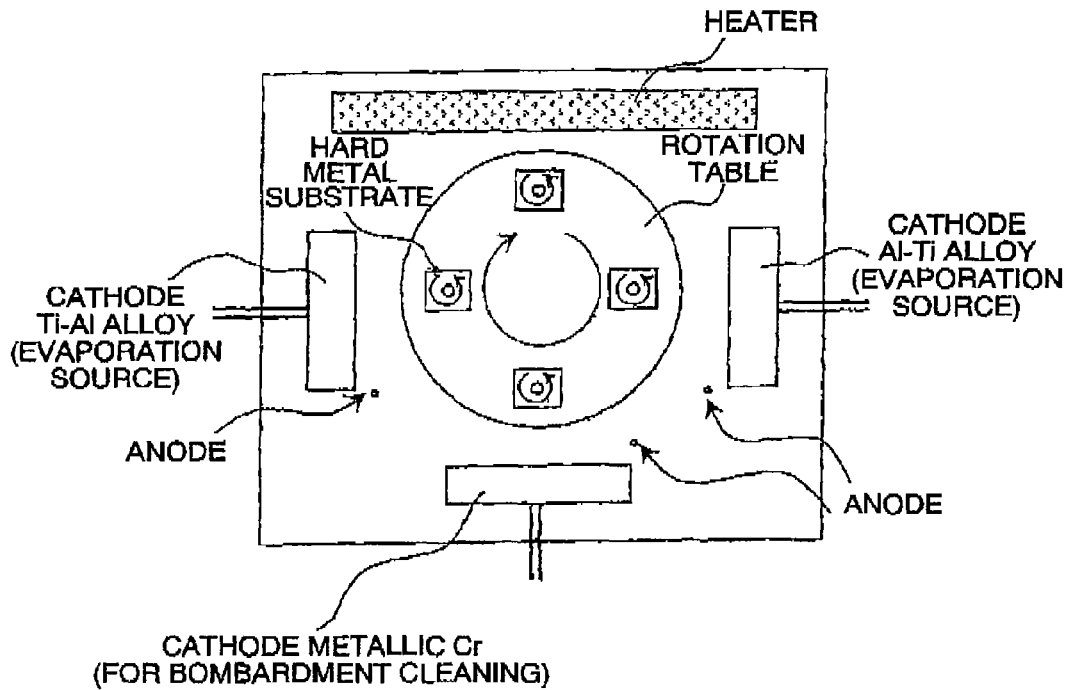
FIG. 4A is a schematic plan view of an arc ion plating apparatus used for formation of a (Al/Ti)N layer as a lower layer of a surface coating layer of a coated hard metal tool of the invention.
Figure 4B:
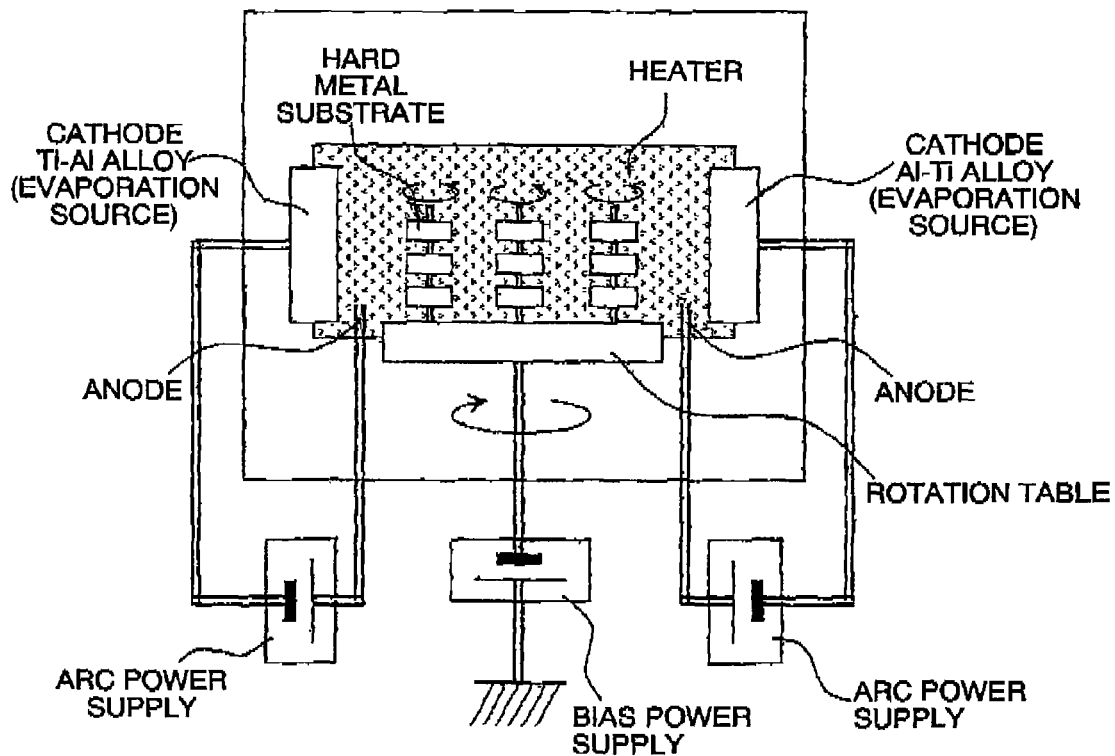
FIG. 4B is a schematic front view of the arc ion plating apparatus shown in FIG. 4A.

(a) Next, an arc ion plating apparatus shown in FIGS. 4A and 4B was prepared. A rotation table for placing a hard metal substrate was provided in the center of the apparatus. On both sides of the rotation table, a Al—Ti alloy having a relatively high Al (low Ti) content was placed on one side, and a Ti—Al alloy having a relatively high Ti (low Al) content was placed on the opposite side as cathodes (evaporation sources). In addition, at the positions rotated from both of the cathodes by 90°, metallic Cr was placed as a cathode (evaporation source). After ultrasonic cleaning of the above-described hard metal substrates A-1 to A-10 and 13-1 to B-6 in the acetone, and drying the substrates, on the rotation table, on radial positions distant from the central axis of the table, the hard metal substrates were placed so as to form an arrangement aligned with the periphery.

(b) Firstly, while maintaining the interior of the apparatus under a vacuum condition of 0.1 Pa by evacuation, the interior of the apparatus was heated to 500° C. After that, the hard metal substrates revolving and rotating on the rotation table were applied with a DC bias voltage of −1000V. In addition, electric current of 100 A was generated between the metallic Cr placed as a cathode and an anode for causing arc discharge and cleaning the surfaces of the hard metal substrates by metallic Cr bombardments.

(c) Next, by introducing nitrogen gas into the apparatus as a reaction gas, a reaction atmosphere of 3 Pa was obtained. The hard metal substrates revolving and rotating on the rotation table were applied with a DC bias voltage of −70V. In that state, arc discharge was generated between the two respective cathodes (a Ti—Al alloy for forming the portion of maximum Ti content, and an Al—Ti alloy for forming the portion of maximum Al content) in counter arrangement and the anode, thereby a lower layer of a surface coating was deposited on a surface of respective substrates. Each lower layer was formed as a (Al/Ti)N layer having a set thickness shown in Tables 28 and 29 and variable composition structure in which portions of maximum Ti content and portions of maximum Al content existed with set compositions shown in Tables 28 and 29 alternately and repeatedly with a designated interval shown in Tables 28 and 29, and the Al and Ti content changed continuously from the portion of maximum Ti content to the portion of maximum Al content, and from the portion of maximum Al content to the portion of maximum Ti content.

Figure 2A:
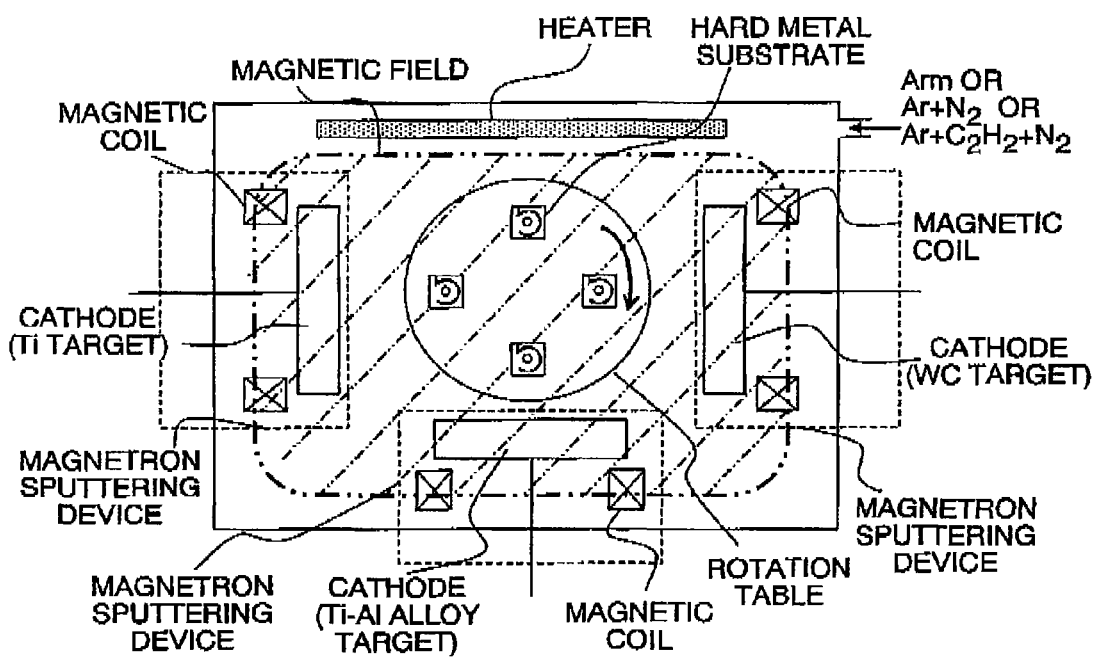
FIG. 2A is a schematic plan view showing a deposition apparatus used for formation of an adhesion bonding layer and an amorphous carbon based lubricant coating as constituents of a coated hard metal tool of the invention.
Figure 2B:
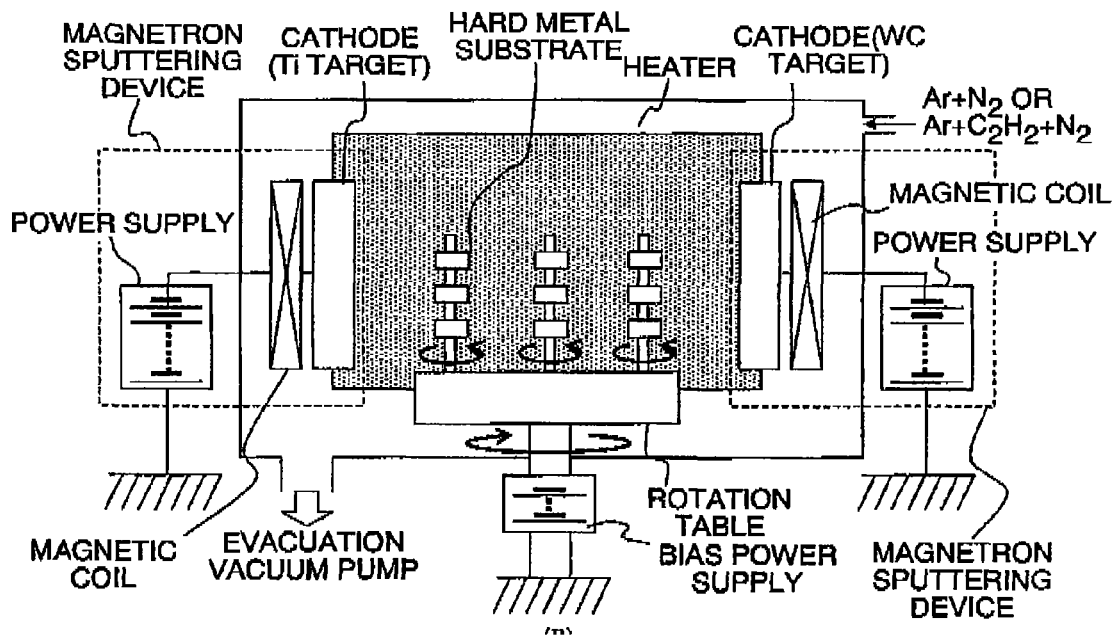
FIG. 2B is a schematic front view of the deposition apparatus shown in FIG. 2A.

(d) Next, the hard metal substrates were placed on a rotation table of a deposition apparatus which was, as shown in FIGS. 2A and 2B, equipped with a Ti target and a WC target in counter arrangement with the rotation table in-between. In the apparatus, a Ti target of purity: 99.6% by weight as placed as a cathode (evaporation source) of a magnetron sputtering device on one side, and a WC target of purity: 99.6% by weight was placed as a cathode (evaporation source) of a magnetron sputtering device on the opposite side. The hard metal substrates were placed on the rotation table such that a plurality of the substrates formed a ring-like arrangement with a predetermined radial distance from the center axis of the table.

(e) Magnetic coils were subjected to predetermined conditions within a range of electric voltage: 50 to 100 V, and a current: 10 to 20 A. The magnetic flux density at the placing positions of the hard metal substrates was controlled to a predetermined value within a range of magnetic flux density: 100 to 3000 (Gauss). In that state, while maintaining the interior of the apparatus at a heating temperature of 400° C. and the hard metal substrate being applied with a bias voltage of −100V, as a reaction gas, C$_2$H$_2$ (hydrocarbon), nitrogen and Ar were introduced into the apparatus at predetermined flow rates within ranges of C$_2$H$_2$ flow rate: 25 to 100 sccm, nitrogen flow rate: 200 to 300 sccm, and Ar flow rate: 150 to 250 sccm to obtain a reaction atmosphere of 1 Pa, being composed of a mixed gas of resolved gas of C$_2$H$_2$, nitrogen and Ar. In the above-described pair of magnetron sputtering devices, the cathode (evaporation source) of WC target was applied with a predetermined electric power for sputtering within a range of e.g., output: 1 to 3 kW(frequency: 40 kHz). At the same time, the Ti target was applied with a predetermined electric power for sputtering within a range of output: 3 to 8 kW (frequency: 40 kHz). Under the above-described conditions, the substrates were deposited with an amorphous carbon based lubricant coating respectively having a set composition and a set layer thickness listed in Table 28 as upper layers. By the above-described process, inserts 1 to 26 made of surface-coated hard metal of the invention (hereafter referred to as coated hard metal inserts of the invention) were produced as coated hard metal tools of the invention.

Figure 3A:
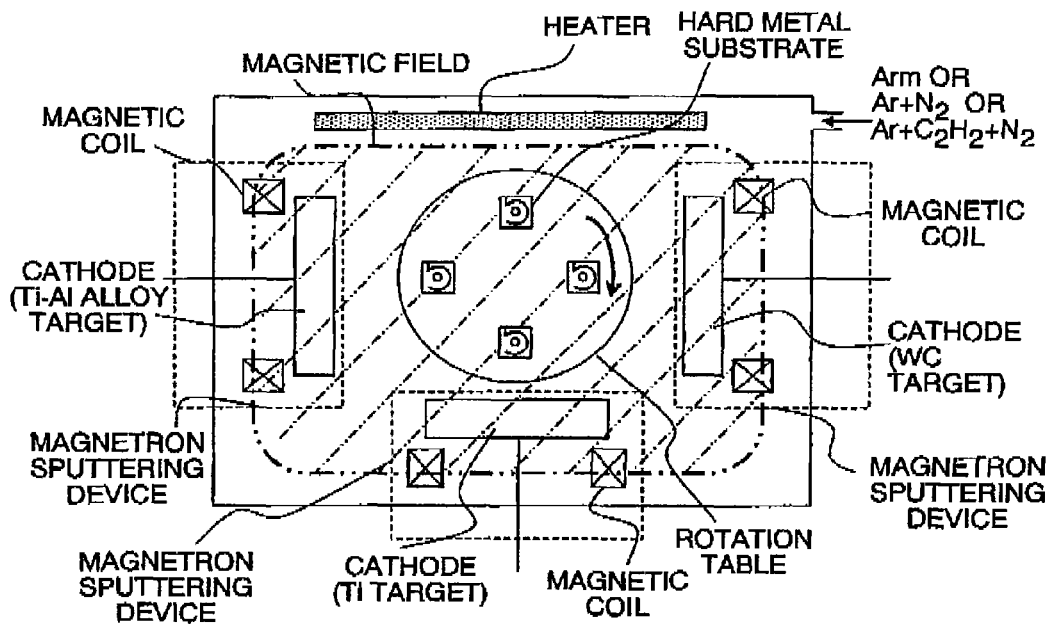
FIG. 3A is a schematic plan view of a deposition apparatus used for formation of an adhesion bonding layer and an amorphous carbon based lubricant coating as constituents of a coated hard metal tool of the invention.
Figure 3B:
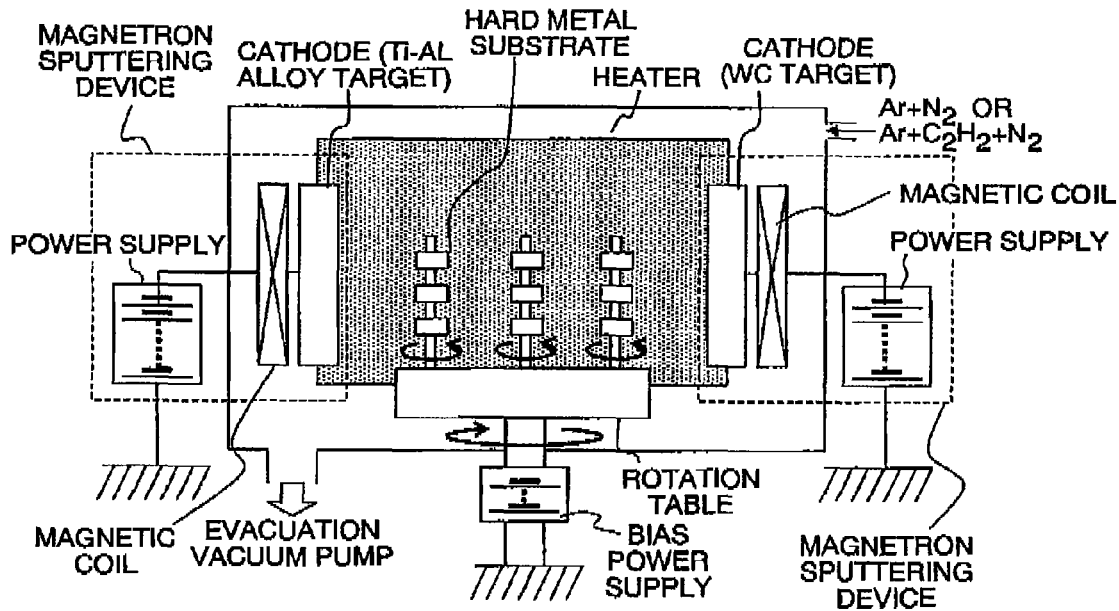
FIG. 3B is a schematic front view of the deposition apparatus shown in FIG. 3A.

(f) Moreover, as an alternative to the apparatus explained in the above-description of (d), a deposition apparatus shown in FIGS. 3A and 3B was used for deposition of amorphous carbon based lubricant coating on the hard metal substrates provided with lower layers as in the above-description of (c). In the apparatus, with a rotation table in-between, a Ti—Al alloy target was placed on one side as a cathode (evaporation source) of a magnetron sputtering device, and a WC target of purity: 99.6% by weight was placed on the opposite side as a cathode (evaporation source) of a magnetron sputtering device. The hard metal substrates were placed on the rotation table such that a plurality of the substrates formed a ring-like arrangement with a predetermined radial distance from the center axis of the table.

(g) Magnetic coils were subjected to predetermined conditions within a range of electric voltage: 50 to 100V, and a current: 10 to 20 A. The magnetic flux density at the placing positions of the hard metal substrates was controlled to a predetermined value within a range of magnetic flux density: 100 to 3000 (Gauss). In that state, while maintaining Me interior of the apparatus at a beating temperature of 400° C. and the hard metal substrate being applied with a bias voltage of −100V, as a reaction gas, C$_2$H$_2$ (hydrocarbon), nitrogen and Ar were introduced into the apparatus at predetermined flow rates within ranges of C$_2$H$_2$ flow rate: 25 to 100 sccm, nitrogen flow rate: 200 to 300 sccm, and Ar flow rate; 150 to 250 sccm to obtain a reaction atmosphere of 1 Pa, being composed of a mixed gas of resolved gas of C$_2$H$_2$, nitrogen and Ar. In the above-described pair of magnetron sputtering devices, the cathode (evaporation source) of WC target was applied with a predetermined electric power for sputtering within a range of e.g., output: 1 to 3 kW (frequency: 40 kHz). At the same time, the Ti target was applied with a predetermined electric power for sputtering within a range of output: 3 to 8 kW (frequency: 40 kHz). Under the above-described conditions) the substrates were deposited with an amorphous carbon based lubricant coating respectively having a set composition and a set layer thickness listed in Table 29 as upper layers. By the above-described process, inserts 27 to 42 made of surface-coated hard metal of the invention. Hereafter referred to as coated hard metal inserts of the invention) were produced as coated hard metal tools of the invention.

Figure 6:
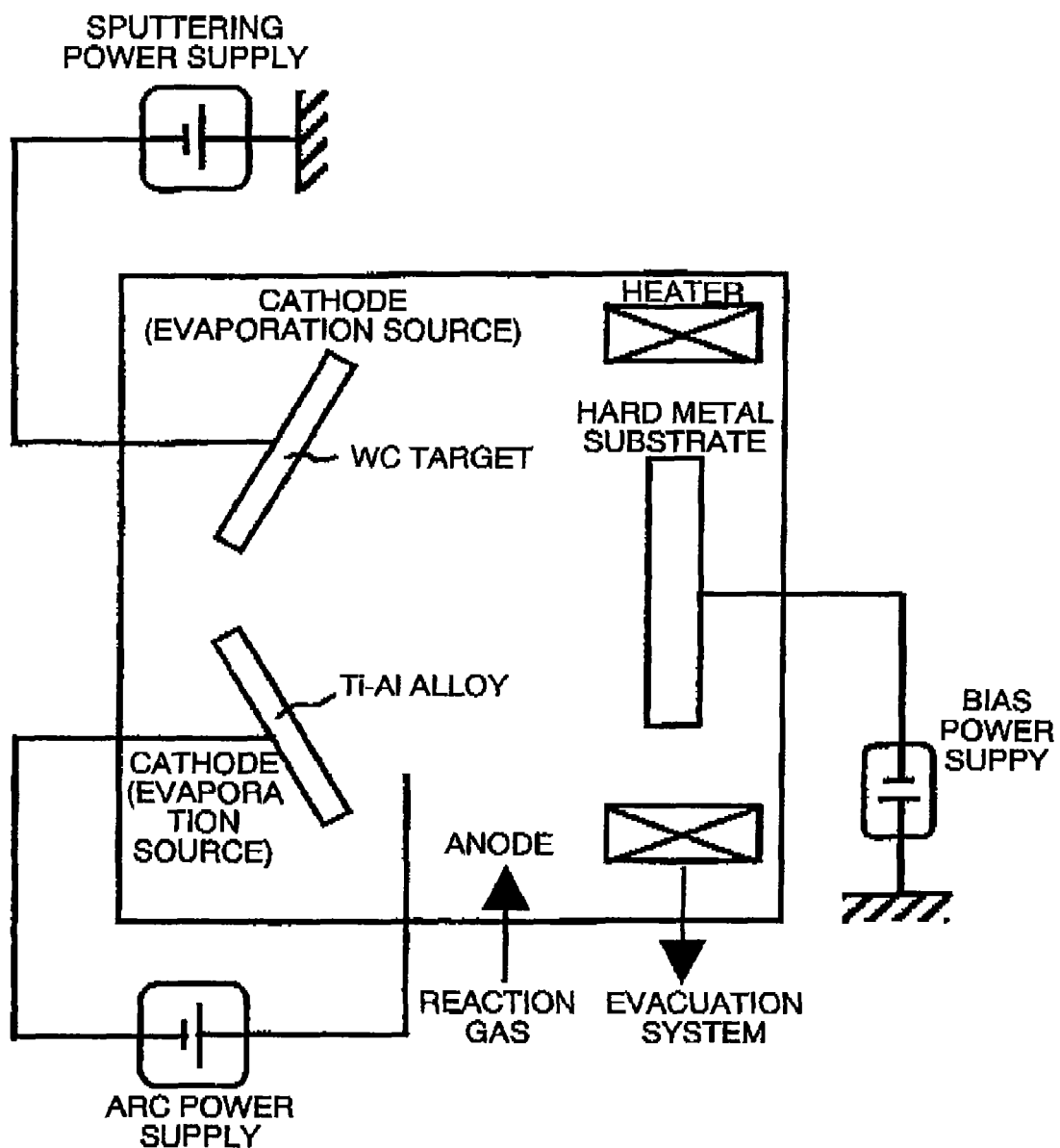
FIG. 6 is a schematic plan view of an arc ion plating apparatus which has been used for formation of a (Ti, Al)N layer as a lower layer of a surface coating layer, and an amorphous carbon based lubricant layer as an upper layer of a conventional coated hard metal tool.

(a) In addition, with a purpose to obtain comparative data, a deposition apparatus shown in FIG. 6 was used for producing comparative coated cutting tools as follows The apparatus was provided with an arc discharge device equipped with a Ti—Al alloy of a predetermined composition as a cathode (evaporation source) and a sputtering device equipped with a WC target as cathode (evaporation source). Surfaces of the above-described hard metal substrates of A-1 to A-10, and B-1 to B-6 were subjected to ultrasonic cleaning in an acetone bath. After that, at a dried state, the hard metal substrates were placed in the deposition apparatus.

(b) Firstly, while maintaining the interior of the apparatus under a vacuum condition of 0.1 Pa by evacuation, the interior of the apparatus was heated to 500° C. After that, the hard metal substrates revolving and rotating on the rotation table were applied with a direct current bias voltage of −1000V, In addition, electric current of 100 A was generated between the Ti—Al alloy as a cathode and an anode, thereby causing arc discharge and cleaning the surfaces of the hard metal substrates by bombardments of Ti—Al alloy.

(c) Next, by introducing nitrogen gas into the apparatus as a reaction gas, reaction atmosphere of 3 Pa was obtained. In addition, the bias voltage impressed to the hard metal substrates were reduced to −100V. In that state, an arc discharge was generated between the cathodes of Ti—Al alloy and an anode, thereby depositing (Ti, Al) N layer of set thickness shown in Table 30 as a lower layer of a surface coating on a surface of respective hard metal substrates A-1 to A-10 and B-1 to B-6.

(d) Next, while maintaining the interior of the apparatus at a heating temperature of 200° C., $C_2H_2$ and Ar were introduced into the apparatus at predetermined flow rates within ranges of $C_2H_2$ flow rate: 40 to 80 sccm, and Ar flow rate: 250 sccm to obtain a reaction atmosphere of 1 Pa, being composed of a mixed gas of resolved gas of $C_2H_2$, nitrogen and Ar. At the same time, the above-described hard metal substrates were applied with a bias voltage of −20V, and the cathode (evaporation source) of WC target was applied with a predetermined electric power for sputtering within a range of e.g., output: 4 to 6 kW(frequency: 40 kHz). At the same time, the Ti target was applied with a predetermined electric power for sputtering within a range of output: 4 to 6 kW (frequency: 40 kHz). Under the above-described conditions, on the lower layer of the hard metal substrates, amorphous carbon based lubricant coating respectively having a set composition and a set layer thickness listed in Table 30 were deposited as upper layers. By the above-described process comparative inserts 1 to 16 made of surface-coated hard metal (hereafter referred to as comparative coated hard metal inserts) were produced as conventional coated hard metal tools.

Next, the above-described coated inserts were respectively screw-mounted with a fixture-jig on an end of a bit made of a tool steel. At that state, coated inserts 142 of the invention and comparative coated inserts 1-16 were applied to the following tests of high-speed dry cutting.

Cutting tests of an Al alloy were carried out under continuous high-speed, high slitting, dry cutting conditions (cutting condition A) comprising (compared with normal cutting speed and depth of cut of 400 m/min and 2 mm):
 workpiece: a round bar of JIS-A5052;
 cutting speed: 800 m/min;
 depth of cut: 7.3 mm;
 feed: 0.1 mm/rev; and
 cutting time: 20 minutes.

Cutting tests of an Cu alloy were carried out under continuous high-speed, high slitting, dry cutting conditions (cutting condition B) comprising (compared with normal cutting speed and depth of cut of 200 m/min, 2 mm):
 workpiece: around bar of JIS-C3710;
 cutting speed: 380/min;
 depth of cut: 6.8 mm;
 feed: 0.13 m/rev; and
 cutting time: 20 minutes.

In addition, cutting tests of an TI alloy were carried out under continuous high-speed, high slitting, dry cutting conditions (cutting condition C) comprising (compared with normal cutting speed and depth of cut of 100 m/min, 1.5 mm);
 workpiece: a round bar of JIS TB340H;
 cutting speed 150 m/min;
 depth of cut: 6.4 mm;
 feed: 0.11 mm/rev, and
 cutting time: 15 minutes.

In each of the cutting tests, widths of flank wear were measured. The results of the measurements are listed in Tables 28 and 29.

TABLE 26

| | | Composition (% by weight) | | | | | | | | |
|---|---|---|---|---|---|---|---|---|---|---|
| Type | | Co | TiC | ZrC | VC | TaC | NbC | $Cr_2O_3$ | TiN | TaN | WC |
| HARD METAL SUBSTRATE | A-1 | 10.5 | 8 | — | — | 8 | 1.5 | — | — | — | balance |
| | A-2 | 7 | — | — | — | — | — | — | — | — | balance |
| | A-3 | 5.7 | — | — | — | 1.5 | 0.5 | — | — | — | balance |
| | A-4 | 5.7 | — | — | — | — | — | 1 | — | — | balance |
| | A-5 | 8.5 | — | 0.5 | — | — | — | 0.5 | — | — | balance |
| | A-6 | 9 | — | — | — | 2.5 | 1 | — | — | — | balance |
| | A-7 | 9 | 8.5 | — | — | 8 | 3 | — | — | — | balance |
| | A-8 | 11 | 8 | — | — | 4.5 | — | — | 1.5 | — | balance |
| | A-9 | 12.5 | 2 | — | — | — | — | — | 1 | 2 | balance |
| | A-10 | 14 | — | — | 0.2 | — | — | 0.8 | — | — | balance |

TABLE 27

| Type | | Composition (% by weight) | | | | | | | |
|---|---|---|---|---|---|---|---|---|---|
| | | Co | Ni | ZrC | TaC | NbC | $Mo_2C$ | WC | TiCN |
| INSERT TOOL | B-1 | 13 | 5 | — | 10 | — | 10 | 16 | balance |
| | B-2 | 8 | 7 | — | 5 | — | 7.5 | — | balance |
| | B-3 | 5 | — | — | — | — | 6 | 10 | balance |
| | B-4 | 10 | 5 | — | 11 | 2 | — | — | balance |
| | B-5 | 9 | 4 | 1 | 8 | — | 10 | 10 | balance |
| | B-6 | 12 | 5.5 | — | 10 | — | 9.5 | 14.5 | balance |

TABLE 28

| | | Lower layer [(Al/Ti)N layer] | | | | | | | Set interval between two portion (μm) | Set thick (μm) | Amorphous carbon based lubricant coating | | | | | Grain diameter of Ti (C, N) based crystal (nm) | Cut cond. A | Cut cond. B | Cut cond. C |
|---|---|---|---|---|---|---|---|---|---|---|---|---|---|---|---|---|---|---|---|
| | | maximum Al content Set composition (atomic %) | | | maximum Ti content Set composition (atomic %) | | | | | | Set composition (atomic %) | | | | Set thick (μm) | | | | |
| Type | No. | Al | Ti | N | Ti | Al | N | | | W | Ti | N | C+ impurities | | | | | |
| COAT- | 1 A-1 | 0.95 | 0.05 | 1.00 | 0.95 | 0.05 | 1.00 | 0.01 | 8.0 | 5.0 | 20.0 | 10.0 | balance | 7.0 | 38.4 | 0.13 | 0.13 | 0.23 |
| ED | 2 A-2 | 0.90 | 0.10 | 1.00 | 0.85 | 0.15 | 1.00 | 0.06 | 5.0 | 10.0 | 15.0 | 7.5 | balance | 9.0 | 22.7 | 0.17 | 0.18 | 0.26 |
| HARD | 3 A-3 | 0.85 | 0.15 | 1.00 | 0.70 | 0.30 | 1.00 | 0.03 | 7.0 | 15.0 | 10.0 | 6.0 | balance | 8.0 | 21.9 | 0.16 | 0.17 | 0.24 |
| MET- | 4 A-4 | 0.80 | 0.20 | 1.00 | 0.90 | 0.10 | 1.00 | 0.10 | 9.0 | 20.0 | 5.0 | 2.5 | balance | 6.0 | 8.1 | 0.11 | 0.12 | 0.21 |
| AL | 5 A-5 | 0.75 | 0.25 | 1.00 | 0.75 | 0.25 | 1.00 | 0.07 | 6.0 | 5.0 | 20.0 | 18.0 | balance | 8.0 | 7.4 | 0.16 | 0.16 | 0.25 |
| IN- | 6 A-6 | 0.60 | 0.30 | 1.00 | 0.80 | 0.20 | 1.00 | 0.02 | 7.0 | 10.0 | 15.0 | 10.5 | balance | 7.0 | 6.8 | 0.14 | 0.14 | 0.23 |
| SERT | 7 A-7 | 0.65 | 0.35 | 1.00 | 0.65 | 0.35 | 1.00 | 0.04 | 6.0 | 15.0 | 10.0 | 9.0 | balance | 7.0 | 34.2 | 0.15 | 0.15 | 0.24 |
| OF | 8 A-8 | 0.90 | 0.10 | 1.00 | 0.90 | 0.10 | 1.00 | 0.09 | 8.0 | 20.0 | 5.0 | 0.5 | balance | 8.0 | 20.3 | 0.12 | 0.13 | 0.22 |
| THE | 9 A-9 | 0.80 | 0.20 | 1.00 | 0.80 | 0.20 | 1.00 | 0.05 | 5.0 | 10.0 | 10.0 | 3.0 | balance | 10.0 | 17.2 | 0.17 | 0.18 | 0.26 |
| IN- | 10 A-10 | 0.70 | 0.30 | 1.00 | 0.75 | 0.25 | 1.00 | 0.08 | 10.0 | 15.0 | 15.0 | 1.5 | balance | 5.0 | 8.5 | 0.1 | 0.11 | 0.2 |
| VEN- | 11 A-1 | 0.60 | 0.30 | 1.00 | 0.80 | 0.20 | 1.00 | 0.02 | 8.0 | 5.0 | 20.0 | 18.0 | balance | 9.0 | 29.6 | 0.2 | 0.11 | 0.11 |
| TION | 12 A-3 | 0.70 | 0.30 | 1.00 | 0.75 | 0.25 | 1.00 | 0.08 | 9.0 | 10.0 | 30.0 | 25.0 | balance | 6.0 | 14.8 | 0.18 | 0.13 | 0.09 |
| | 13 A-5 | 0.75 | 0.25 | 1.00 | 0.75 | 0.25 | 1.00 | 0.07 | 5.0 | 20.0 | 20.0 | 16.5 | balance | 4.0 | 12.3 | 0.17 | 0.15 | 0.09 |
| | 14 A-7 | 0.85 | 0.15 | 1.00 | 0.70 | 0.30 | 1.00 | 0.03 | 8.0 | 10.0 | 0.5 | 10.0 | balance | 5.0 | 7.8 | 0.33 | 0.03 | 0.05 |
| | 15 A-9 | 0.95 | 0.05 | 1.00 | 0.95 | 0.05 | 1.00 | 0.01 | 6.0 | 40.0 | 4.0 | 30.0 | balance | 10.0 | 5.2 | 0.06 | 0.21 | 0.23 |
| | 16 B-1 | 0.90 | 0.10 | 1.00 | 0.95 | 0.05 | 1.00 | 0.04 | 7.0 | 5.0 | 5.0 | 2.5 | balance | 8.0 | 9.9 | 0.16 | 0.18 | 0.24 |
| | 17 B-2 | 0.85 | 0.15 | 1.00 | 0.65 | 0.36 | 1.00 | 0.10 | 5.0 | 10.0 | 10.0 | 5.0 | balance | 10.0 | 13.4 | 0.18 | 0.17 | 0.28 |
| | 18 B-3 | 0.80 | 0.20 | 1.00 | 0.80 | 0.20 | 1.00 | 0.01 | 8.0 | 15.0 | 15.0 | 7.5 | balance | 7.0 | 27.2 | 0.13 | 0.13 | 0.23 |
| | 19 B-4 | 0.75 | 0.25 | 1.00 | 0.90 | 0.10 | 1.00 | 0.06 | 10.0 | 20.0 | 20.0 | 10.0 | balance | 5.0 | 7.6 | 0.11 | 0.12 | 0.21 |
| | 20 B-5 | 0.70 | 0.30 | 1.00 | 0.75 | 0.25 | 1.00 | 0.02 | 8.0 | 10.0 | 15.0 | 13.5 | balance | 9.0 | 35.3 | 0.17 | 0.18 | 0.25 |
| | 21 B-6 | 0.65 | 0.35 | 1.00 | 0.85 | 0.15 | 1.00 | 0.08 | 9.0 | 15.0 | 10.0 | 1.0 | balance | 6.0 | 20.5 | 0.12 | 0.11 | 0.22 |
| | 22 B-1 | 0.95 | 0.05 | 1.00 | 0.95 | 0.05 | 1.00 | 0.01 | 7.0 | 5.0 | 20.0 | 18.0 | balance | 9.0 | 15.8 | 0.12 | 0.1 | 0.13 |
| | 23 B-3 | 0.60 | 0.30 | 1.00 | 0.80 | 0.20 | 1.00 | 0.02 | 5.0 | 10.0 | 30.0 | 25.0 | balance | 6.0 | 8.3 | 0.11 | 0.07 | 0.07 |
| | 24 B-4 | 0.80 | 0.20 | 1.00 | 0.80 | 0.20 | 1.00 | 0.01 | 8.0 | 20.0 | 20.0 | 16.5 | balance | 4.0 | 22.6 | 0.16 | 0.13 | 0.11 |
| | 25 B-5 | 0.70 | 0.30 | 1.00 | 0.75 | 0.25 | 1.00 | 0.02 | 10.0 | 10.0 | 0.5 | 10.0 | balance | 5.0 | 28.3 | 0.19 | 0.04 | 0.05 |
| | 26 B-6 | 0.65 | 0.35 | 1.00 | 0.65 | 0.35 | 1.00 | 0.04 | 8.0 | 40.0 | 4.0 | 30.0 | balance | 10.0 | 5.2 | 0.1 | 0.2 | 0.21 |

No.: hard metal substrate number,
Set thick: Set thickness,
Cut cond.: cutting condition

TABLE 29

| | | Lower layer [(Al/Ti)N layer] | | | | | | Set interval between two portion (μm) | Se thick (μm) | Amorphous carbon based lubricant coating Set composition (atomic %) | |
|---|---|---|---|---|---|---|---|---|---|---|---|
| | | maximum Al content Set composition (atomic %) | | | maximum Ti content Set composition (atomic %) | | | | | | |
| Type | No. | Al | Ti | N | Ti | Al | N | | | W | Ti |
| COATED | 27 A-1 | 0.95 | 0.05 | 1.00 | 0.95 | 0.05 | 1.00 | 0.01 | 9.0 | 5.0 | 10.0 |
| HARD METAL | 28 A-2 | 0.90 | 0.10 | 1.00 | 0.85 | 0.15 | 1.00 | 0.06 | 5.0 | 10.0 | 8.0 |
| INSERT OF | 29 A-3 | 0.85 | 0.15 | 1.00 | 0.70 | 0.30 | 1.00 | 0.03 | 7.0 | 15.0 | 4.0 |
| THE INVENTION | 30 A-4 | 0.80 | 0.20 | 1.00 | 0.90 | 0.10 | 1.00 | 0.10 | 9.0 | 20.0 | 10.0 |

TABLE 29-continued

|   | No. | | | | | | | | | | |
|---|---|---|---|---|---|---|---|---|---|---|---|
| | 31 | A-5 | 0.75 | 0.25 | 1.00 | 0.75 | 0.25 | 1.00 | 0.07 | 6.0 | 5.0 | 10.0 |
| | 32 | A-6 | 0.60 | 0.30 | 1.00 | 0.80 | 0.20 | 1.00 | 0.02 | 7.0 | 10.0 | 7.5 |
| | 33 | A-7 | 0.65 | 0.35 | 1.00 | 0.85 | 0.35 | 1.00 | 0.04 | 6.0 | 15.0 | 5.0 |
| | 34 | A-8 | 0.90 | 0.10 | 1.00 | 0.90 | 0.10 | 1.00 | 0.09 | 8.0 | 20.0 | 2.5 |
| | 35 | A-9 | 0.80 | 0.20 | 1.00 | 0.80 | 0.20 | 1.00 | 0.05 | 5.0 | 5.0 | 2.5 |
| | 36 | A-10 | 0.70 | 0.30 | 1.00 | 0.75 | 0.25 | 1.00 | 0.08 | 10.0 | 10.0 | 6.0 |
| | 37 | B-1 | 0.90 | 0.10 | 1.00 | 0.95 | 0.05 | 1.00 | 0.04 | 7.0 | 15.0 | 10.0 |
| | 38 | B-2 | 0.85 | 0.15 | 1.00 | 0.55 | 0.35 | 1.00 | 0.10 | 5.0 | 20.0 | 2.5 |
| | 39 | B-3 | 0.80 | 0.20 | 1.00 | 0.80 | 0.20 | 1.00 | 0.01 | 8.0 | 5.0 | 10.0 |
| | 40 | B-4 | 0.75 | 0.25 | 1.00 | 0.90 | 0.10 | 1.00 | 0.06 | 10.0 | 10.0 | 7.5 |
| | 41 | B-5 | 0.70 | 0.30 | 1.00 | 0.75 | 0.25 | 1.00 | 0.02 | 8.0 | 15.0 | 5.0 |
| | 42 | B-6 | 0.65 | 0.35 | 1.00 | 0.85 | 0.15 | 1.00 | 0.08 | 9.0 | 20.0 | 7.5 |

| Type | | Amorphous carbon based lubricant coating | | | Set thick (μm) | Grain diameter of (T, Al) (C, N) based crystal (nm) | Cut cond. A | Cut cond. B | Cut cond. C |
|---|---|---|---|---|---|---|---|---|---|
| | | Set composition (atomic %) | | | | | | | |
| | | Al | N | C+ impurities | | | | | |
| COATED | 27 | 15.0 | 23.5 | balance | 7.0 | 33.4 | 0.1 | 0.11 | 0.22 |
| HARD METAL | 28 | 12.0 | 12.0 | balance | 9.0 | 25.3 | 0.14 | 0.15 | 0.25 |
| INSERT OF | 29 | 6.0 | 3.0 | balance | 8.0 | 22.1 | 0.13 | 0.14 | 0.23 |
| THE INVENTION | 30 | 15.0 | 2.5 | balance | 6.0 | 12.5 | 0.09 | 0.1 | 0.2 |
| | 31 | 10.0 | 18.0 | balance | 8.0 | 8.6 | 0.13 | 0.14 | 0.24 |
| | 32 | 7.5 | 13.5 | balance | 7.0 | 5.9 | 0.11 | 0.12 | 0.22 |
| | 33 | 5.0 | 3.0 | balance | 7.0 | 29.3 | 0.12 | 0.13 | 0.23 |
| | 34 | 2.5 | 0.5 | balance | 8.0 | 26.4 | 0.1 | 0.11 | 0.21 |
| | 35 | 1.6 | 0.4 | balance | 10.0 | 16.9 | 0.14 | 0.15 | 0.25 |
| | 36 | 4.0 | 6.0 | balance | 5.0 | 14.3 | 0.08 | 0.09 | 0.19 |
| | 37 | 6.7 | 5.0 | balance | 8.0 | 9.6 | 0.13 | 0.15 | 0.23 |
| | 38 | 1.6 | 3.7 | balance | 10.0 | 11.8 | 0.14 | 0.14 | 0.25 |
| | 39 | 10.0 | 10.0 | balance | 7.0 | 20.6 | 0.1 | 0.11 | 0.22 |
| | 40 | 7.5 | 7.5 | balance | 5.0 | 6.4 | 0.09 | 0.1 | 0.2 |
| | 41 | 5.0 | 5.0 | balance | 9.0 | 39.9 | 0.14 | 0.15 | 0.24 |
| | 42 | 7.5 | 7.5 | balance | 6.0 | 19.6 | 0.1 | 0.09 | 0.21 |

No.: hard metal substrate number,
Set thick: Set thickness,
Cut cond.: cutting condition

TABLE 30

| | | | Surface coating layer | | | | | | | |
|---|---|---|---|---|---|---|---|---|---|---|
| | | | Lower layer | | Upper layer (amorphous carbon based lubricant layer) | | | | | |
| | Hard metal substrate number | | [(Ti, Al) N layer] | | Set composition (atomic %) | | | | | Set thickness (μm) |
| | | | Set composition (atomic %) | | Set thickness (μm) | | | | | |
| Type | | | Ti | Al | N | | W | Ti | N | C+ impurities | |
| COMPARATIVE | 1 | A-1 | 0.50 | 0.50 | 1.00 | 8 | 5 | — | — | balance | 7 |
| HARD METAL | 2 | A-2 | 0.55 | 0.45 | 1.00 | 5 | 10 | — | — | balance | 9 |
| INSERT | 3 | A-3 | 0.60 | 0.40 | 1.00 | 7 | 15 | — | — | balance | 8 |
| | 4 | A-4 | 0.40 | 0.60 | 1.00 | 9 | 20 | — | — | balance | 6 |
| | 5 | A-5 | 0.45 | 0.55 | 1.00 | 6 | 5 | — | — | balance | 8 |
| | 6 | A-6 | 0.60 | 0.40 | 1.00 | 7 | 10 | — | — | balance | 7 |
| | 7 | A-7 | 0.50 | 0.50 | 1.00 | 6 | 15 | — | — | balance | 7 |
| | 8 | A-8 | 0.55 | 0.45 | 1.00 | 8 | 20 | — | — | balance | 6 |
| | 9 | A-9 | 0.40 | 0.60 | 1.00 | 5 | 10 | — | — | balance | 10 |
| | 10 | A-10 | 0.45 | 0.55 | 1.00 | 10 | 15 | — | — | balance | 5 |
| | 11 | B-1 | 0.60 | 0.40 | 1.00 | 7 | 5 | — | — | balance | 8 |
| | 12 | B-2 | 0.50 | 0.50 | 1.00 | 5 | 10 | — | — | balance | 10 |
| | 13 | B-3 | 0.45 | 0.55 | 1.00 | 8 | 15 | — | — | balance | 7 |
| | 14 | B-4 | 0.55 | 0.45 | 1.00 | 10 | 20 | — | — | balance | 5 |
| | 15 | B-5 | 0.50 | 0.50 | 1.00 | 6 | 10 | — | — | balance | 9 |
| | 16 | B-6 | 0.60 | 0.40 | 1.00 | 9 | 15 | — | — | balance | 6 |

Example 8

As constituent powders, medium to coarse grained WC powder having an average grain diameter of 4.6 μm, fine grained WC powder of average grain diameter: 0.8 μm, TaC powder of average grain diameter: 1.3 μm, NbC powder of average grain diameter; 1.2 μm, ZrC powder of average grain diameter-1.2 μm, $Cr_3C_2$ powder of average grain diameter: 2.3 μm, VC powder of average grain diameter: 1.5 Sun, (Ti, W)C (TiC/WC=50/50 in weight ratio) powder of average grain diameter: 1.0 μm, and Co powder of average grain diameter: 1.8 μm were prepared. These constituent powders were mixed in accordance with the compounding ratios presented in Table 31, added to wax and blended for 24 hours in acetone by a ball mill. After vacuum drying the mixed powder, the mixed powder was press-molded at a pressure of 100 MPa into various compacts each of which having a predetermined form. The compacts were sintered by conditions including: in a vacuum condition of 6 Pa, heating the compacts at a heating rate of 7° C./minutes to a predetermined temperature within a range of 1370 to 1470° C., maintaining the compacts at the above-described temperature for 1 hour, and furnace cooling the compacts. Thus, tree types of round bar sintered bodies for forming a hard metal substrate, respectively having a diameter of 8 mm, 13 mm, or 26 mm were formed. By grinding the three types of sintered round bars, hard metal substrates (end mill) C-1 to C-8 were produced to have a four edge square form with an angle of torsion of 30', and diameter×length of the cutting edge of 6 mm×13 mm, 10 mm×22 mm, or 20 mm×45 mm.

Next, these hard metal substrates (end mills) C-1 to C-8 were subjected to ultrasonic cleaning in an acetone bath. After drying, the hard metal substrates were placed in an arc ion plating apparatus shown in FIGS. 4A and 4B. Under the same conditions as the above-described Example 7, a (Al/Ti)N layer having a set thickness shown in Tables 32 and 33 was formed on each hard metal substrate as a lower layer (hard layer) of a surface coating layer. Each lower layer had a variable composition structure in which portions of maximum Ti content and portions of maximum Al content appeared with set composition shown in Tables 32 and 33 alternately and repeatedly with a designated interval shown in Tables 32 and 33, and Al and Ti content changed continuously from the portion of maximum Ti content to the portion of maximum Al content, and from the portion of maximum Al content to the portion of maximum Ti content. Next, the above-described hard metal substrates provided with lower layers (hard layers) were placed in the deposition apparatus shown in FIGS. 2A and 2B, or in FIGS. 3A and 3B, and amorphous carbon based lubricant layer having a set thickness shown in Tables 32 and 33 were deposited as upper layers. By the above-described process, end mills 1 to 19 made of surface-coated hard metal of the invention hereafter referred to as coated end mills of the invention) were produced as coated hard metal tools of the invention.

In addition, as a comparative example, the above-described hard metal substrates (end mills) C-1 to C-8 were subjected to ultrasonic cleaning in an acetone bath. After drying, the hard metal substrates were placed in a deposition apparatus shown in FIG. 6. Under the same conditions as Example 7, on the surface of respective substrates, a (Ti, Al)N layer and an amorphous carbon based lubricant layer, having a set composition wad thickness shown in Table 34 were deposited as a lower layer and an upper layer. By the above-described process, comparative end mills 1 to 8, made of surface-coated hard metal (hereafter referred to as comparative coated end mill) were produced as conventional coated hard metal tools.

Next, in the above-described coated end mills 1 to 19 of the invention, and comparative coated end mills 1 to 8 were applied to tests of high-speed dry grooving.

The coated end mills 1 to 3, 9, 12 to 14 of the invention, and comparative coated end mills 1 to 3 were applied to tests of grooving of a Cu alloy under high-speed, high slitting, dry conditions comprising (compared with normal cutting speed and groove depth of 150 m/min and 2 mm):

workpiece: a plate of JIS-C3710 having a plate dimension of 100 mm×250 mm and a thickness of 50 mm;
cutting speed: 180 m/min;
groove depth (depth of cut): 5 mm;
table feed: 485 m/minute.

The coated 1 end mills 4 to 6, 10, 15 to 17 of the invention, and comparative coated end mills 4 to 6 were applied to tests of grooving of a Ti alloy under high-speed, high slitting, dry conditions comprising (compared with normal cutting speed and groove depth of 150 m/min and 4 mm):

workpiece: a plate of JIS-TP340H having a plate dimension of 100 mm×250 mm and a thickness of 50 mm;
cutting speed: 135 n/min;
groove depth (depth of cut): 8.1 mm;
table feed: 455 mm/minute.

The coated end mills 7, 8, 11, 18 and 19 of the Invention, and comparative coated end mills 7 and 3 were applied to tests of grooving of an Al alloy under high-speed, high feed, dry conditions comprising (compared with normal cutting speed and groove depth of 180 m/min and 8 mm):

workpiece: a plate of JIS-A5052 having a plate dimension of 100 mm×250 mm and a thickness of 50 mm;
cutting speed: 205 m/min;
groove depth (depth of cut): 16 mm;
table feed: 500 n minute.

In each test of grooving, length of cut by the end mill until a working lifetime of the end mill was measured. In each case of the grooving, the end mill was regarded to reach its lifetime when a width of flank wear of a peripheral edge of a cutting edge of the end mill reached 0.1 mm. The results of the measurements are listed in Tables 32 to 34.

TABLE 31

| Type | | Co | (Ti, W)C | TaC | NbC | ZrC | Cr3C2 | VC | WC | Diameter × length of cutting edge (mm) |
|---|---|---|---|---|---|---|---|---|---|---|
| COATED HARD METAL SUBSTRATE (END MILL) | C-1 | 5 | 5 | — | — | — | — | — | medium-coarse grain: balance | 6 × 13 |
| | C-2 | 6 | — | 1 | 0.5 | — | — | — | fine grain: balance | 6 × 13 |
| | C-3 | 6 | — | 1 | — | 1 | 0.5 | 0.5 | fine grain: balance | 6 × 13 |
| | C-4 | 8 | — | — | — | — | 0.5 | 0.5 | fine grain: balance | 10 × 22 |
| | C-5 | 9 | 25 | 10 | 1 | — | — | — | medium-coarse grain: balance | 10 × 22 |

TABLE 31-continued

| | | Composition (% by weight) | | | | | | | Diameter × length of cutting edge |
|---|---|---|---|---|---|---|---|---|---|
| Type | | Co | (Ti,W)C | TaC | NbC | ZrC | Cr3C2 | VC WC | (mm) |
| | C-6 | 10 | — | — | — | — | 1 | — fine grain: balance | 10 × 22 |
| | C-7 | 12 | 17 | 9 | 1 | — | — | — medium-coarse grain: balance | 20 × 45 |
| | C-8 | 16 | — | 10 | 5 | 10 | — | — medium-coarse grain: balance | 20 × 45 |

TABLE 32

| | | | Lower layer [(Al/Ti)N layer] | | | | | | Upper layer (amorphous carbon based lubricant coating) | | | | | Grain | |
|---|---|---|---|---|---|---|---|---|---|---|---|---|---|---|---|---|
| | | | maximum Al content Set composition (atomic %) | | | maximum Ti content Set composition (atomic %) | | | Set interval between two portion (μm) | Set thick (μm) | Set composition (atomic %) | | | | Set thick (μm) | diameter of Ti(C, N) based crystal (nm) | Cutting length (m) |
| Type | No. | | Al | Ti | N | Ti | Al | N | | | W | Ti | N | C+ impurities | | | |
| COATED | 1 | C-1 | 0.85 | 0.15 | 1.00 | 0.80 | 0.30 | 1.00 | 0.09 | 1.5 | 20.0 | 20.0 | 10.0 | balance | 1 | 25.4 | 117 |
| HARD | 2 | C-2 | 0.70 | 0.30 | 1.00 | 0.90 | 0.10 | 1.00 | 0.06 | 3.0 | 10.0 | 15.0 | 13.5 | balance | 3 | 23.6 | 143 |
| METAL | 3 | C-3 | 0.95 | 0.05 | 1.00 | 0.70 | 0.30 | 1.00 | 0.02 | 2.0 | 5.0 | 5.0 | 1.0 | balance | 2 | 18.8 | 129 |
| END WILL | 4 | C-4 | 0.65 | 0.35 | 1.00 | 0.95 | 0.05 | 1.00 | 0.01 | 4.0 | 5.0 | 5.0 | 0.5 | balance | 4 | 32.5 | 68 |
| OF THE | 5 | C-5 | 0.90 | 0.10 | 1.00 | 0.85 | 0.15 | 1.00 | 0.05 | 2.0 | 10.0 | 10.0 | 5.0 | balance | 2 | 24.1 | 53 |
| INVENTION | 6 | C-6 | 0.80 | 0.20 | 1.00 | 0.65 | 0.35 | 1.00 | 0.01 | 3.0 | 20.0 | 20.0 | 18.0 | balance | 3 | 39.1 | 64 |
| | 7 | C-7 | 0.75 | 0.25 | 1.00 | 0.70 | 0.30 | 1.00 | 0.03 | 5.0 | 15.0 | 15.0 | 10.0 | balance | 4 | 24.5 | 148 |
| | 8 | C-8 | 0.90 | 0.10 | 1.00 | 0.90 | 0.10 | 1.00 | 0.07 | 5.0 | 10.0 | 10.0 | 2.5 | balance | 2 | 16.5 | 140 |
| | 9 | C-1 | 0.95 | 0.05 | 1.00 | 0.70 | 0.30 | 1.00 | 0.02 | 2.0 | 10.0 | 0.5 | 10.0 | balance | 5 | 7.9 | 144 |
| | 10 | C-4 | 0.90 | 0.10 | 1.00 | 0.85 | 0.15 | 1.00 | 0.05 | 2.0 | 40.0 | 4.0 | 30.0 | balance | 4 | 13.6 | 65 |
| | 11 | C-7 | 0.75 | 0.25 | 1.00 | 0.70 | 0.30 | 1.00 | 0.03 | 5.0 | 30.0 | 30.0 | 25.0 | balance | 6 | 38.6 | 108 |

No.: hard metal substrate number,
Set thick: Set thickness

TABLE 33

| | | | Lower layer [(A/Ti)N layer] | | | | | | Upper layer (amorphous carbon based lubricant layer) | | | | | | Grain | |
|---|---|---|---|---|---|---|---|---|---|---|---|---|---|---|---|---|---|
| | | | maximum Al content Set composition (atomic %) | | | maximum Ti content Set composition (atomic %) | | | Set interval between two portion (μm) | Set thick (μm) | Set composition (atomic %) | | | | C+ impuri- ties | Set thick (μm) | diameter of (Ti, Al) (C, N) based crystal (nm) | Cutting length (m) |
| Type | No. | | Al | Ti | N | Ti | Al | N | | | W | Ti | Al | N | | | | |
| COATED | 12 | C-1 | 0.85 | 0.15 | 1.00 | 0.80 | 0.20 | 1.00 | 0.09 | 1.5 | 10.0 | 10.0 | 5.7 | 1.5 | balance | 1 | 14.3 | 128 |
| HARD | 13 | C-2 | 0.70 | 0.30 | 1.00 | 0.90 | 0.10 | 1.00 | 0.06 | 3.0 | 20.0 | 10.0 | 10.0 | 18.0 | balance | 3 | 10.5 | 158 |
| METAL | 14 | C-3 | 0.95 | 0.05 | 1.00 | 0.70 | 0.30 | 1.00 | 0.02 | 2.0 | 5.0 | 10.0 | 15.0 | 22.5 | balance | 2 | 32.6 | 139 |
| END | 15 | C-4 | 0.65 | 0.35 | 1.00 | 0.95 | 0.05 | 1.00 | 0.01 | 4.0 | 10.0 | 5.0 | 8.0 | 8.5 | balance | 4 | 12.4 | 76 |
| WILL | 16 | C-5 | 0.90 | 0.10 | 1.00 | 0.85 | 0.15 | 1.00 | 0.05 | 2.0 | 20.0 | 7.5 | 7.5 | 4.5 | balance | 2 | 7.6 | 56 |
| OF THE | 17 | C-6 | 0.80 | 0.20 | 1.00 | 0.65 | 0.35 | 1.00 | 0.01 | 3.0 | 5.0 | 2.5 | 1.6 | 0.4 | balance | 3 | 21.6 | 71 |
| INVEN- | 18 | C-7 | 0.75 | 0.25 | 1.00 | 0.70 | 0.30 | 1.00 | 0.03 | 5.0 | 10.0 | 4.5 | 5.5 | 0.7 | balance | 4 | 11.6 | 158 |
| TION | 19 | C-8 | 0.90 | 0.10 | 1.00 | 0.90 | 0.10 | 1.00 | 0.07 | 5.0 | 15.0 | 5.5 | 4.5 | 0.8 | balance | 2 | 10.7 | 163 |

No.: hard metal substrate number,
Set thick: Set thickness

TABLE 34

| | | Surface coating layer | | | | | | | | | |
|---|---|---|---|---|---|---|---|---|---|---|---|
| | | Lower layer | | | | Upper layer (amorphous carbon based lubricant layer) | | | | | |
| | | [(Ti, Al) N layer] | | | | Set composition | | | | | |
| | Hard metal | Set composition | | | Set | (atomic %) | | | | Set | |
| | substrate | (atomic %) | | | thickness | | | | C+ | thickness | Groove |
| Type | number | Ti | Al | N | (μm) | W | Ti | N | impurities | (μm) | length |
| COMPARATIVE | 1 | C-1 | 0.45 | 0.55 | 1.00 | 1.5 | 20 | — | — | balance | 1 | 36 m* |
| HARD METAL | 2 | C-2 | 0.55 | 0.45 | 1.00 | 3 | 10 | — | — | balance | 3 | 48 m* |
| END WILL | 3 | C-3 | 0.40 | 0.60 | 1.00 | 2 | 5 | — | — | balance | 2 | 41 m* |
| | 4 | C-4 | 0.60 | 0.40 | 1.00 | 4 | 5 | — | — | balance | 4 | 22 m* |
| | 5 | C-5 | 0.50 | 0.50 | 1.00 | 2 | 10 | — | — | balance | 2 | 14 m* |
| | 6 | C-6 | 0.40 | 0.60 | 1.00 | 3 | 20 | — | — | balance | 3 | 18 m* |
| | 7 | C-7 | 0.55 | 0.45 | 1.00 | 5 | 15 | — | — | balance | 4 | 56 m* |
| | 8 | C-8 | 0.45 | 0.55 | 1.00 | 5 | 10 | — | — | balance | 2 | 51 m* |

(Symbols * in the table denotes a groove length until a time that a tool reaches an end of a working lifetime due to chipping in the surface coating)

Example 9

Using the three types of round bar sintered body being produced in the above-described Example 8 and having a diameter of 8 mm (for forming had metal substrates C-1 to C-3), 13 mm (for forming hard metal substrates C-4 to C-6), or 26 mm (for forming hard metal substrates C-7 and C-8), hard metal substrates (drills) D-1 to D-8 were produced by grinding the round bars. Each of the hard metal substrates had a two teeth form with an angle of torsion of 300, and a diameter×length of a flute forming portion of 4 mm×13 mm (hard metal substrates D-1 to D-3), 8 mm×22 mm (had metal substrates D-4 to D-6), and 16 mm×45 mm (hard metal substrates D-7 and D-8).

Next, after honing of cutting edges, the hard metal substrates (drills) 1>1 to D-X were subjected to ultrasonic cleaning in an acetone bath. After that, at a dried state, the hard metal substrates were placed in the arc-ion plating apparatus shown in FIGS. 4A and 4B. Under the same conditions as the above-described Example 7, a (Al/Ti)N layer having a set thickness shown in Tables 35 and 36 was formed on each hard metal substrate as a lower layer (hard layer) of a surface coating layer. Each lower layer had a variable composition structure in which portions of maximum T content and portions of maximum Al content appeared with set composition shown in Tables 35 and 36 alternately and repeatedly with a designated interval shown in Tables 35 and 36, and Al and Ti content changed continuously from the portion of maximum Ti content to the portion of maximum Al content, and from the portion of maximum Al content to the portion of maximum Ti content. Next, the above-described hard metal substrates provided with lower layers (hard layers) were placed in the deposition apparatus shown in FIGS. 2A and 2B, or in FIGS. 3A and 3B, and amorphous carbon based lubricant layer having a set thickness shown in Tables 35 and 36 were deposited as upper layers. By the above-described process, drills 1 to 19 made of surface-coated hard metal of the invention (hereafter referred to as coated drills of the invention) were produced as coated hard metal tools of the invention.

In addition, as a comparative example, cutting edges of the hard metal substrates (drills) D-1 to D-8 were subjected to honing. The above-described hard metal substrates were subjected to ultrasonic cleaning in an acetone bath. After drying, the hard metal substrates were placed in a deposition apparatus shown in FIG. 6. Under the same conditions as Example 7, a (Ti, Al)N layer and an amorphous carbon based lubricant layer, having compositions and thickness shown in Table 37 were deposited as a lower layer and an upper layer. By the above-described process, comparative drills 1 to 8, made of surface-coated hard metal (hereafter referred to as comparative coated drills) were produced as conventional coated hard metal tools.

Next, the above-described coated drills 1 to 19 of the invention, and comparative coated drills 1 to 8 were applied to tests of high-speed wet drilling.

The coated drills 1 to 3, 9, 12 to 14 of the invention, and comparative coated drills 1 to 3 were applied to tests of high-speed, high feed (compared with normal cutting speed and feed of 80 m/min and 0.2 mm/rev) wet drilling of an Al alloy under conditions comprising:

workpiece: a plate of JIS-A5052 having a plate dimension of 100 mm×250 mm and a thickness of 50 mm;

drilling speed: 115 m/min;

feed: 0.52 mm/rev; and depth of a hole: 6 mm.

The coated drills 4 to 6, 10, 15 to 17 of the invention, and comparative coated drills 4 to 6 were applied to tests of high-speed, high feed (compared with normal cutting speed and feed of 80 m/min and 0.25 mm/rev) wet drilling of a Cu alloy under conditions comprising:

workpiece: a plate of JIS-C3710 having a plate dimension of 100 mm×250 mm and a thickness of 50 mm;

drilling speed: 110 m/min;

feed: 0.57 mm/rev; and a depth of a hole: 12 mm.

The coated drills 7, 8, 11, 18 and 19 of the invention, and comparative coated drills 7 and 8 were applied to tests of high-speed, high feed (compared with normal cutting speed and feed of 40 m/min and 0.2 mm/rev) wet drilling of a Ti alloy under conditions comprising:

workpiece: a plate of JIS-TP340H having a plate dimension of 10 mm×250 mm and a thickness of 50 mm;

drilling speed: 65 m/min;

feed: 0.52 mm/rev; and depth of a hole: 20 mm.

In each test of the high-speed high feed wet drilling (using a water-soluble cutting fluid), the numbers of holes drilled until the time when the width of flank wear of the cutting edge of the end of the drill reached 0.3 mm were counted. The results are listed in Table 35 to 37.

TABLE 35

| | | | Lower layer [(Al/Ti)N layer] | | | | | | | Amorphous carbon based lubricant coating | | | | | |
|---|---|---|---|---|---|---|---|---|---|---|---|---|---|---|---|
| | | Hard metal substrate number | maximum Al content Set composition (atomic %) | | | maximum Ti content Set composition (atomic %) | | | Set interval between two portion (μm) | Set thick (μm) | Set composition (atomic %) | | | | Set thick (μm) | Grain diameter of Ti (C, N) based crystal (nm) | Number of drilling (holes) |
| Type | | | Al | Ti | N | Ti | Al | N | | | W | Ti | N | C+ impurities | | | |
| COATED HARD METAL DRILL OF THE INVENTION | 1 | D-1 | 0.75 | 0.15 | 1.00 | 0.75 | 0.15 | 1.00 | 0.10 | 5.0 | 5.0 | 5.0 | 0.5 | balance | 5.0 | 14.9 | 10305 |
| | 2 | D-2 | 0.90 | 0.05 | 1.00 | 0.70 | 0.25 | 1.00 | 0.04 | 4.0 | 15.0 | 15.0 | 7.5 | balance | 4.0 | 9.8 | 9764 |
| | 3 | D-3 | 0.65 | 0.25 | 1.00 | 0.80 | 0.05 | 1.00 | 0.01 | 3.0 | 20.0 | 20.0 | 18.0 | balance | 3.0 | 30.2 | 8926 |
| | 4 | D-4 | 0.75 | 0.20 | 1.00 | 0.75 | 0.20 | 1.00 | 0.03 | 7.0 | 5.0 | 20.0 | 14.0 | balance | 4.0 | 23.8 | 5839 |
| | 5 | D-5 | 0.80 | 0.10 | 1.00 | 0.65 | 0.25 | 1.00 | 0.06 | 6.0 | 10.0 | 15.0 | 4.5 | balance | 3.0 | 14.2 | 5423 |
| | 6 | D-6 | 0.80 | 0.05 | 1.00 | 0.75 | 0.10 | 1.00 | 0.09 | 5.0 | 15.0 | 10.0 | 0.1 | balance | 3.0 | 17.4 | 5289 |
| | 7 | D-7 | 0.80 | 0.10 | 1.00 | 0.65 | 0.25 | 1.00 | 0.02 | 5.0 | 10.0 | 15.0 | 10.5 | balance | 3.0 | 17.9 | 3029 |
| | 8 | D-8 | 0.60 | 0.25 | 1.00 | 0.90 | 0.05 | 1.00 | 0.07 | 7.0 | 20.0 | 5.0 | 1.5 | balance | 5.0 | 7.6 | 3304 |
| | 9 | D-2 | 0.95 | 0.05 | 1.00 | 0.70 | 0.30 | 1.00 | 0.02 | 2.0 | 10.0 | 0.5 | 10.0 | balance | 5 | 8.1 | 8877 |
| | 10 | D-5 | 0.90 | 0.10 | 1.00 | 0.85 | 0.15 | 1.00 | 0.05 | 2.0 | 40.0 | 4.0 | 30.0 | balance | 4 | 14.6 | 5055 |
| | 11 | D-8 | 0.75 | 0.25 | 1.00 | 0.70 | 0.30 | 1.00 | 0.03 | 5.0 | 10.0 | 30.0 | 25.0 | balance | 6 | 31.6 | 3175 |

TABLE 36

| | | | Lower layer [(Al/Ti)N layer] | | | | | | | | Amorphous carbon based lubricant coating | | | | | | |
|---|---|---|---|---|---|---|---|---|---|---|---|---|---|---|---|---|---|
| Type | No. | | Set composition (atomic %) | | | Set composition (atomic %) | | | Set interval between two portion (μm) | Set thick (μm) | Set composition (atomic %) | | | | C+ impurities | Set thick (μm) | Grain diameter of (Ti, Al) (C, N) based crystal (nm) | Number of drilling (holes) |
| | | | Al | Ti | N | Ti | Al | N | | | W | Ti | Al | N | | | | |
| COATED HARD METAL DRILL OF THE INVENTION | 12 | D-1 | 0.75 | 0.15 | 1.00 | 0.75 | 0.15 | 1.00 | 0.10 | 5.0 | 5.0 | 10.0 | 15.0 | 22.5 | balance | 5.0 | 13.9 | 10698 |
| | 13 | D-2 | 0.90 | 0.05 | 1.00 | 0.70 | 0.25 | 1.00 | 0.04 | 4.0 | 10.0 | 10.0 | 10.0 | 14.0 | balance | 4.0 | 10.5 | 10045 |
| | 14 | D-3 | 0.65 | 0.25 | 1.00 | 0.80 | 0.05 | 1.00 | 0.01 | 3.0 | 15.0 | 10.0 | 6.7 | 8.3 | balance | 3.0 | 7.1 | 9204 |
| | 15 | D-4 | 0.75 | 0.20 | 1.00 | 0.75 | 0.20 | 1.00 | 0.03 | 7.0 | 10.0 | 5.0 | 8.0 | 3.9 | balance | 4.0 | 24.9 | 6073 |
| | 16 | D-5 | 0.80 | 0.10 | 1.00 | 0.65 | 0.25 | 1.00 | 0.06 | 6.0 | 15.0 | 7.5 | 7.5 | 9.0 | balance | 3.0 | 21.9 | 5632 |
| | 17 | D-6 | 0.80 | 0.05 | 1.00 | 0.75 | 0.10 | 1.00 | 0.09 | 5.0 | 20.0 | 2.5 | 1.6 | 0.4 | balance | 3.0 | 16.3 | 5496 |
| | 18 | D-7 | 0.80 | 0.10 | 1.00 | 0.65 | 0.25 | 1.00 | 0.02 | 5.0 | 15.0 | 4.5 | 5.5 | 4.0 | balance | 3.0 | 10.2 | 3140 |
| | 19 | D-8 | 0.60 | 0.25 | 1.00 | 0.90 | 0.05 | 1.00 | 0.07 | 7.0 | 10.0 | 5.5 | 4.5 | 7.0 | balance | 5.0 | 32.4 | 3429 |

No.: hard metal substrate number,
Set thick: Set thickness,

TABLE 37

| | | | Surface coating layer | | | | | | | | |
|---|---|---|---|---|---|---|---|---|---|---|---|
| | | | Lower layer [(Ti, Al) N layer] | | | | Upper layer (amorphous carbon based lubricant layer) | | | | |
| Type | | Hard metal substrate number | Set composition (atomic %) | | | Set thickness (μm) | Set composition (atomic %) | | | Set thickness (μm) | Number of drilling |
| | | | Ti | Al | N | | W | Ti | N | C+ impurities | | |
| COMPARATIVE COATED HARD | 1 | D-1 | 0.55 | 0.45 | 1.00 | 5 | 5 | — | — | balance | 5 | 4122 holes* |
| | 2 | D-2 | 0.45 | 0.55 | 1.00 | 4 | 15 | — | — | balance | 4 | 4081 holes* |

TABLE 37-continued

| | | Surface coating layer | | | | | | | | | |
|---|---|---|---|---|---|---|---|---|---|---|---|
| | | Lower layer [(Ti, Al) N layer] | | | | Upper layer (amorphous carbon based lubricant layer) | | | | | |
| | | Set composition (atomic %) | | | Set thickness | Set composition (atomic %) | | | | Set thickness | Number of |
| Type | Hard metal substrate number | Ti | Al | N | (μm) | W | Ti | N | C+ impurities | (μm) | drilling |
| METAL DRILL | 3 | 0.50 | 0.50 | 1.00 | 3 | 20 | — | — | balance | 3 | 3659 holes* |
| | 4 | 0.60 | 0.40 | 1.00 | 7 | 5 | — | — | balance | 4 | 2336 holes* |
| | 5 | 0.50 | 0.50 | 1.00 | 6 | 10 | — | — | balance | 3 | 2223 holes* |
| | 6 | 0.40 | 0.80 | 1.00 | 5 | 15 | — | — | balance | 3 | 2115 holes* |
| | 7 | 0.55 | 0.45 | 1.00 | 5 | 10 | — | — | balance | 3 | 1211 holes* |
| | 8 | 0.45 | 0.55 | 1.00 | 7 | 20 | — | — | balance | 5 | 1359 holes* |

(Symbols * in the table denotes a numbers of drilling until a time that respective tool reaches an end of a working lifetime due to occurrence of chipping in the surface coating)

As described above, coated hard metal inserts 1 to 42 of the invention, coated hard metal end mills 1 to 19 of the invention, and coated hard metal drills 1 to 19 of the invention as hard metal tools of the invention, and comparative hard metal inserts 1 to 16, comparative coated hard metal end mills 1 to 8, and comparative hard metal drills 1 to 8, as conventional coated hard metal tools were obtained. The (Al/Ti)N layer and (Ti,Al)N layer as a lower layer of the surf-ace coating layer of each of the above-described coated carbide tools were subjected to analysis of Al and Ti compositions along the direction of thickness by an Auger electron spectrometer and measurement of the thickness using a scanning electron microscope. As a result, it was confirmed that the (Al/Ti)N layers of the hard metal tools of the invention respectively had a variable composition structure in which portions of the maximum Ti content and portions of the maximum Al content appeared alternately and repeatedly with an interval, and the Al and Ti content changed continuously from the portion of the maximum Ti content to the portion of the maximum Al content, and from the portion of maximum Al content to the portion of the maximum Ti content. The maximum T content, maximum Al content, and the interval of the variable composition structure were substantially similar to set composition and interval. In addition, the average thickness of the (Al/Ti) layer was also similar to the set layer thickness. The (Ti Al)N layers of the conventional coated hard metal tools showed compositions and layer thickness substantially similar to those of the set compositions and thickness. On the other hand, the (Ti, Al) N layer showed a homogeneous composition throughout whole layer without showing compositional variation along the thickness.

In addition, lubricant layers of amorphous carbon as upper layers of the coated hard metal tools were also subjected to analysis of composition using an Auger electron spectrometer and measurement of thickness using a scanning electron microscope. The composition and average thickness (average value measured from 5 points in a section) of each layer were substantially similar to the set composition and set thickness. In addition, under an observation of the texture of the upper layer using a transmission electron microscope, the coated hard metal tools of the invention showed a texture of the upper layer in which fine grains of crystalline Ti (C,N) based compounds were dispersively distributed in the matrix of a carbon based amorphous material, while the conventional coated hard metal tool showed a texture of the upper layer composed of a single phase of a carbon based amorphous material.

As shown in the results listed in Tables 28 to 37, even in the case of high-speed heavy cutting of a non-ferrous material accompanied by the generation of a remarkably high temperature and high mechanical impact, in the coated hard metal tools of the invention, the (Al/Ti)N layer as the lower layer of the surface coating showed excellent high-temperature hardness, heat resistance, and high-temperature strength, and the amorphous carbon based lubricant layer bad a tee in which fine-grained Ti(C,N) based compounds were dispersively distributed in the matrix of the carbon based amorphous material containing W and provided with excellent high temperature strength, thereby showing excellent wear resistance for a long period of time without causing chipping in the surface coating layer. On the other hand, in the conventional coated cutting tools respectively provided with a surface coating comprising a lower layer of (Ml, Al)N layer and an upper layer of a mono-phase layer of a carbon based amorphous material showed rapid progress of wear of the surface coating and generation of chipping, thereby obviously indicating a relatively short working lifetime during high-speed heavy cutting of non-ferrous materials.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

As described-above, the coated cutting tools of the invention show excellent wear resistance in the cutting of various workpieces under high-speed cutting conditions as well as under normal cutting conditions. Therefore, the coated cutting tools of the invention sufficiently satisfy demands for power-saving, energy-saving, and cost reduction in cutting operations.

In addition, the coated cutting tools of the invention show excellent wear resistance and excellent cutting performance for a long period of time under high-speed heavy cutting conditions accompanied by high heat generation and mechanical impact as well as under normal cutting conditions. Therefore, the coated cutting tools of the invention sufficiently satisfy demands for high-performance and automation of cutting apparatuses, and power-saving, energy-saving, and cost reduction in cutting operations.

The invention claimed is:

1. A surface-coated cutting tool comprising:
   a hard substrate;
   a lower layer which is formed on a surface of the hard substrate, contains a composite compound consisting of at least one element selected from Ti and Al, and at least one element selected from N and C, and has an average thickness of 0.1 to 3 μm; and
   an upper layer having an average thickness of 1 to 13 μm, which is formed on the lower layer and having a texture in which fine grains of crystalline Ti (C,N) based compounds or fine grains of crystalline (Ti, Al)(C, N) based compounds are dispersively distributed in a matrix of a carbon based amorphous material containing W.

2. A surface-coated cutting tool according to claim 1, wherein the upper layer is composed of an amorphous carbon based lubricant layer containing 5 to 20 atomic % of W, 5 to 30 atomic % of Ti; 0.5 to 30 atomic % of N; and a balance consisting of C and unavoidable impurities.

3. A surface-coated cutting tool according to claim 1, wherein the upper layer is composed of an amorphous carbon based lubricant layer containing 5 to 20 atomic % of W, 5 to 20 atomic % of Ti; 0.5 to 18 atomic % of N; and a balance consisting of C and unavoidable impurities.

4. A surface-coated cutting tool according to claim 1, wherein the upper layer is composed of an amorphous carbon based lubricant layer containing 10 to 40 atomic % of W, 0.5 to 4 atomic % of Ti; 10 to 30 atomic % of N; and a balance consisting of C and unavoidable impurities.

5. A surface-coated cutting tool according to claim 1, wherein the upper layer is composed of an amorphous carbon based lubricant layer containing 5 to 20 atomic % of W, 2.5 to 10 atomic % of Ti; 0.4 to 22.5 atomic % of N; 1.6 to 15 atomic % of Al; and a balance consisting of C and unavoidable impurities.

6. A surface-coated cutting tool according to claim 1, wherein the upper layer contains a carbon based amorphous material, a matrix of the carbon based amorphous material includes fine grains of crystalline Ti (C,N) based compounds or fine grains of crystalline (Ti, Al)(C, N) based compounds, and the fine crystal grains have an average grain diameter of not larger than 40 nm under observation using a transmission electron microscope.

7. A surface-coated cutting tool according to claim 1, wherein the upper layer contains a carbon based amorphous material, a matrix of the carbon based amorphous material includes fine grains of crystalline Ti (C,N) based compounds or fine grains of crystalline (Ti, Al)(C, N) based compounds, and the fine crystal grains have an average grain diameter of not larger than 20 nm under observation using a transmission electron microscope.

8. A surface-coated cutting tool according to claim 1, wherein the upper layer contains a carbon based amorphous material, a matrix of the carbon based amorphous material includes fine grains of crystalline Ti (C,N) based compounds or fine grains of crystalline (Ti, Al)(C, N) based compounds, and the fine crystal grains have an average grain diameter of not larger than 10 nm under observation using a transmission electron microscope.

9. A surface-coated cutting tool according to claim 1, wherein the fine grains of crystalline Ti (C,N) based compounds or fine grains of crystalline (Ti, Al)(C, N) based compounds distributed in the matrix of the carbon based amorphous material include grains having a grain diameter of not smaller than 4.8 nm.

10. A surface-coated cutting tool according to claim 1, wherein the lower layer consists of at least one selected from a TiN layer and a TiCN layer.

11. A surface-coated cutting tool according to claim 1, wherein the lower layer consists of a composite nitride of Ti and Al, which satisfies a compositional formula of $(Ti_{1-X}Al_X)N$, wherein X ranges from 0.40 to 0.60 by atomic ratio.

12. A surface-coated cutting tool according to claim 1, wherein the lower layer consists of a Ti and Al composite nitride layer having a variable composition structure, and the variable composition structure has a composition distribution structure in which:
   portions of maximum Al content and portions of maximum Ti content exist alternately with a predetermined interval in a thickness direction of the Ti and Al composite nitride layer;
   Al and Ti content change continuously from the portion of maximum Ti content to the portion maximum Al content, and from the portion of maximum Al content to the portion of maximum Ti content;
   each of the portions of maximum Al content satisfies a compositional formula: $(Al_{1-X} T_X)N$, where X ranges from 0.05 to 0.35 by atomic ratio;
   each of the portion of maximum Ti content satisfies a compositional formula: $(Ti_{1-X}Al_X)N$, where X ranges from 0.05 to 0.35 by atomic ratio; and
   the interval between a portion of maximum Al content and an adjacent portion of maximum Ti content is 0.01 to 0.1 μm.

13. A surface-coated cutting tool according to claim 1, wherein the hard substrate is composed of cemented carbide that contains tungsten carbide.

14. A surface-coated cuffing tool according to claim 1, wherein the hard substrate is composed of cermet that contains titanium carbonitride.

15. A method for manufacturing a surface-coated cutting tool, comprising:
   preparing a hard substrate;
   using a magnetron sputtering apparatus and a Ti target or a Ti—Al alloy target as a cathode, performing deposition of a lower layer in a magnetic field and in a reaction atmosphere composed of a mixed gas of nitrogen and Ar or a mixed gas of resolved gas of hydrocarbon, nitrogen and Ar; and thereby depositing the lower layer having an average thickness of 0.1 to 3 μm and containing a composite compound consisting of at least one element selected from Ti and Al, and at least one element selected from N and C; and
   using the magnetron sputtering apparatus and a W target and a Ti target or a Ti—Al target as cathodes, performing formation of an upper layer in a magnetic field on the lower layer in a reaction atmosphere of a mixed gas of resolved hydrocarbon gas, nitrogen and Ar; and thereby depositing the upper layer which has an average thickness of 1 to 13 μm and has a texture in which fine grains of crystalline Ti(C,N) based compounds or fine grains of crystalline (Ti,Al)(C,N) based compounds are dispersively distributed in a matrix of carbon based amorphous material containing W.

16. A method manufacturing a surface-coated cutting tool according to claim 15, wherein the upper layer is composed of an amorphous carbon based lubricant layer containing 5 to 20 atomic % of W, 5 to 30 atomic % of Ti; 0.5 to 30 atomic % of N; and a balance consisting of C and unavoidable impurities.

17. A method manufacturing a surface-coated cutting tool according to claim 15, wherein the upper layer contains a carbon based amorphous material, a matrix of the carbon based amorphous material includes fine grains of crystalline Ti (C,N) based compounds or fine grains of crystalline (Ti, Al)(C, N) based compounds, and the fine crystal grains have an average grain diameter of not larger than 40 rim under observation using a transmission electron microscope.

18. A method manufacturing a surface-coated cutting tool according to claim 15, wherein the fine grains of crystalline Ti (C,N) based compounds or fine grains of crystalline (Ti, Al) (C, N) based compounds distributed in the matrix of the carbon based amorphous material include grains having an grain diameter of not smaller than 4.8 nm.

* * * * *

UNITED STATES PATENT AND TRADEMARK OFFICE
CERTIFICATE OF CORRECTION

| | | |
|---|---|---|
| PATENT NO. | : 7,655,299 B2 | Page 1 of 1 |
| APPLICATION NO. | : 10/597505 | |
| DATED | : February 2, 2010 | |
| INVENTOR(S) | : Morita et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 756 days.

Signed and Sealed this

Twenty-third Day of November, 2010

David J. Kappos
*Director of the United States Patent and Trademark Office*